(12) United States Patent
Wang et al.

(10) Patent No.: US 11,777,033 B2
(45) Date of Patent: Oct. 3, 2023

(54) TRANSISTORS HAVING VERTICAL NANOSTRUCTURES

(71) Applicant: Taiwan Semiconductor Manufacturing Co., Ltd., Hsinchu (TW)

(72) Inventors: Pei-Hsun Wang, Hsinchu (TW); Chun-Hsiung Lin, Hsinchu County (TW); Cheng-Ting Chung, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 455 days.

(21) Appl. No.: 17/133,290

(22) Filed: Dec. 23, 2020

(65) Prior Publication Data

US 2021/0273104 A1    Sep. 2, 2021

Related U.S. Application Data

(60) Provisional application No. 62/982,610, filed on Feb. 27, 2020.

(51) Int. Cl.
*H01L 29/78* (2006.01)
*H01L 29/06* (2006.01)
(Continued)

(52) U.S. Cl.
CPC .. *H01L 29/7851* (2013.01); *H01L 21/823412* (2013.01); *H01L 21/823418* (2013.01);
(Continued)

(58) Field of Classification Search
CPC ......... H01L 21/02603; H01L 21/28141; H01L 21/823412; H01L 21/823418; H01L 21/823431; H01L 21/823821; H01L 21/845; H01L 27/0886; H01L 27/0924; H01L 27/1211; H01L 29/0653; H01L 29/0665; H01L 29/0669; H01L 29/0673; H01L 29/41791; H01L 29/66439; H01L 29/6653; H01L 29/66553; H01L 29/6656; H01L 29/66795; H01L 29/775; H01L 29/785; H01L 29/7851; H01L 29/7853; H01L 29/7855; H01L 2029/7858
See application file for complete search history.

(56) References Cited

U.S. PATENT DOCUMENTS 10,332,803 B1    6/2019 Xie et al.
2019/0229011 A1*  7/2019 Suk ............... H01L 29/78654
(Continued)

*Primary Examiner* — David C Spalla
(74) *Attorney, Agent, or Firm* — HAYNES AND BOONE, LLP

(57) ABSTRACT

A semiconductor device according to the present disclosure includes a first isolation feature and a second isolation feature, a fin structure extending lengthwise along a first direction and sandwiched between the first isolation feature and the second isolation feature along a second direction perpendicular to the first direction, a first channel member disposed over the first isolation feature, a second channel member disposed over the second isolation feature, and a gate structure disposed over and wrapping around the first channel member and the second channel member.

20 Claims, 62 Drawing Sheets

(51) Int. Cl.
*H01L 29/66* (2006.01)
*H01L 21/8234* (2006.01)

(52) U.S. Cl.
CPC .. *H01L 21/823431* (2013.01); *H01L 29/0653* (2013.01); *H01L 29/0665* (2013.01); *H01L 29/66795* (2013.01)

(56) References Cited

U.S. PATENT DOCUMENTS

| | | | |
|---|---|---|---|
| 2020/0312956 A1* | 10/2020 | Yeh | H01L 29/6681 |
| 2020/0365703 A1 | 11/2020 | Chung | |
| 2021/0082766 A1* | 3/2021 | Miura | H01J 37/32082 |
| 2021/0217654 A1* | 7/2021 | Xie | H01L 27/088 |
| 2021/0249509 A1* | 8/2021 | Wang | H01L 29/42392 |

* cited by examiner

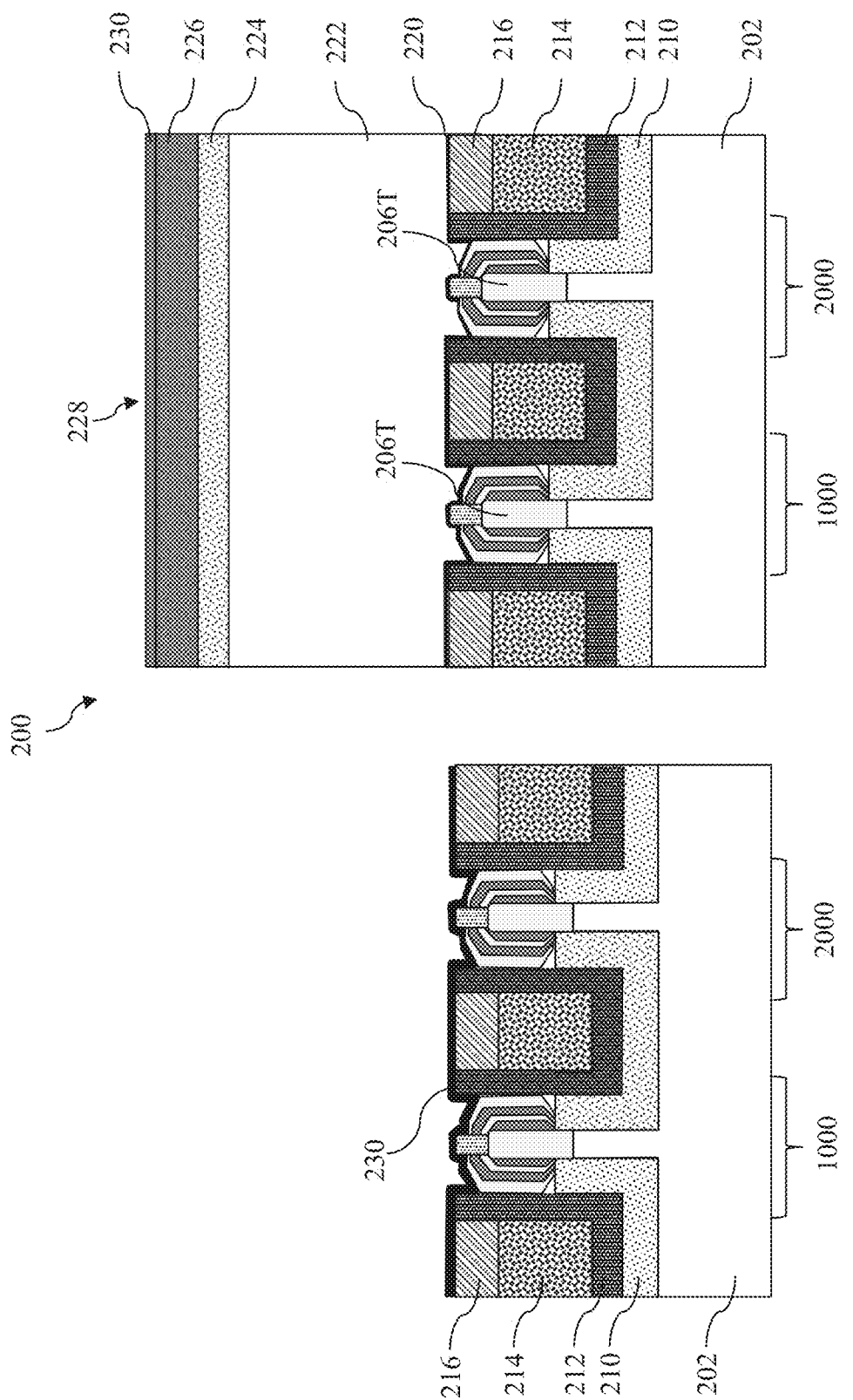

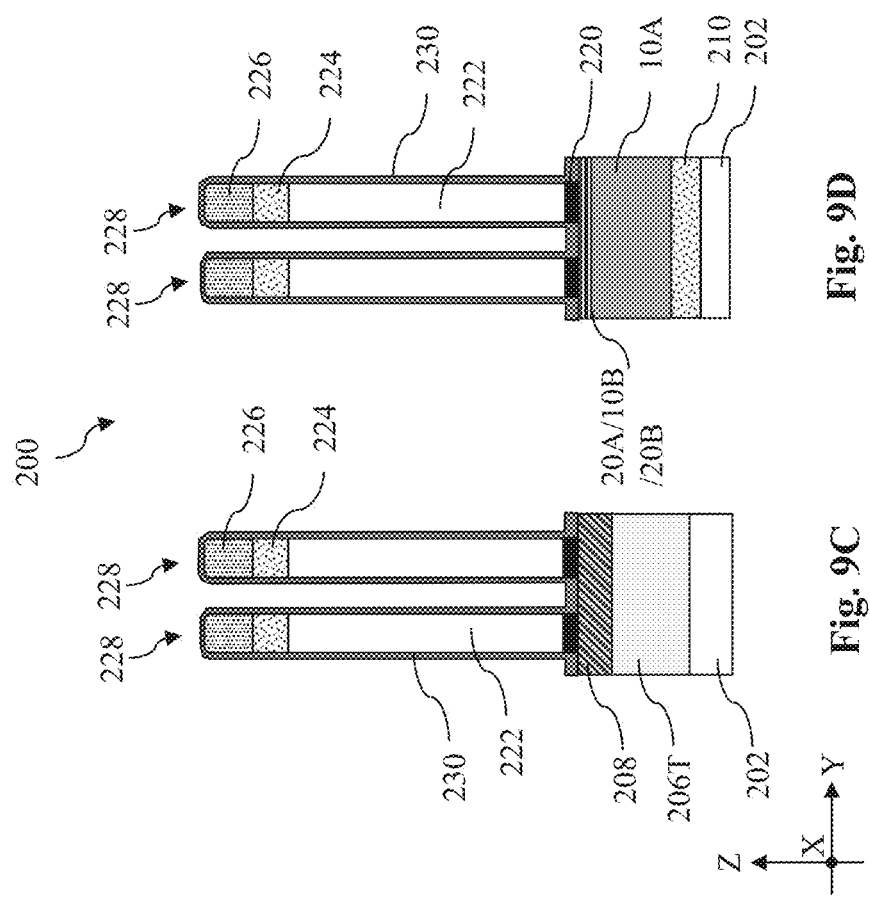

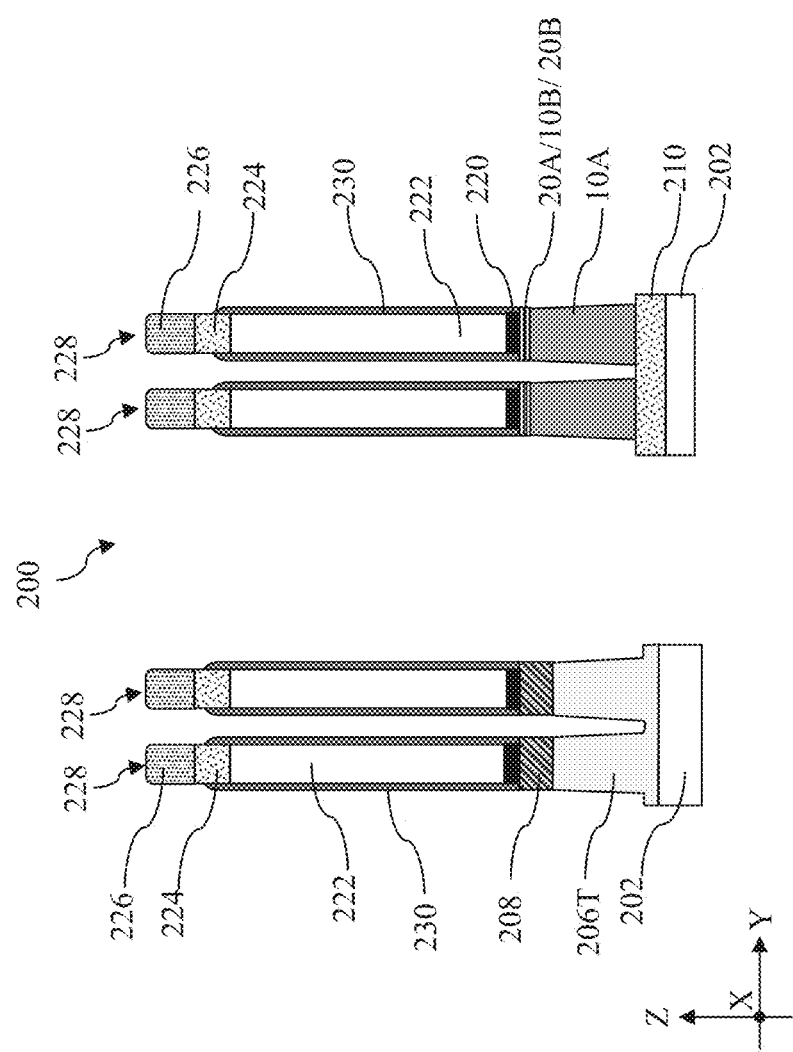

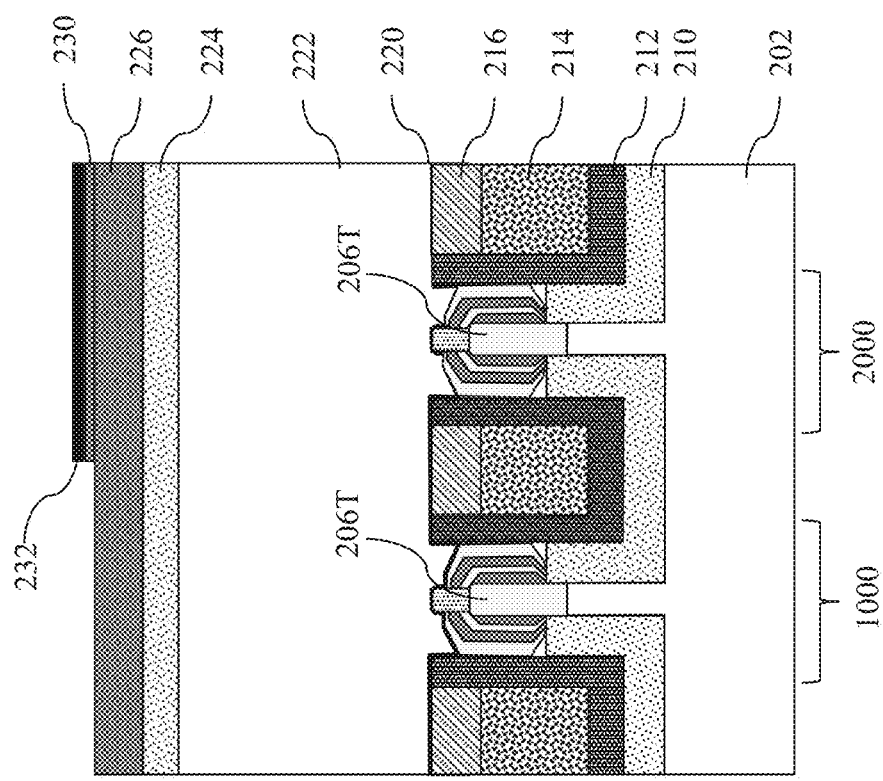
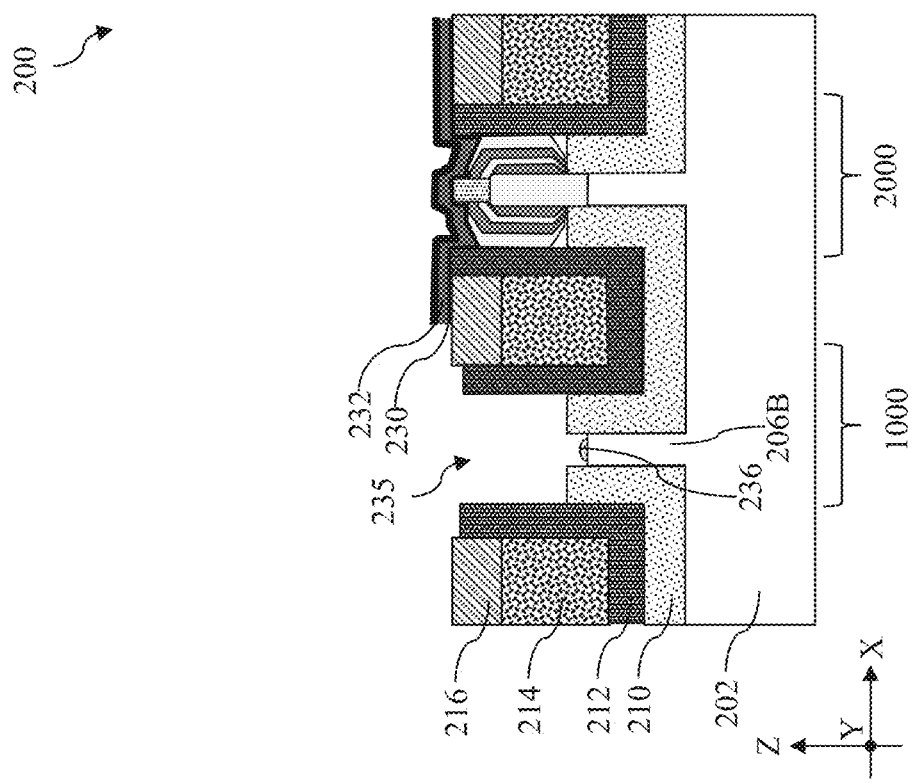

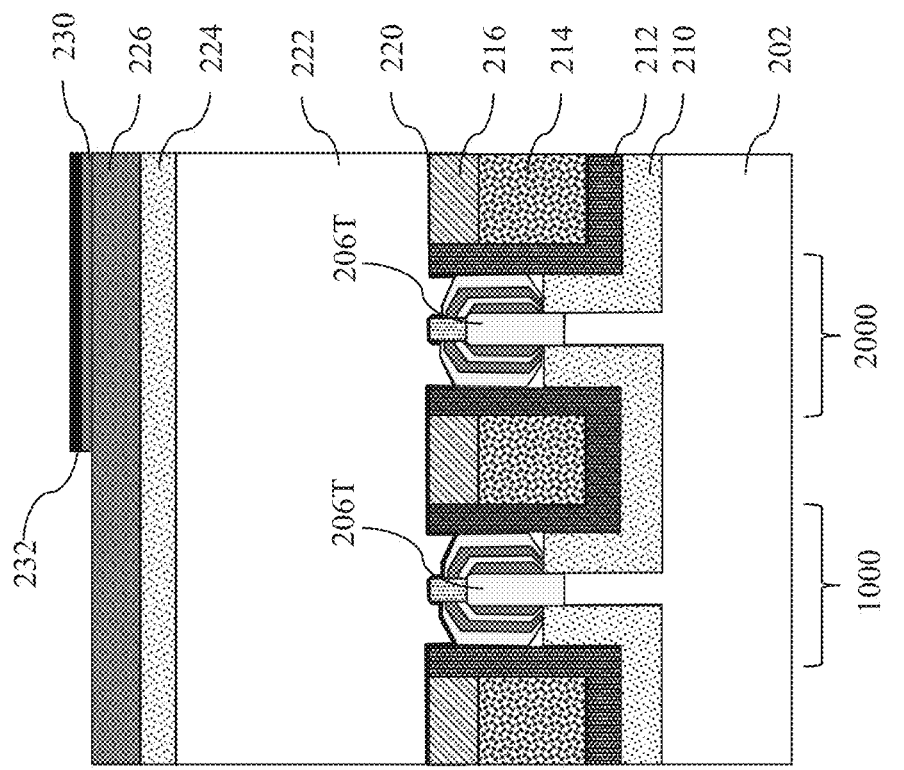
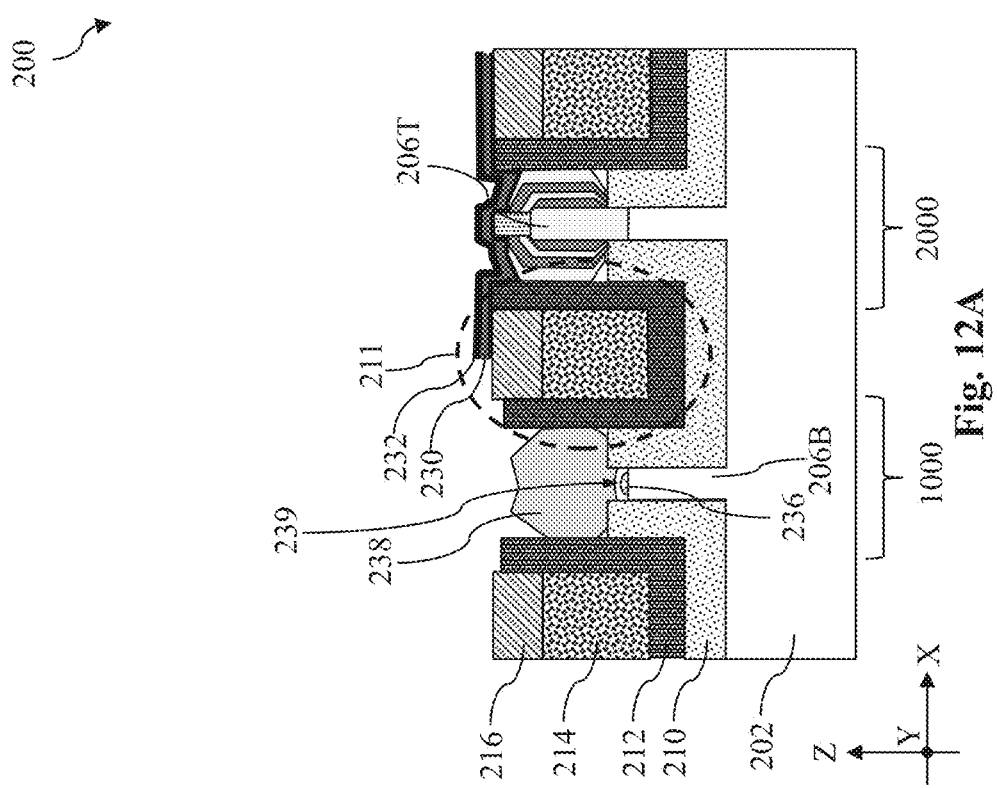

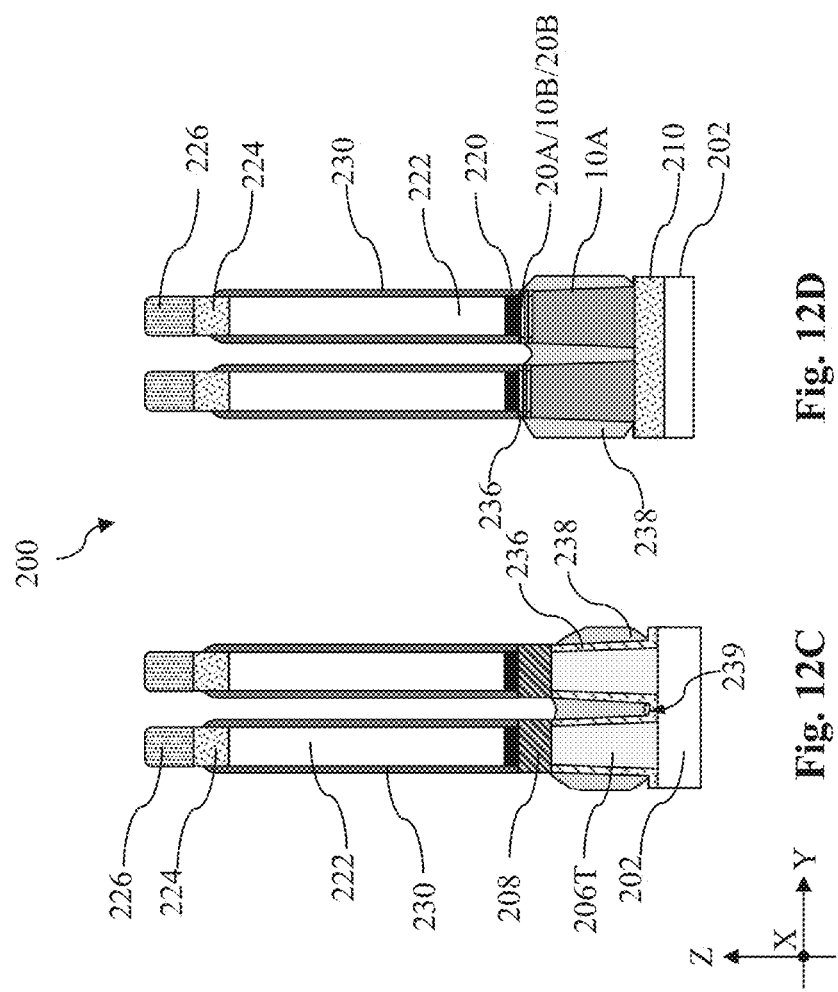

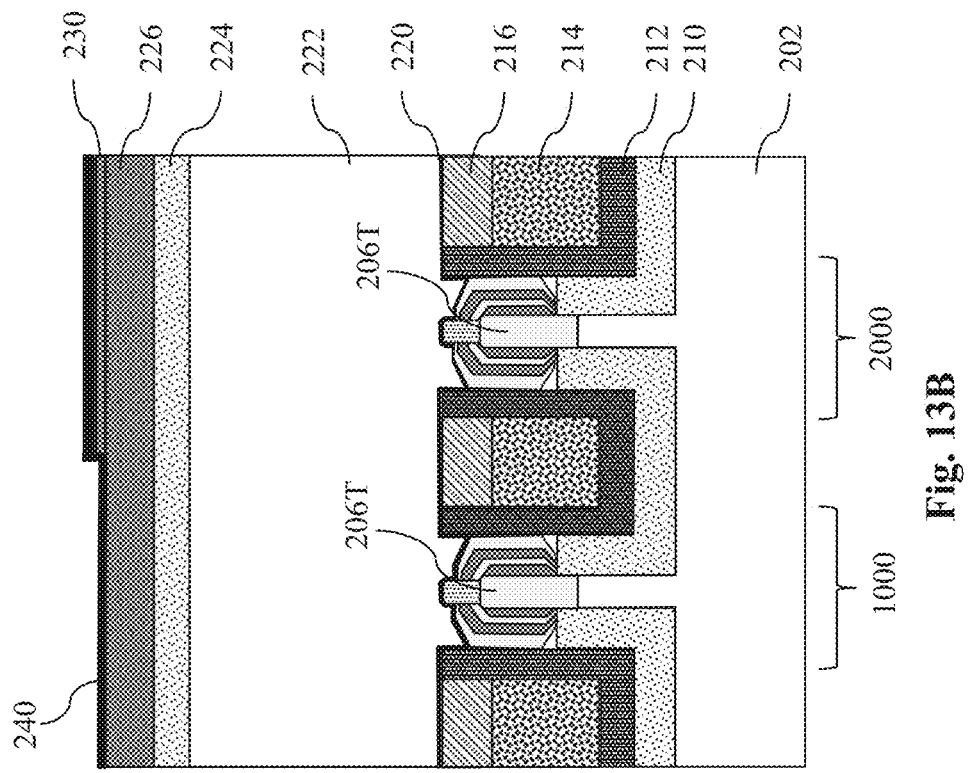
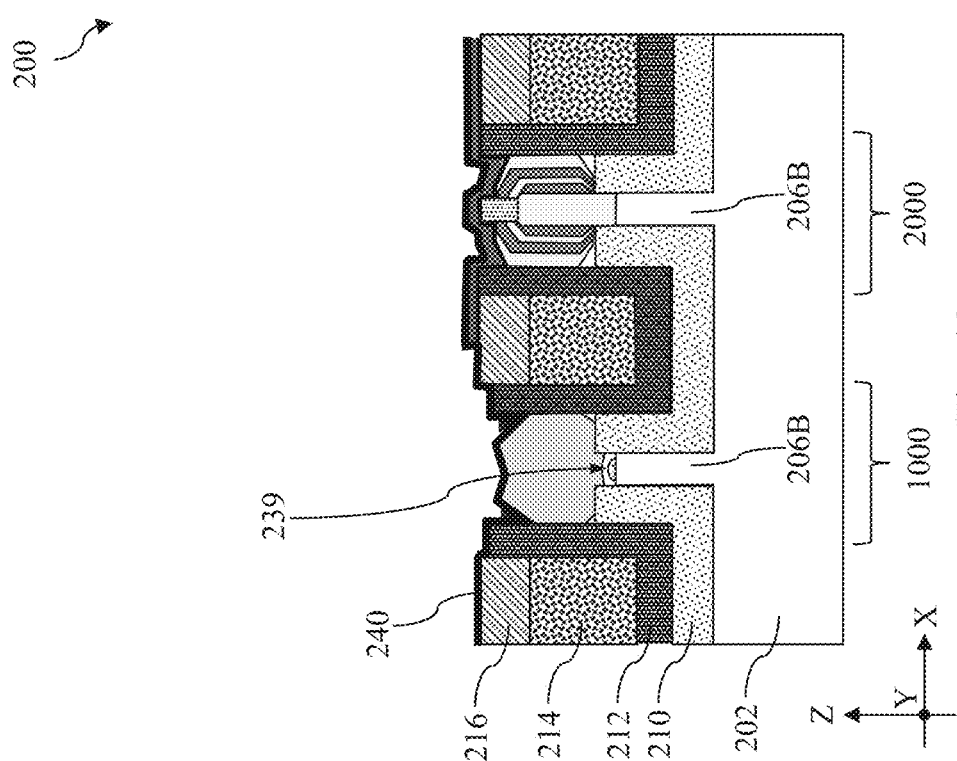
Fig. 13A
Fig. 13B

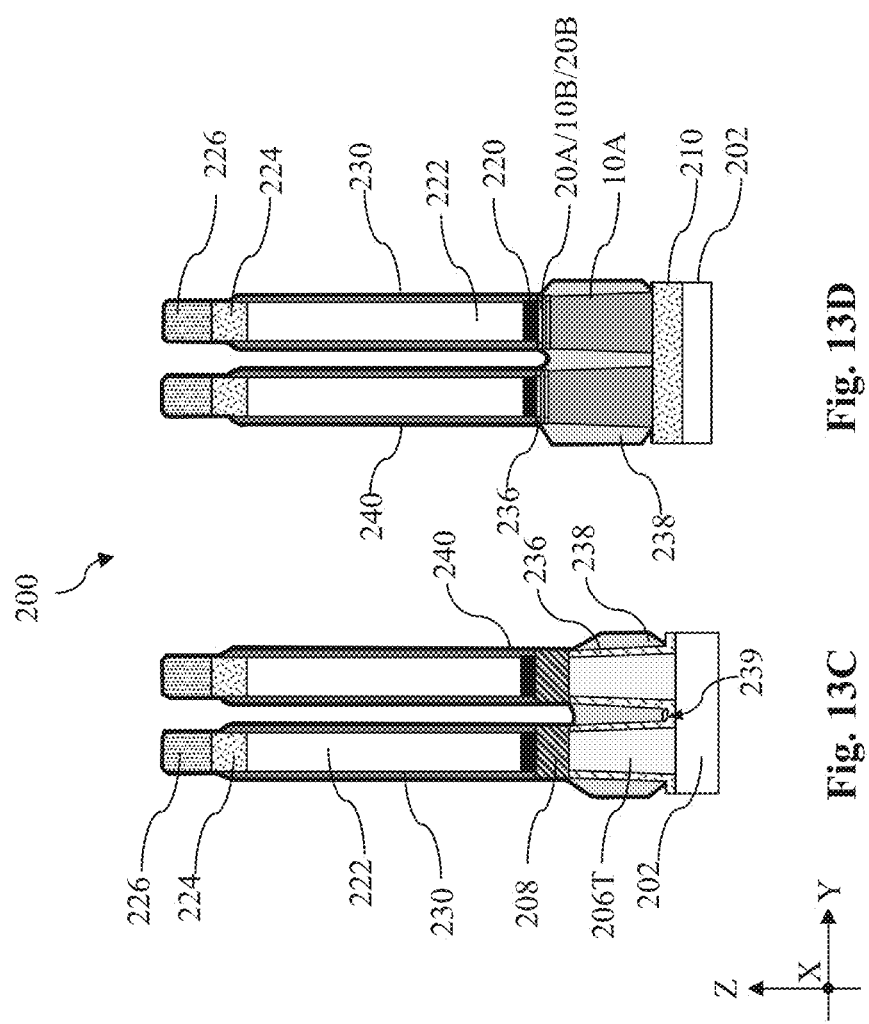

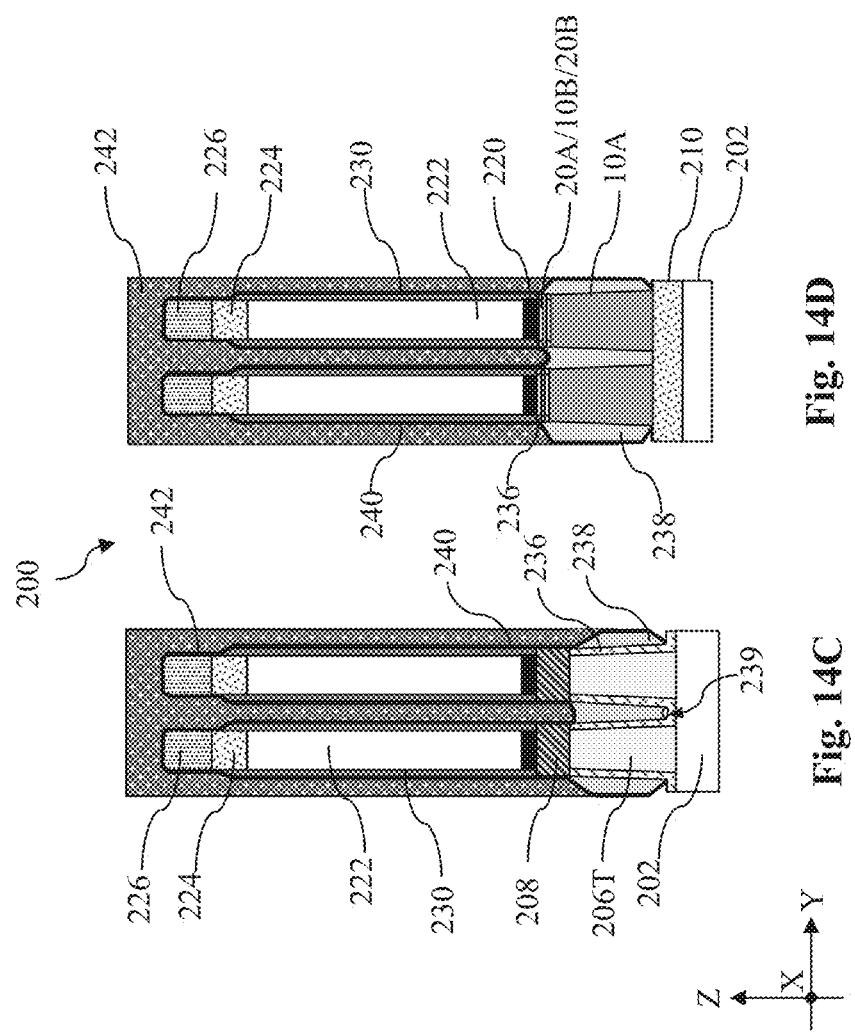

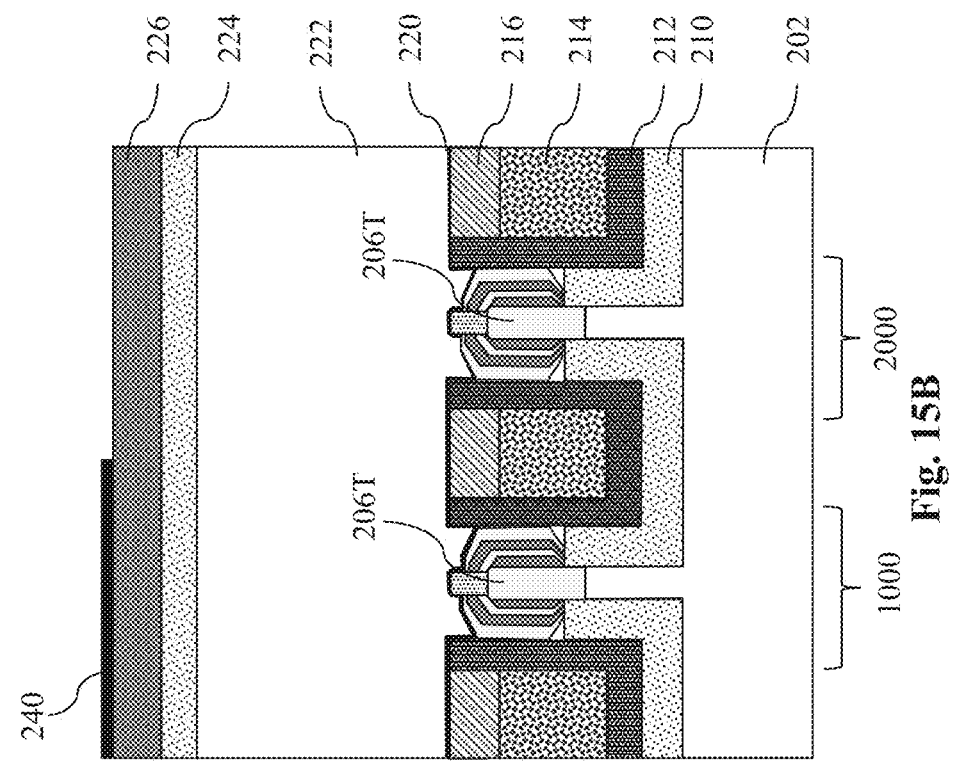
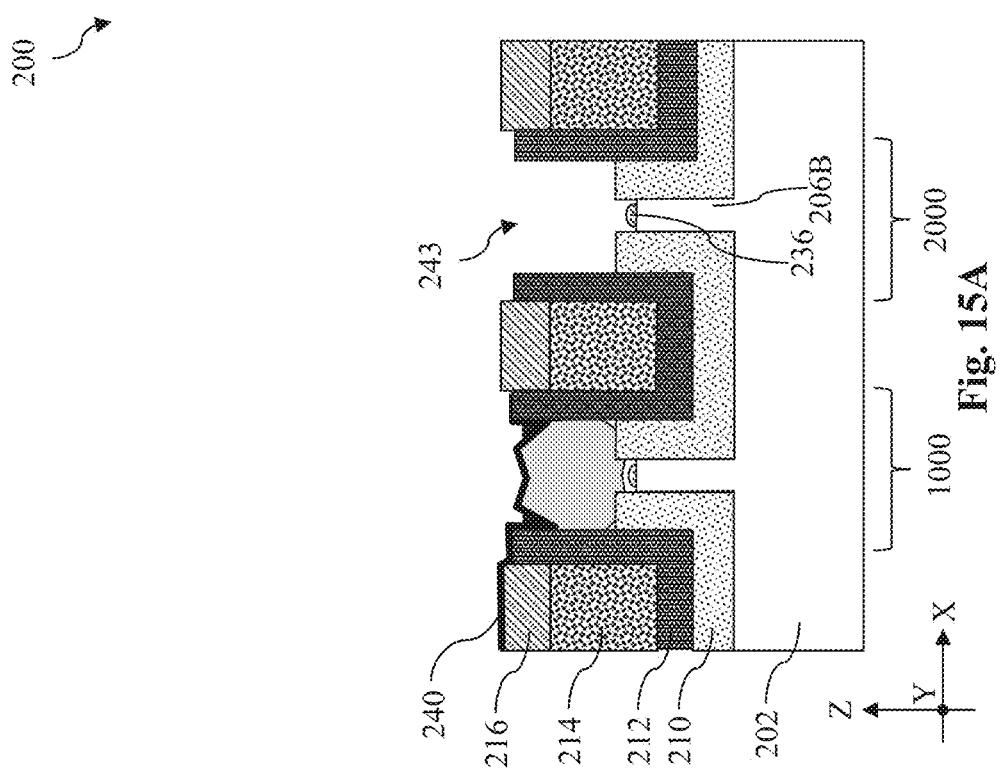
Fig. 15A
Fig. 15B

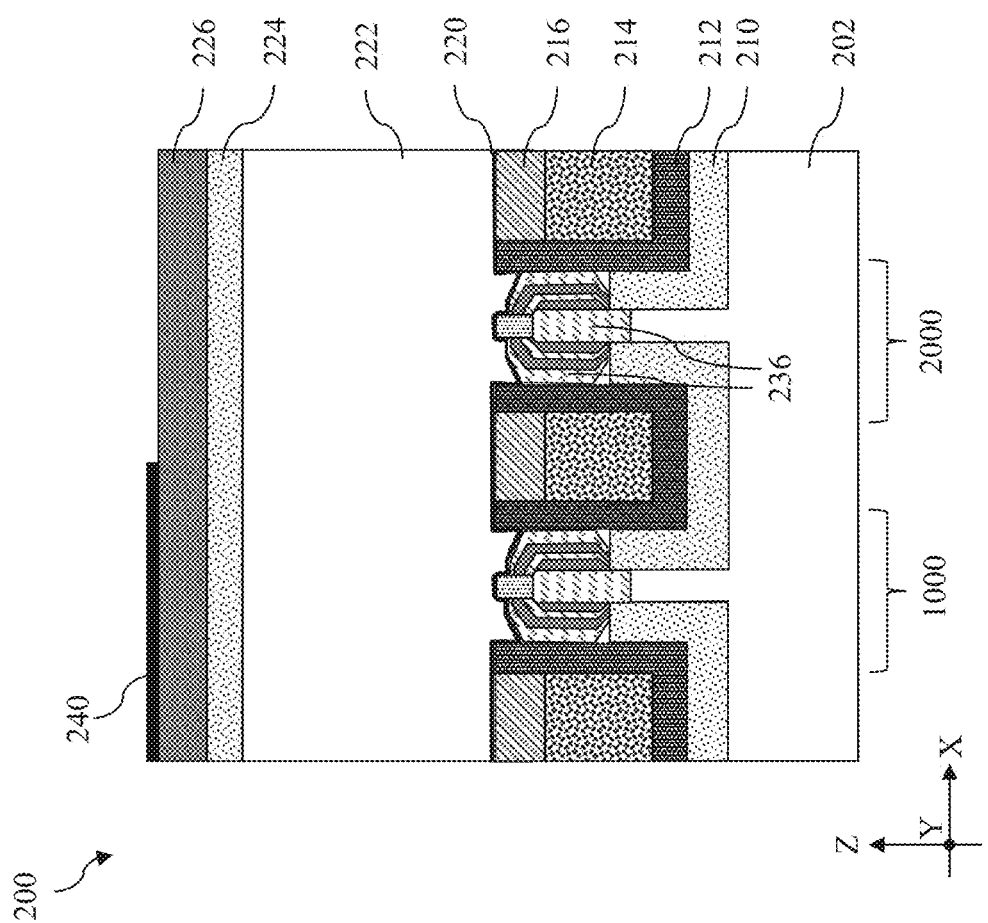

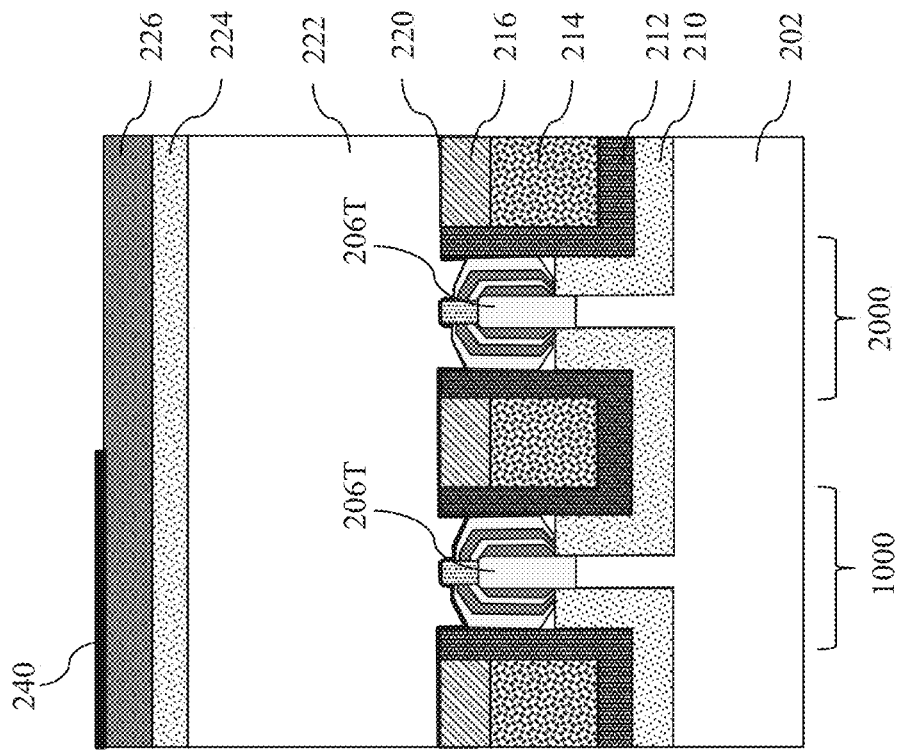
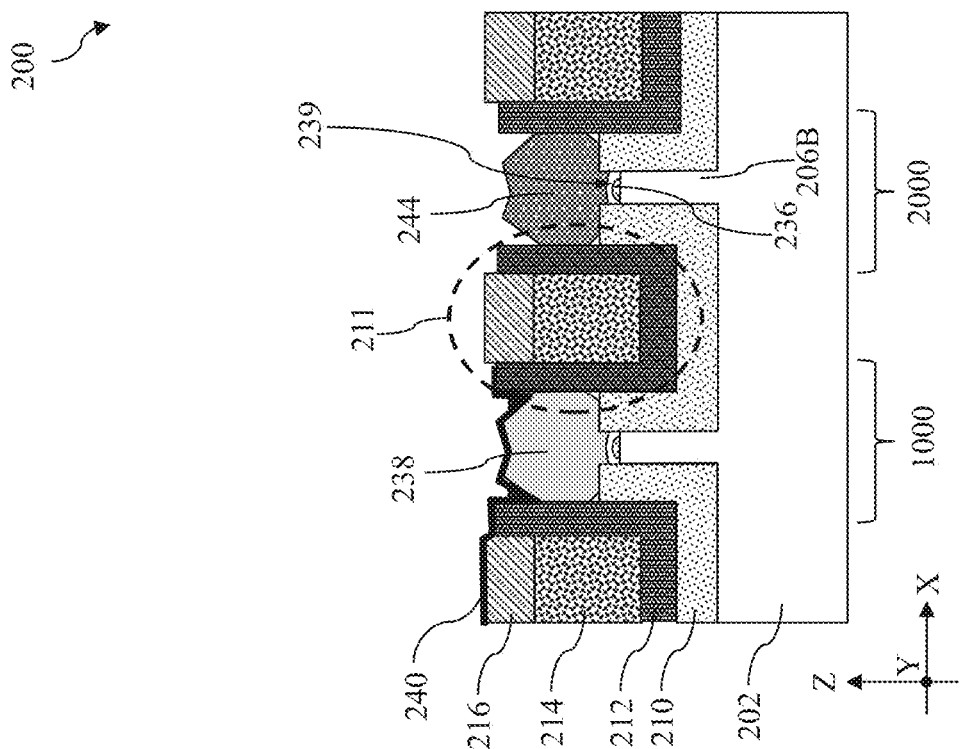
Fig. 16A
Fig. 16B

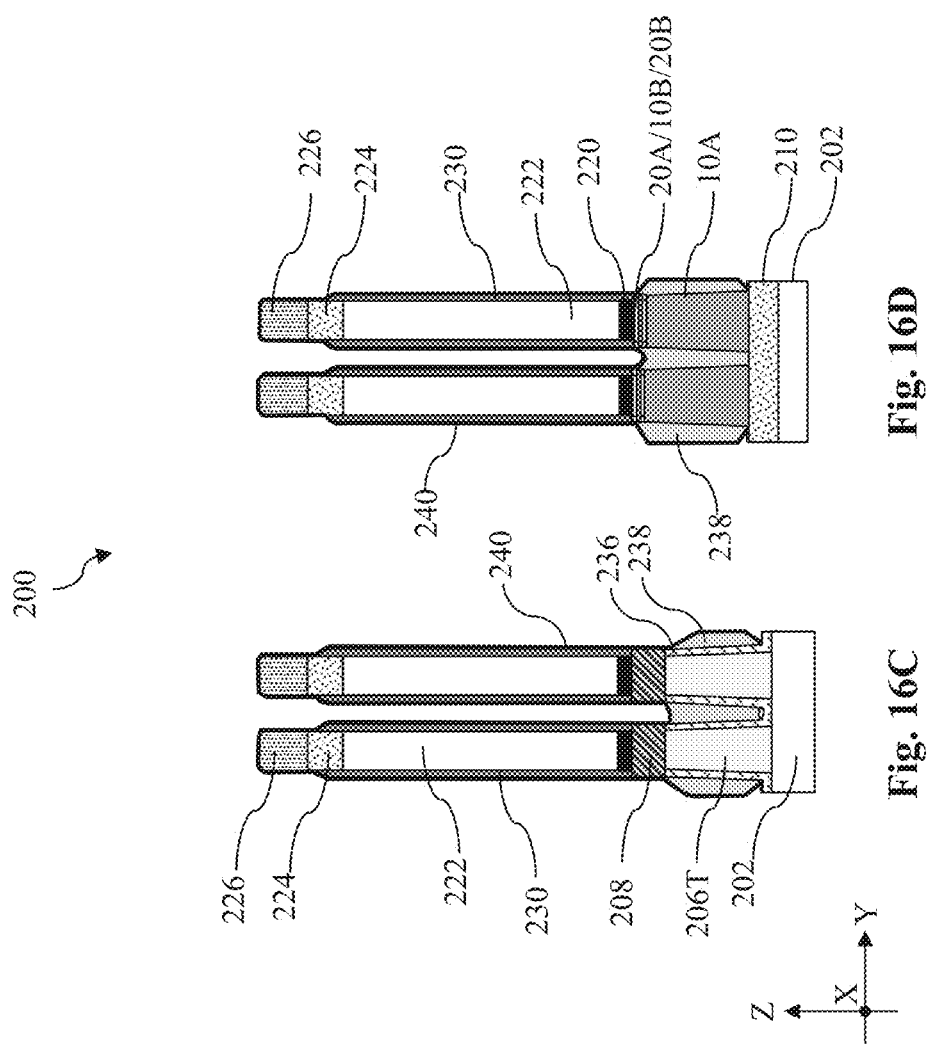

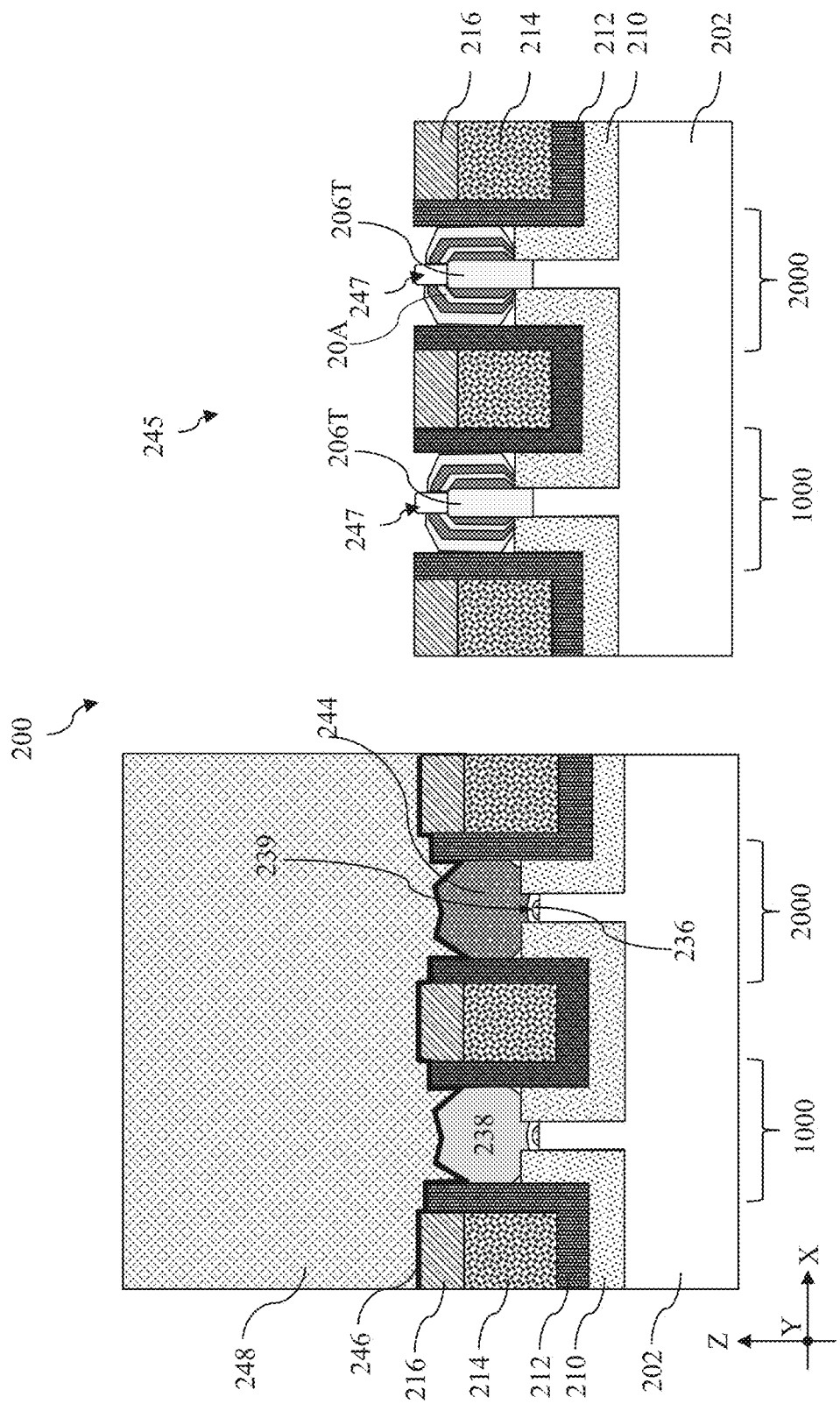

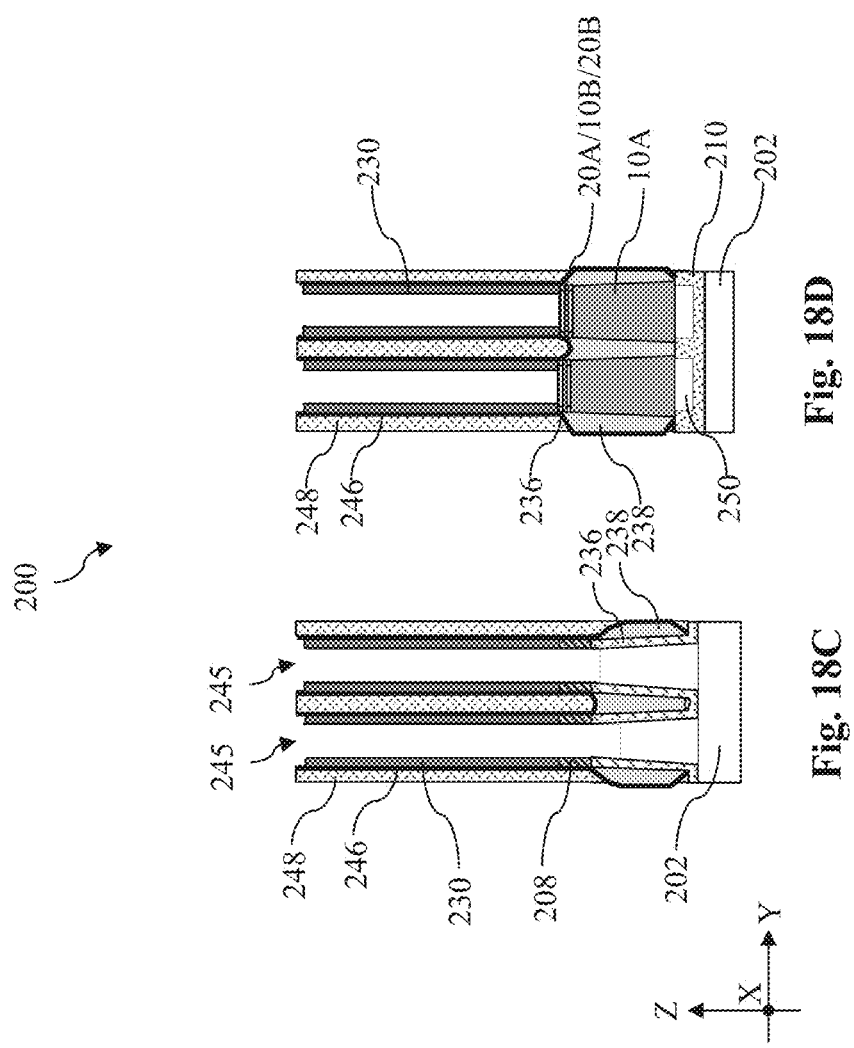

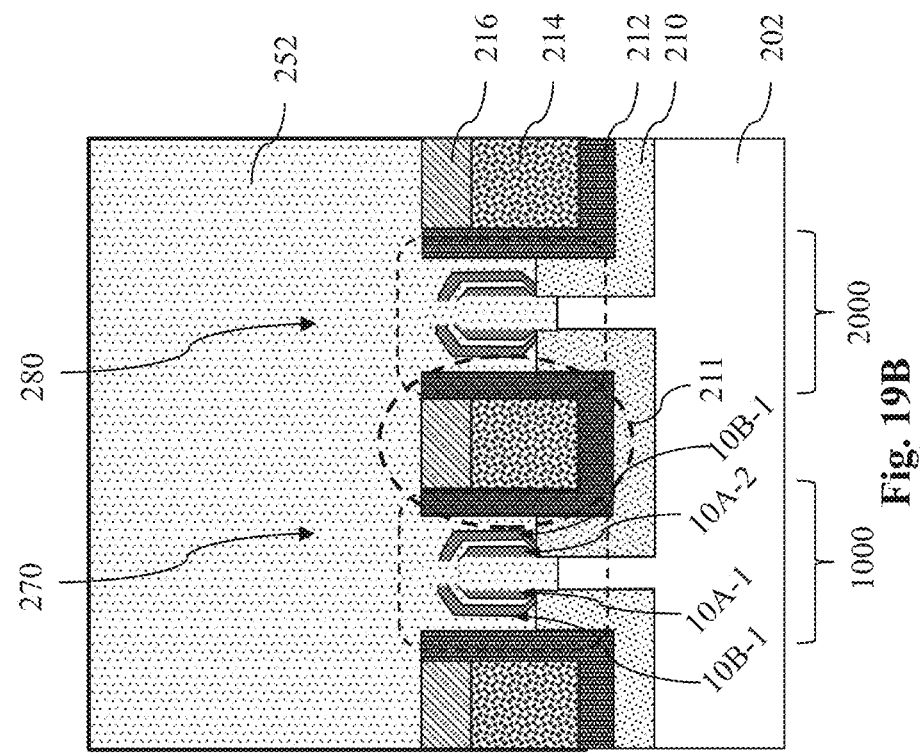
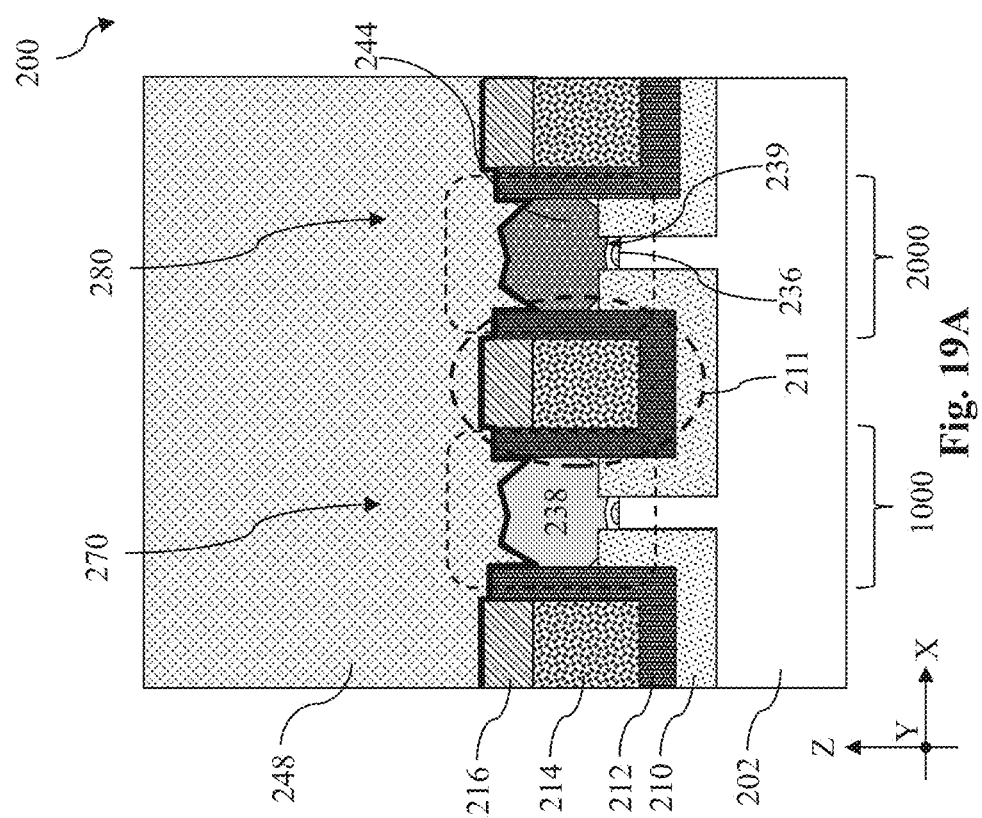

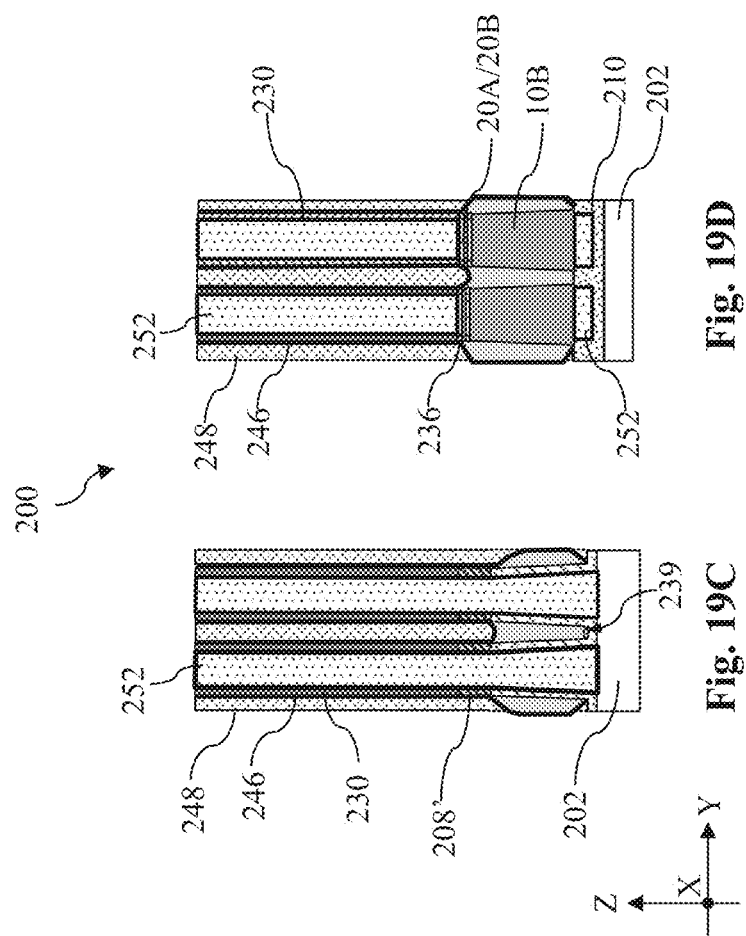

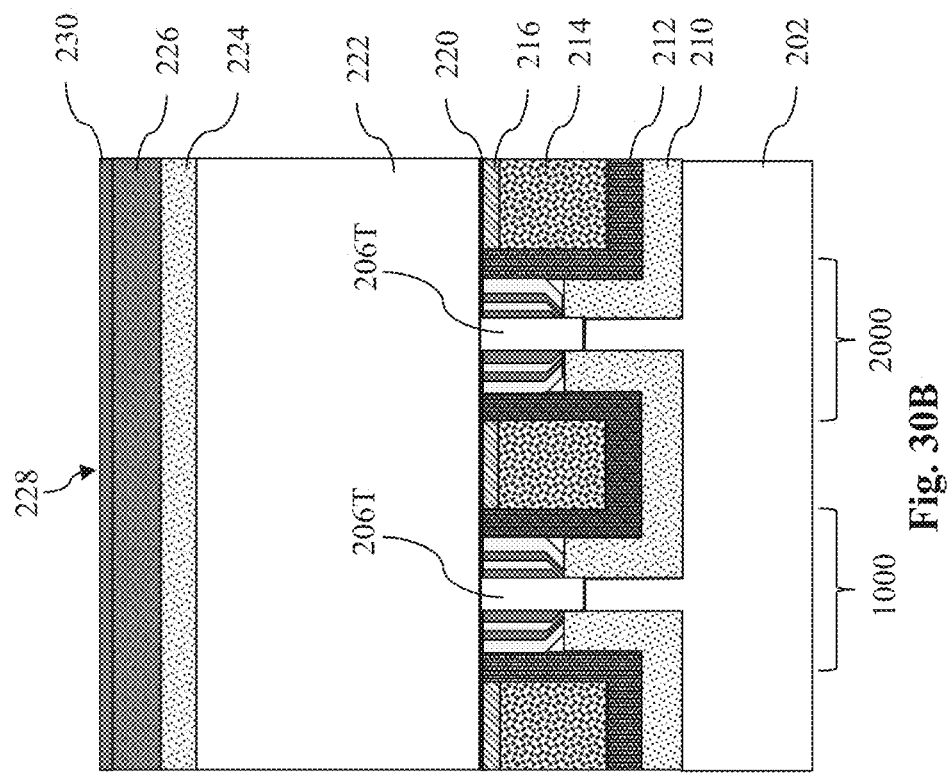
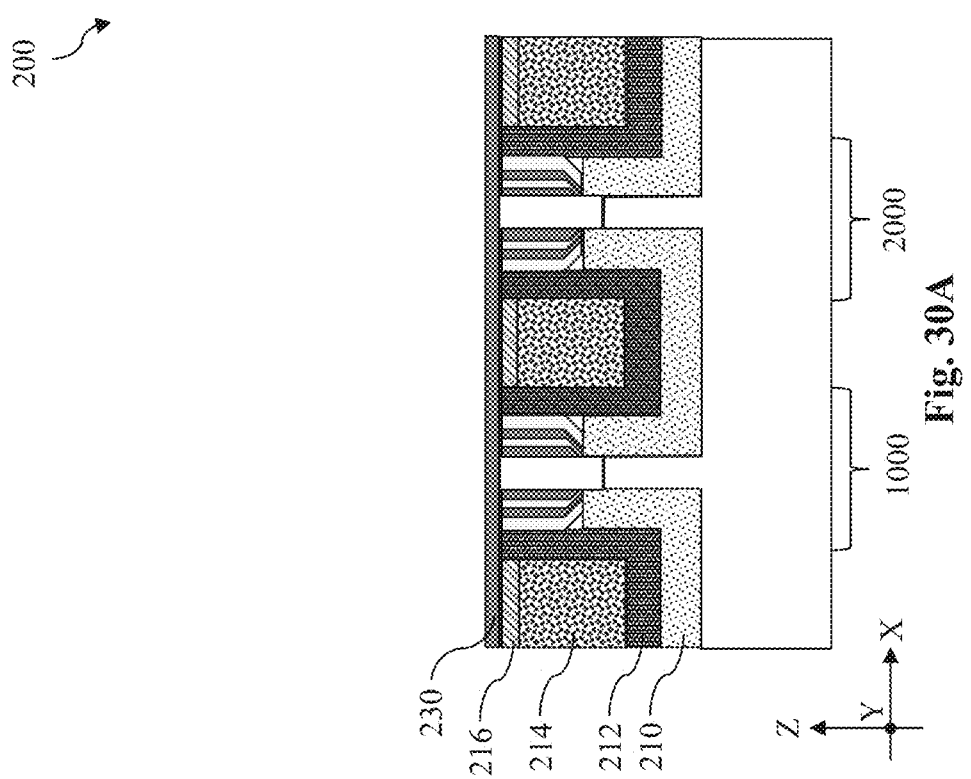

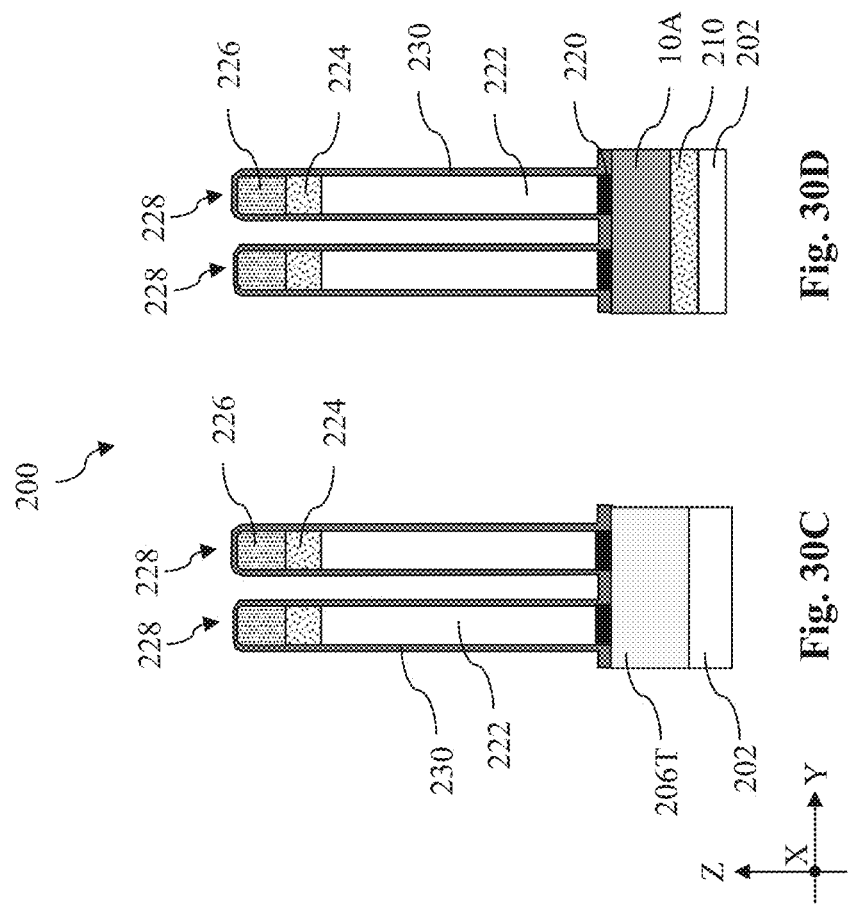

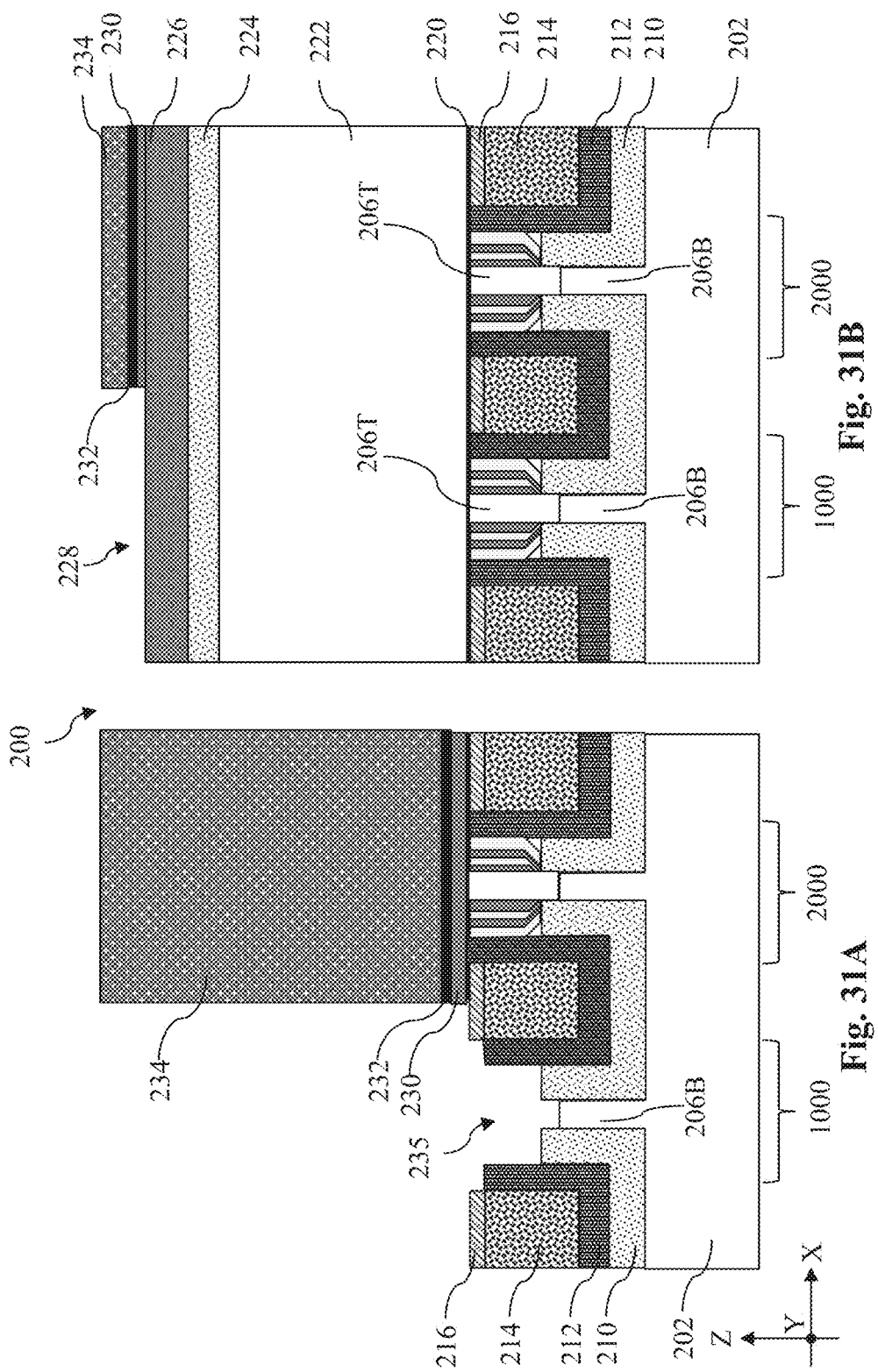

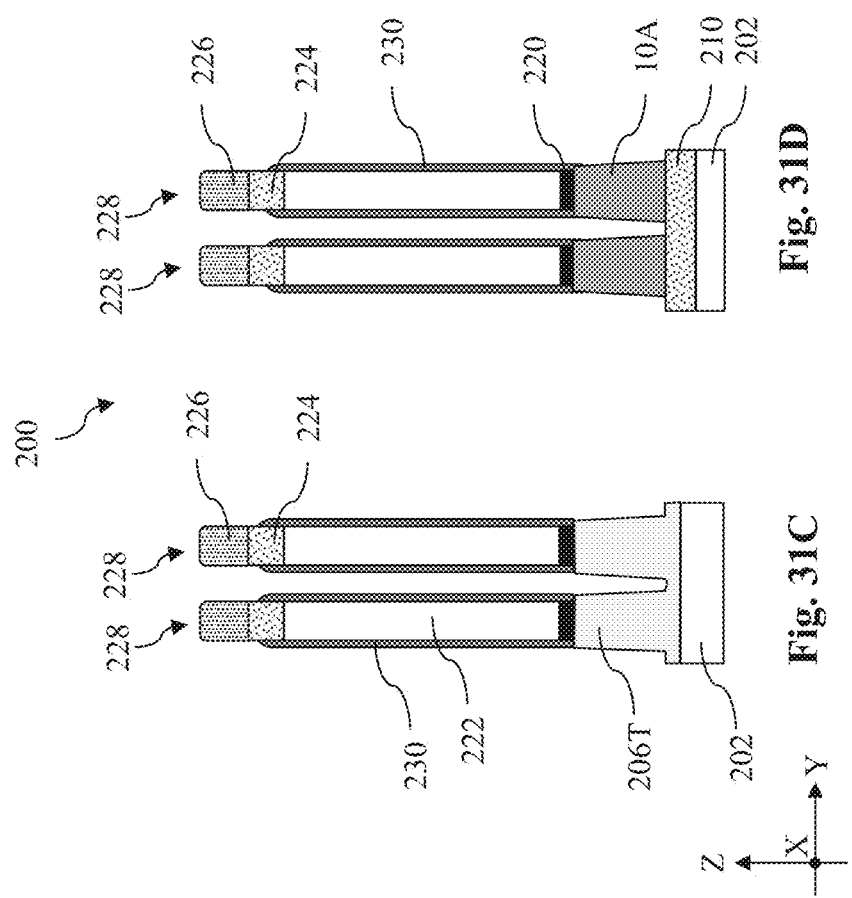

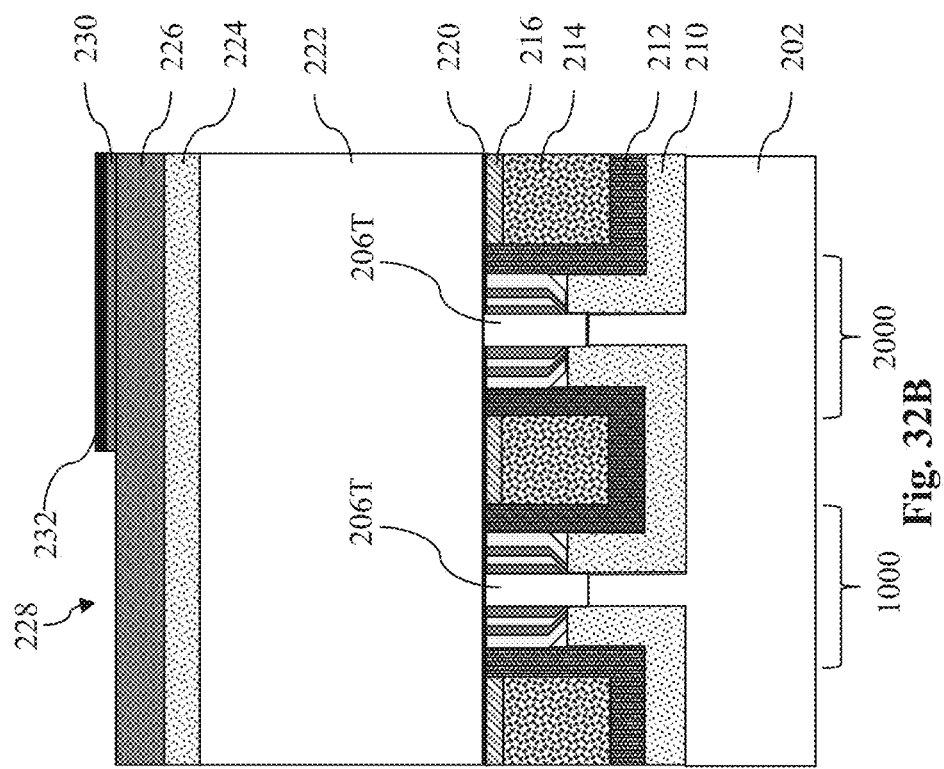
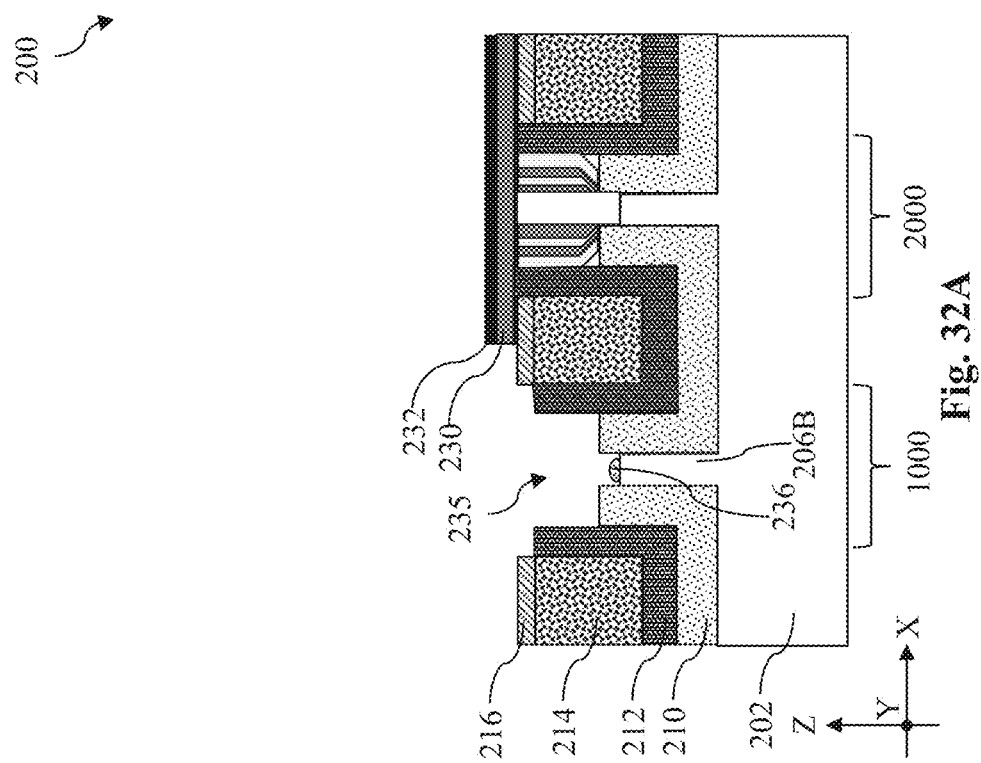
Fig. 32A
Fig. 32B

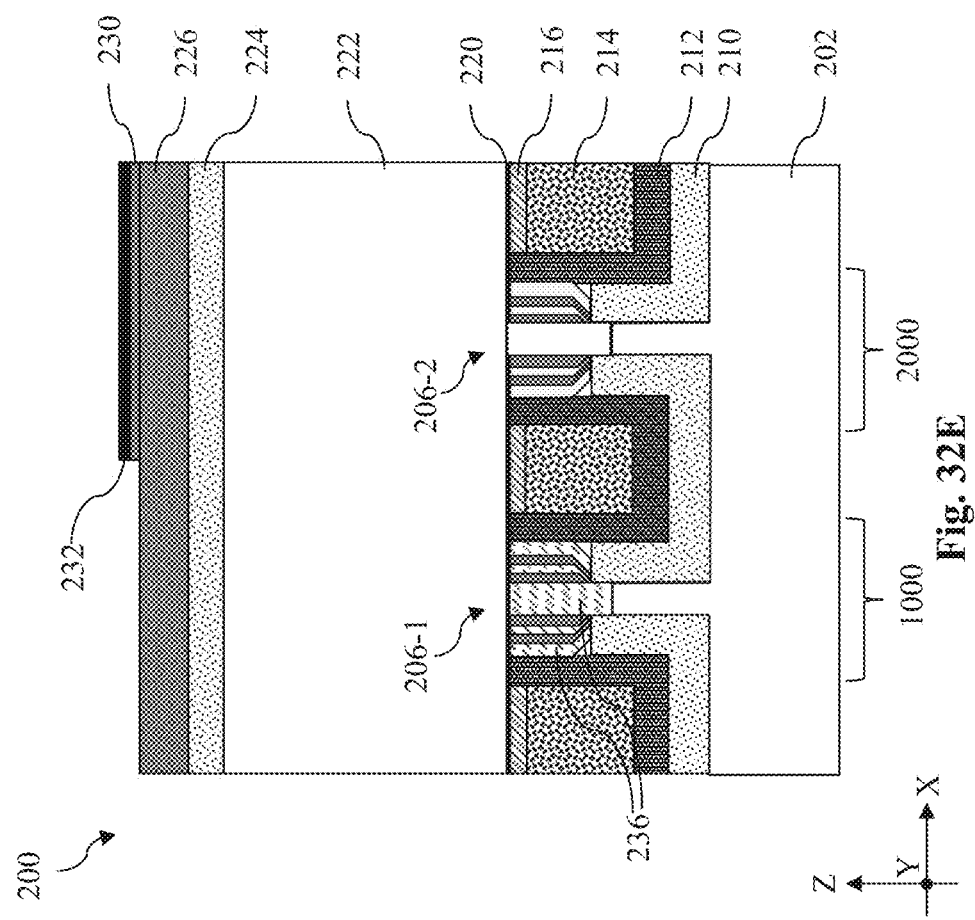

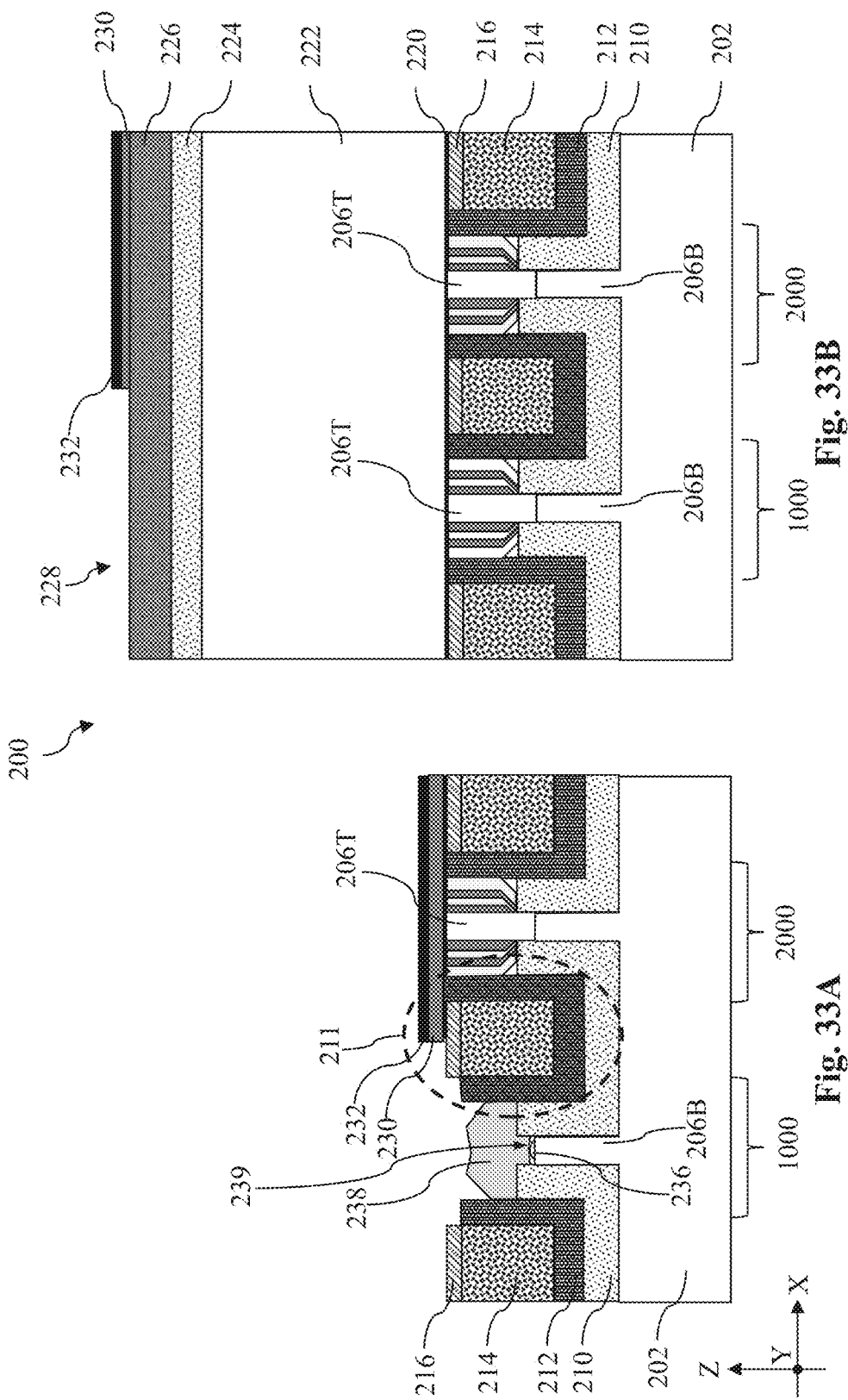

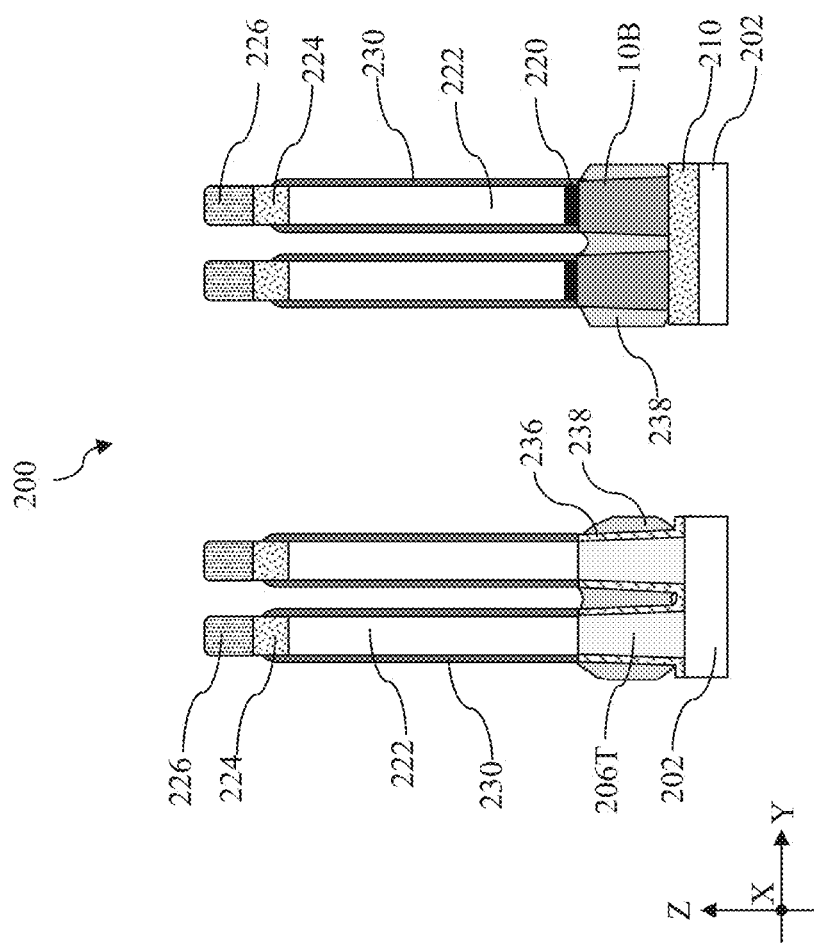

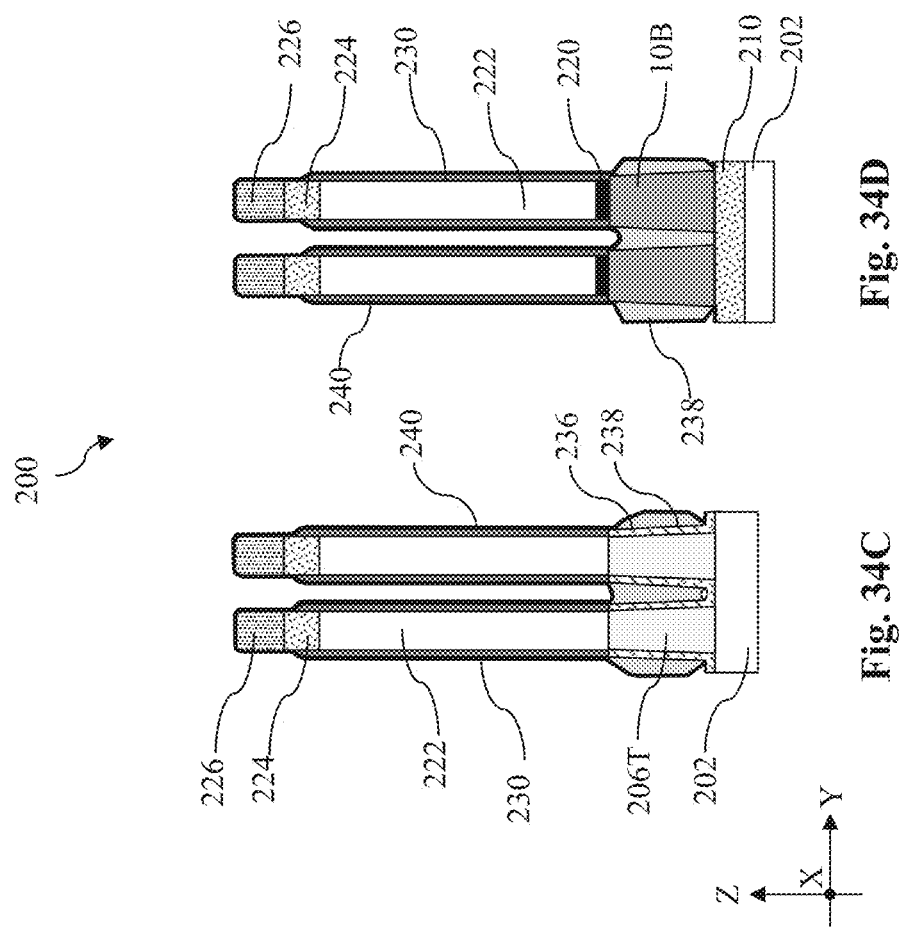

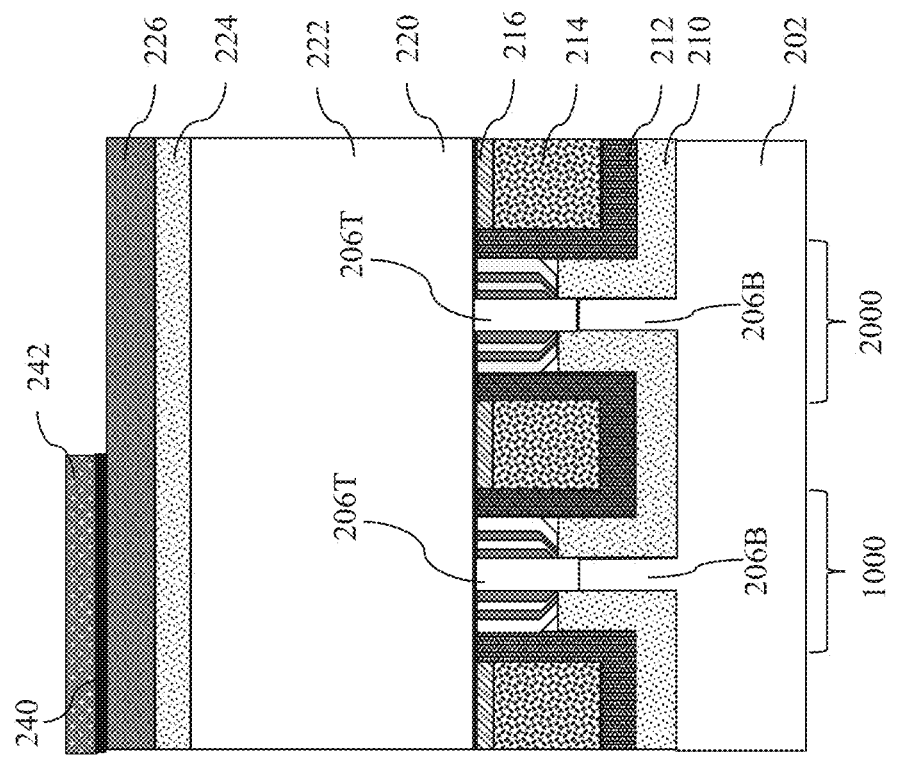
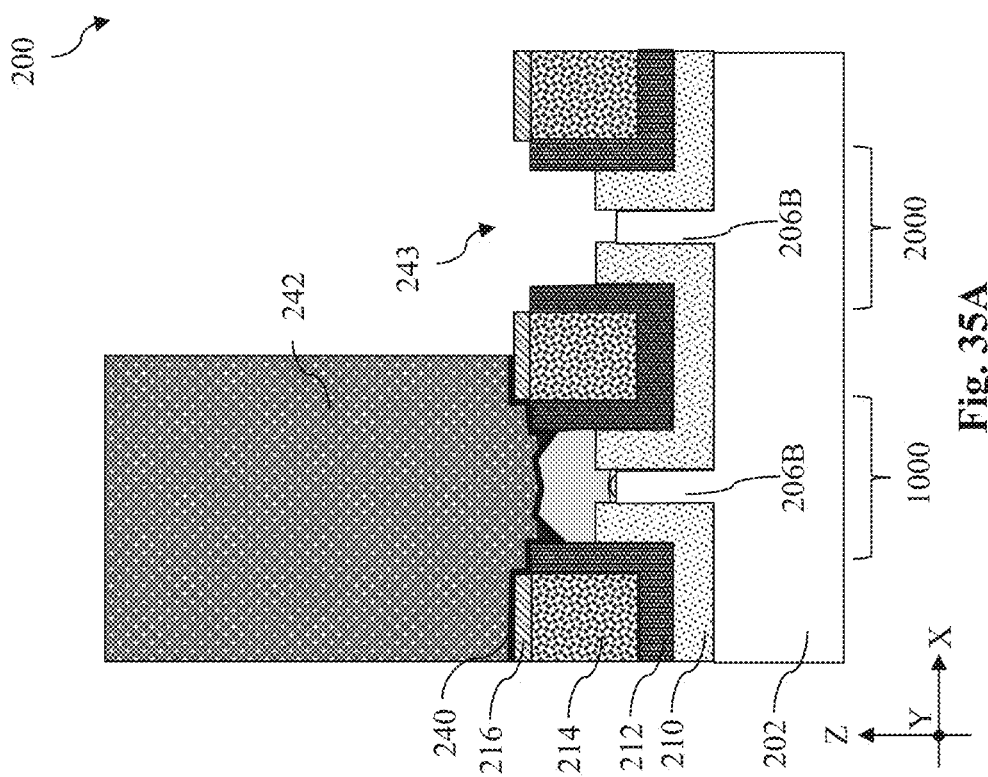
Fig. 35A
Fig. 35B

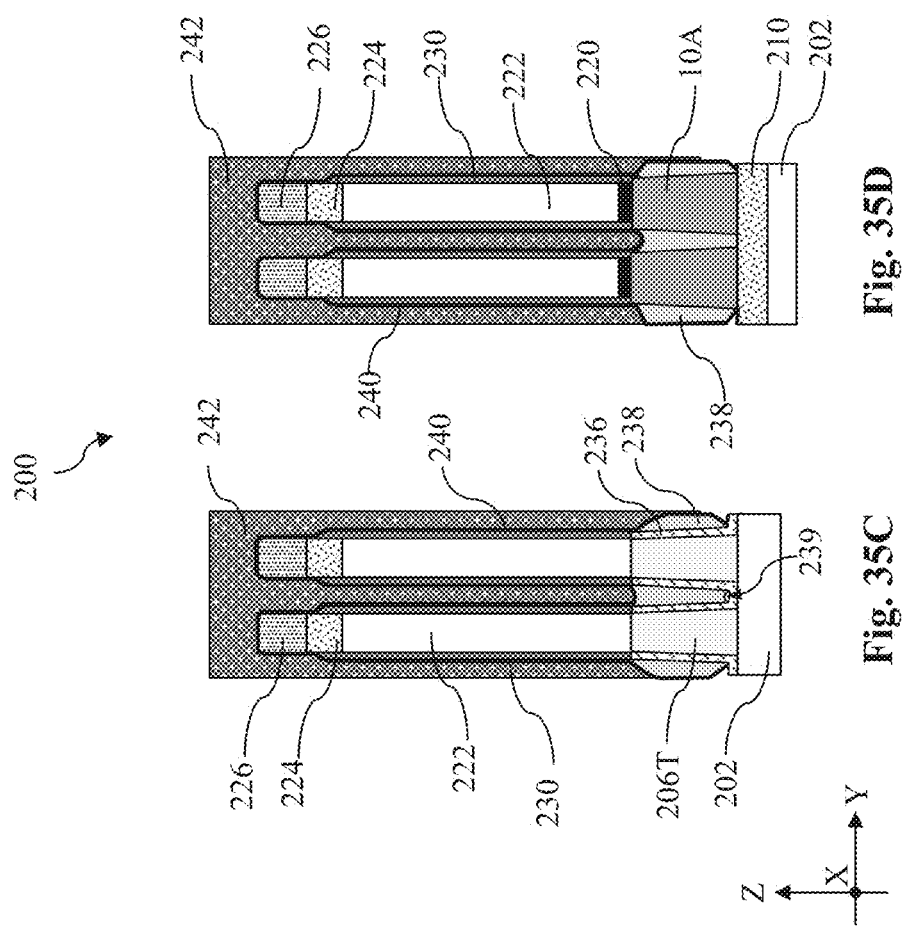

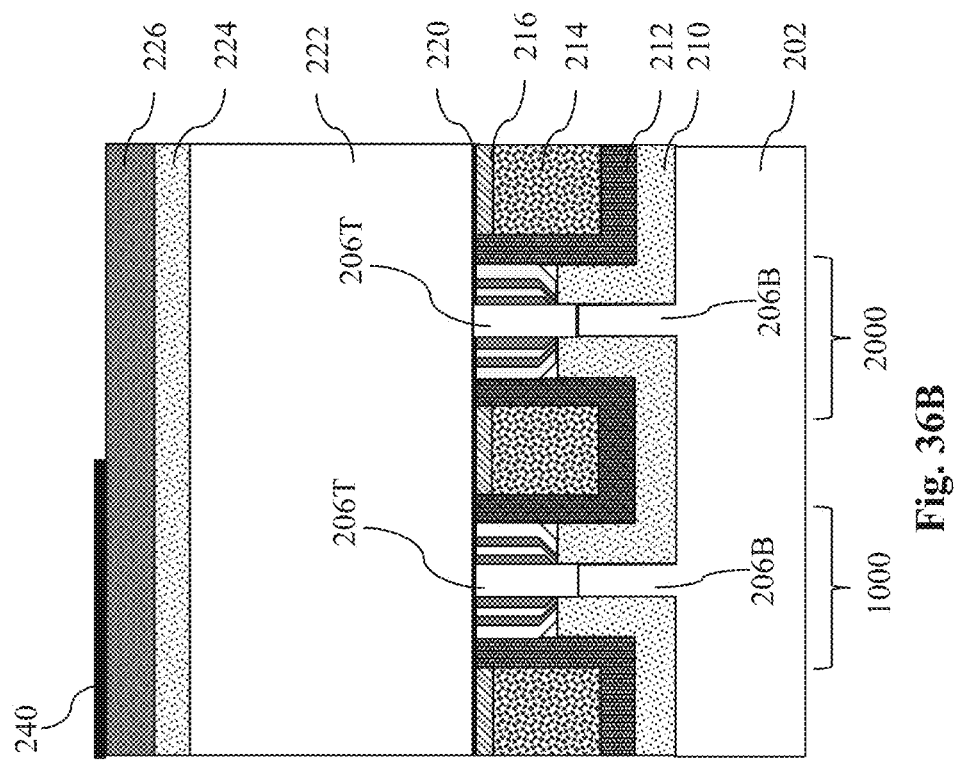
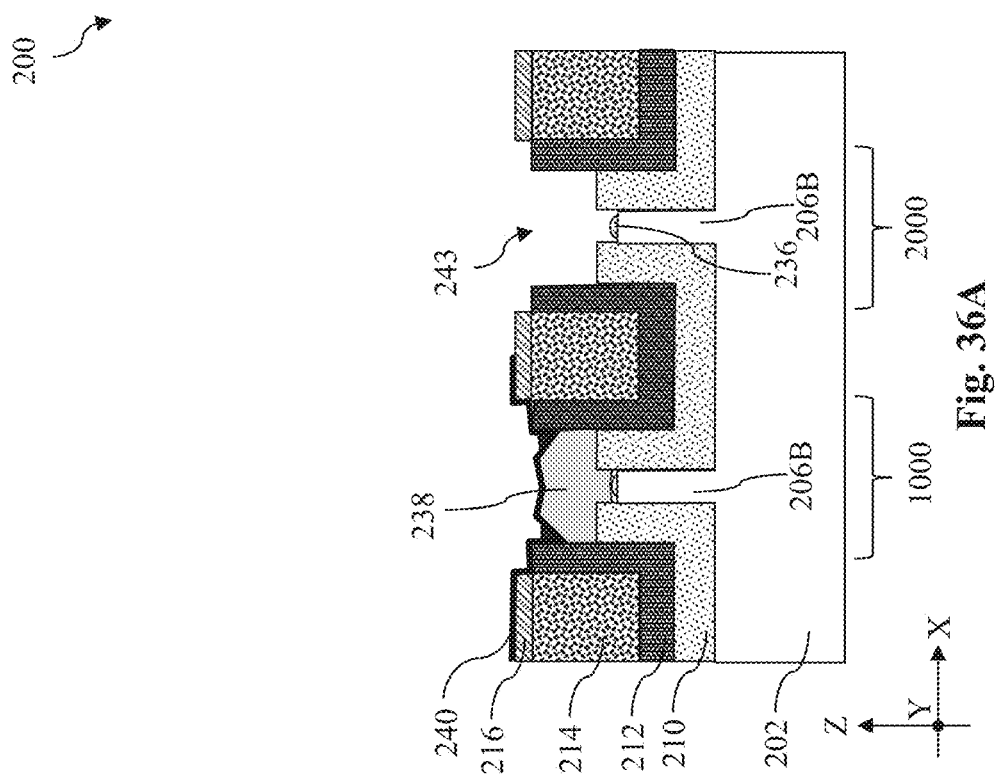
Fig. 36A
Fig. 36B

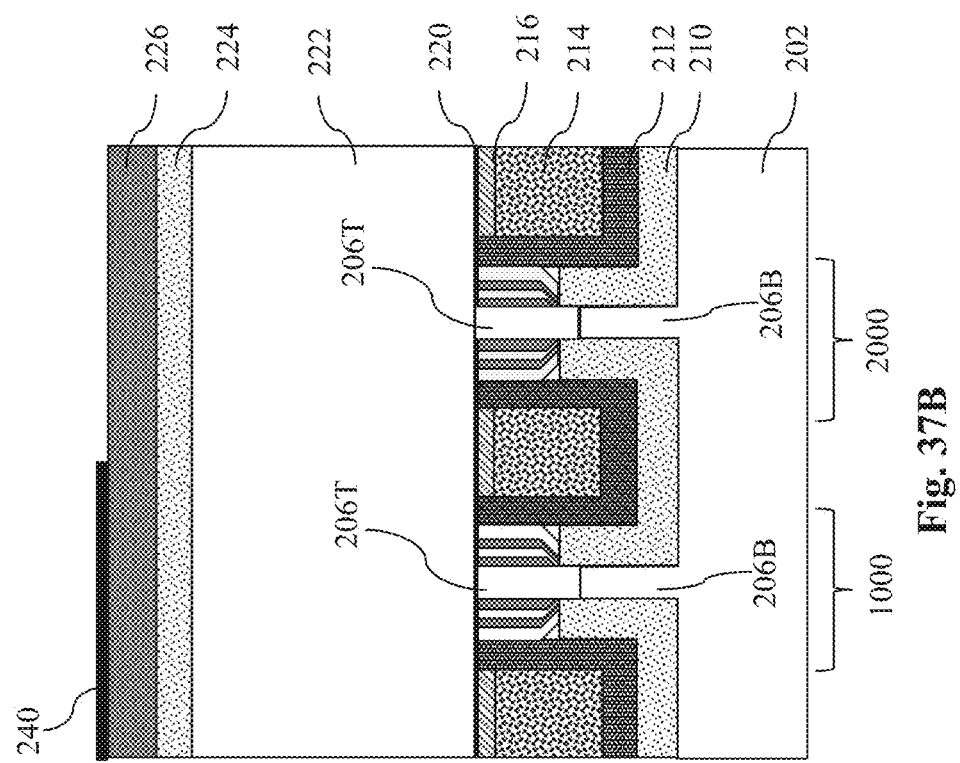
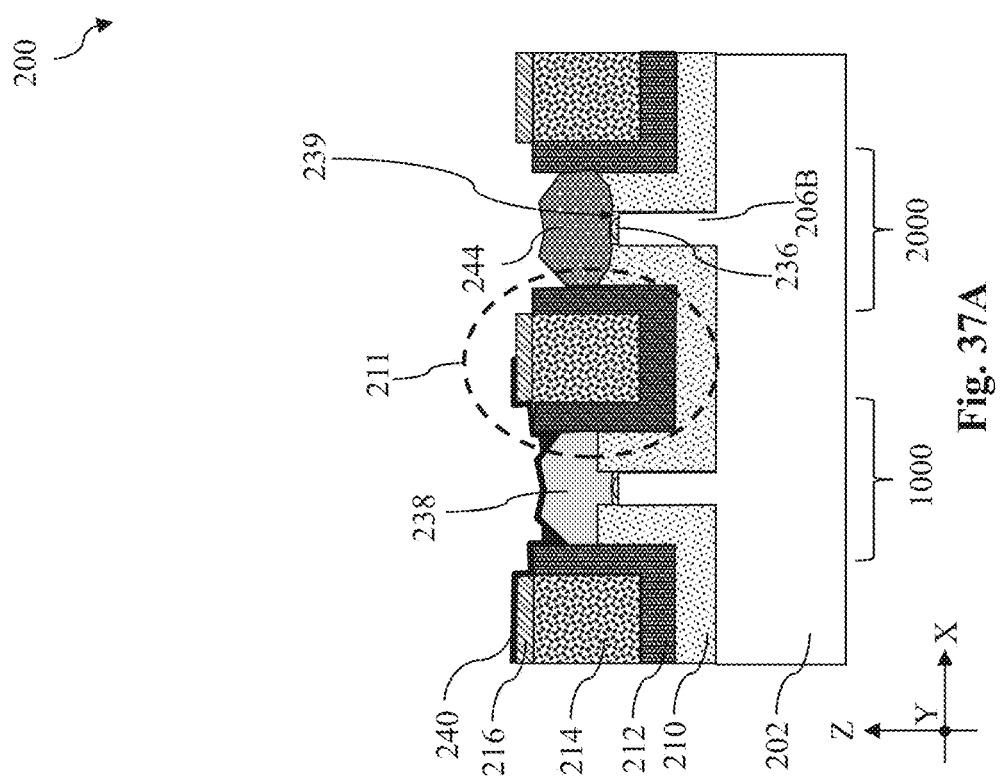
Fig. 37A
Fig. 37B

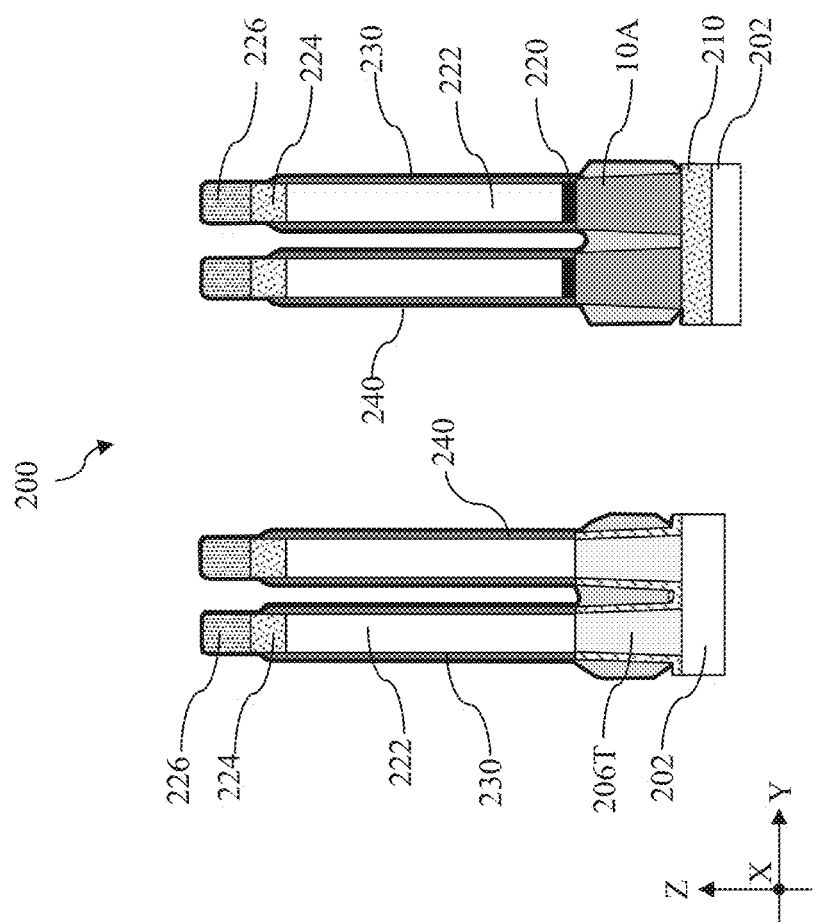

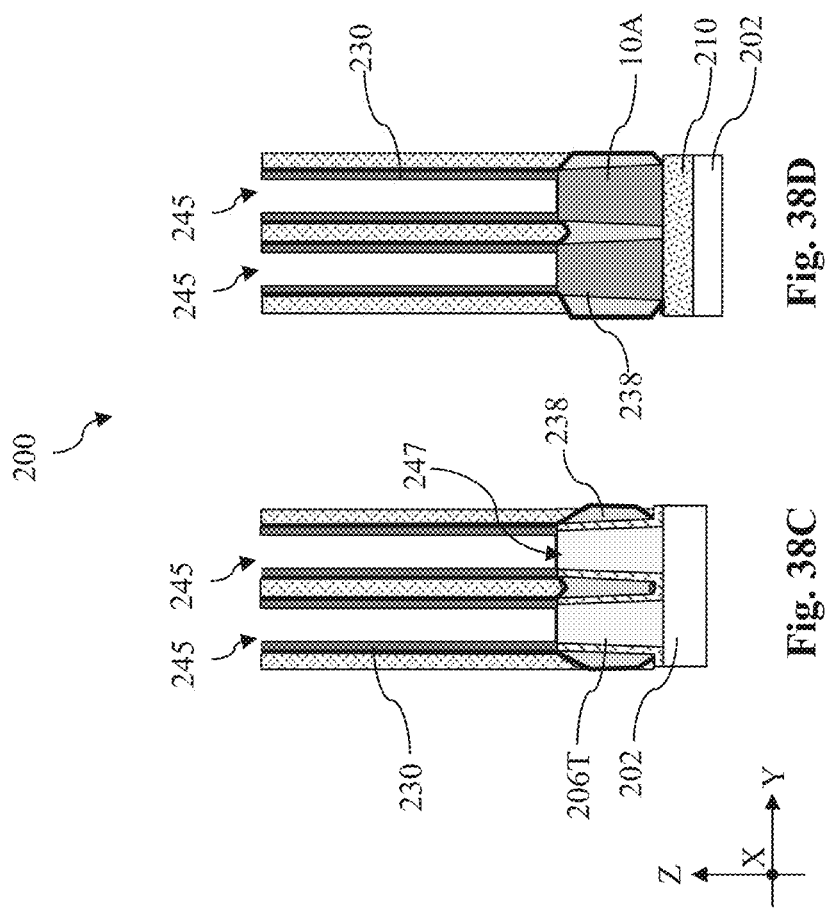

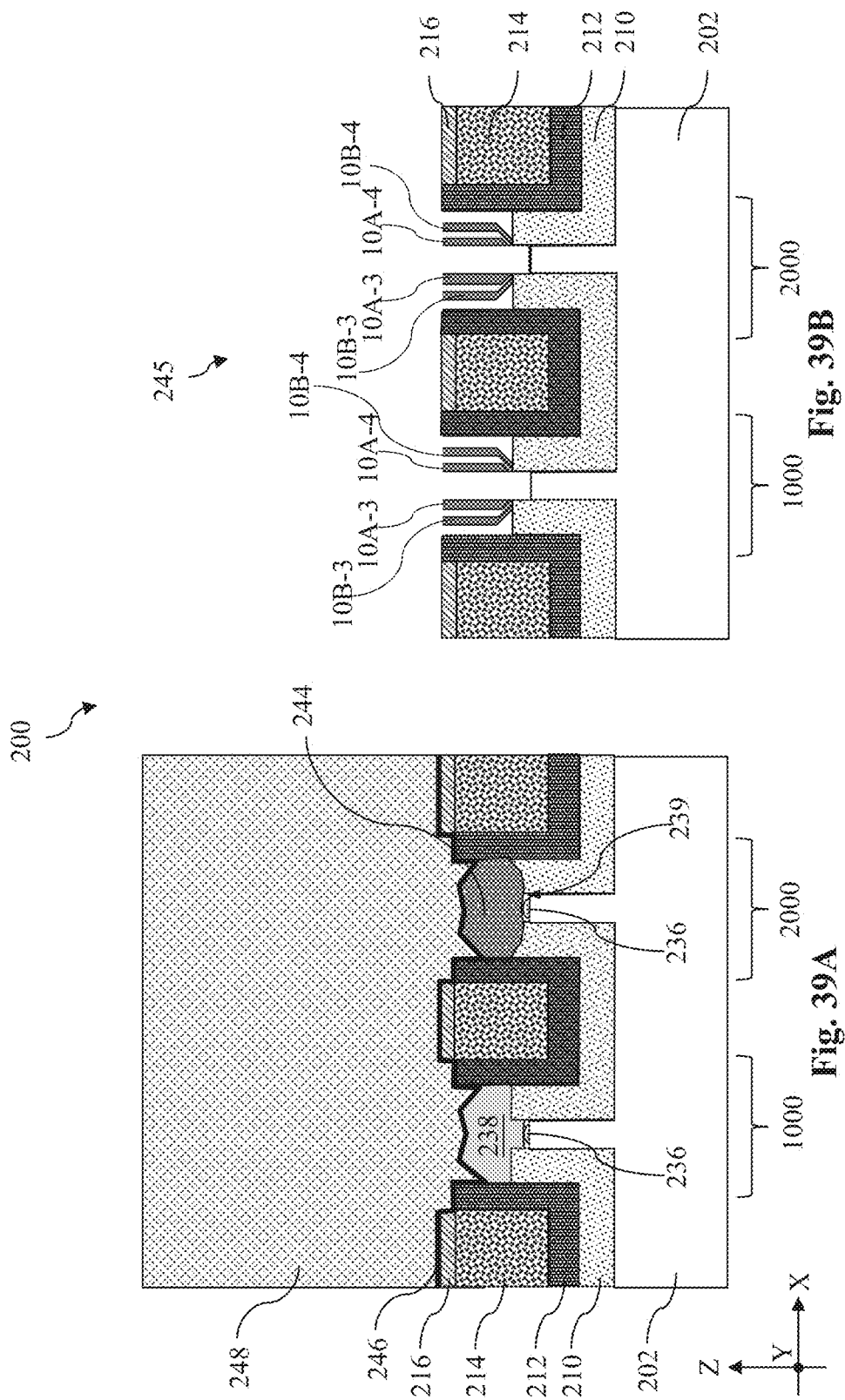

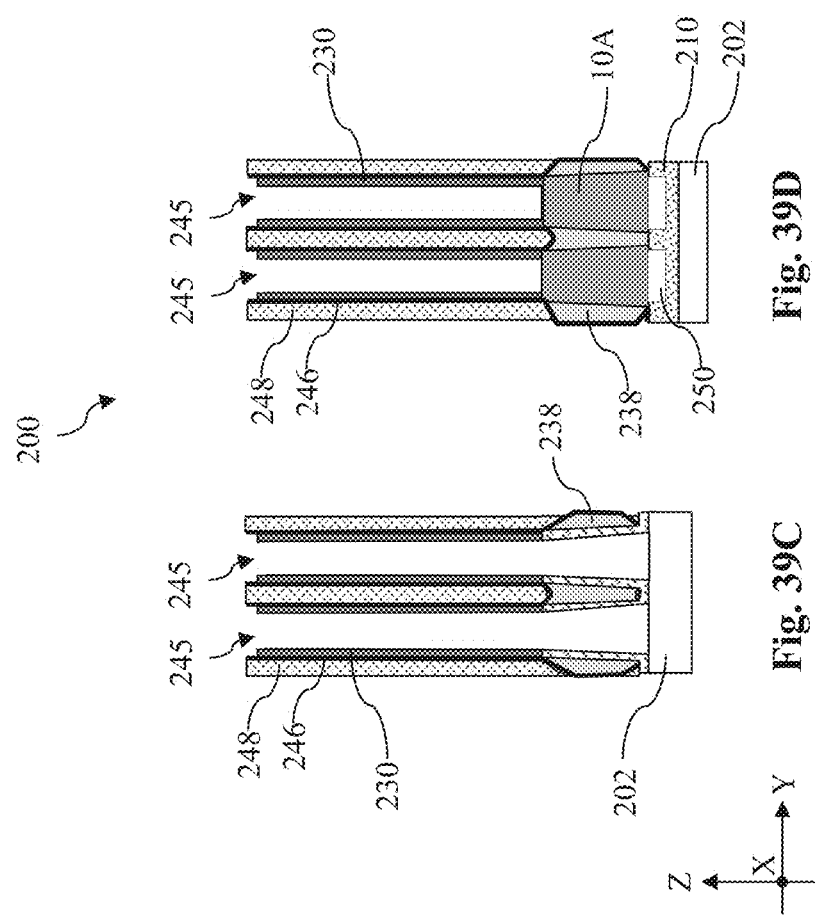

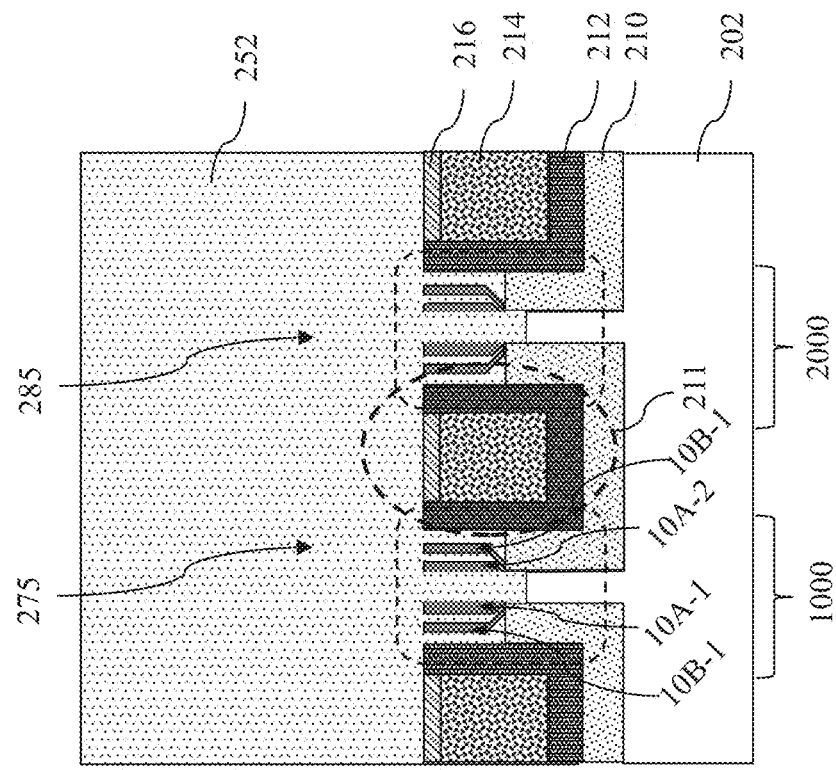
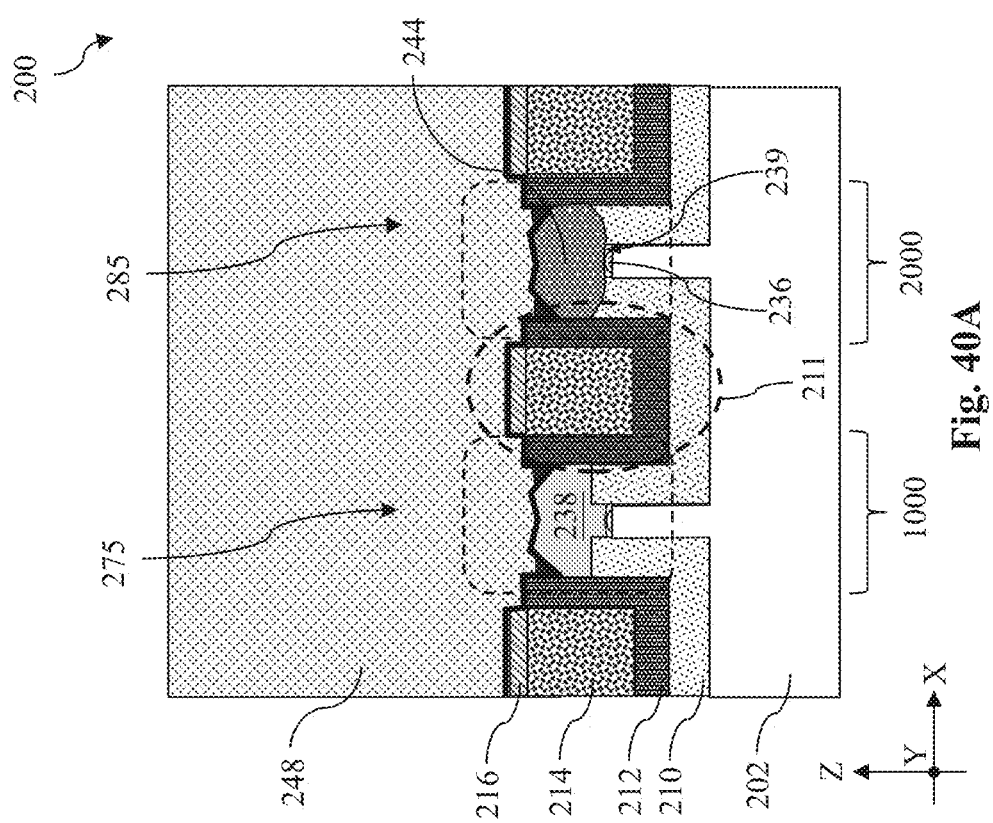
Fig. 40A
Fig. 40B

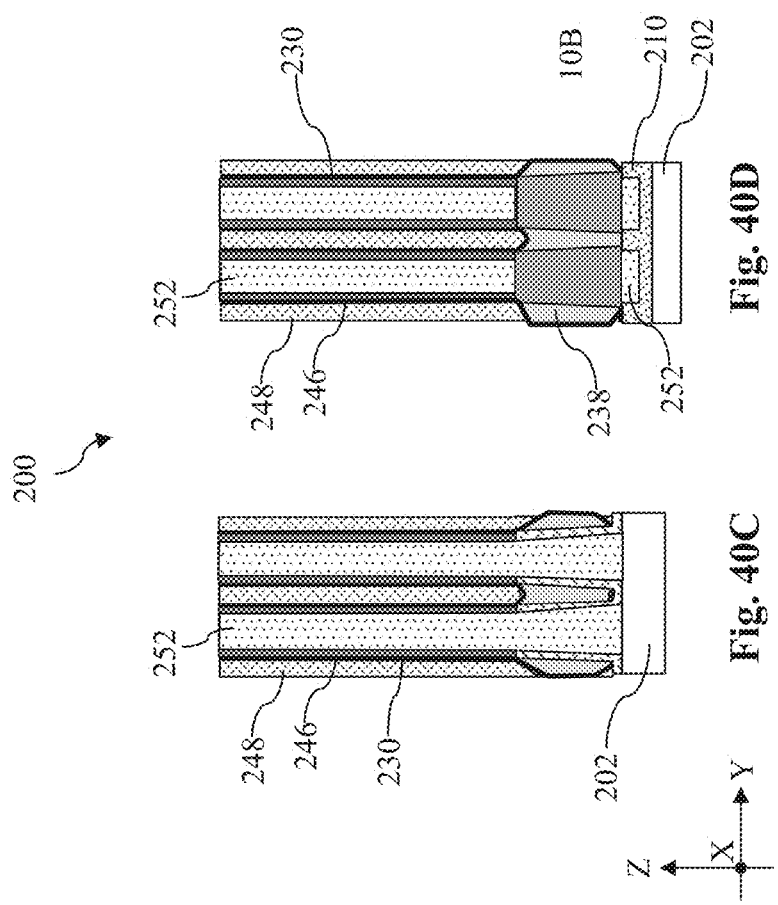

TRANSISTORS HAVING VERTICAL NANOSTRUCTURES

PRIORITY DATA

This application claims priority to U.S. Provisional Patent Application No. 62/982,610 filed on Feb. 27, 2020, entitled "TRANSISTOR HAVING VERTICAL NANOSTRUCTURES", the entire disclosure of which is hereby incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge channel (MBC) FETs are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). An MBCFET has a gate structure that can extend, partially or fully, around a channel region to provide access to the channel region on two or more sides. The channel region of the MBCFET may be formed from nanowires, nanosheets, other nanostructures, and/or other suitable structures.

When an MBCFET has horizontal nanosheet channel members, each of the nanosheet channel members has a width that is greater than its thickness. Thus, the primary channel surface of the nanosheet channel member extends along the width of the nanosheet channel member. In some conventional technology, the primary channel surface is selected to be the (001) crystal surface and the current flow direction is along the <110> crystal direction. However, the (001) crystal surface is not the best crystal surface for propagation of holes, which is the charge carrier for p-type devices. As modern semiconductor devices include both n-type devices and p-type devices, the reduced hole mobility on the (001) crystal surface poses a bottleneck of device performance. Therefore, while existing multi-gate devices are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-8, 9A-19A, 9B-19B, 9C, 10C, 12C, 13C, 14C, 16C, 17C, 18C, 19C, 9D, 10D, 12D, 13D, 14D, 16D, 17D, 18D, 19D, 11E, and 15E are fragmentary cross-sectional and top views of a workpiece undergoing various operations of an embodiment of the method of FIG. 1, according to one or more aspects of the present disclosure.

FIGS. 21-29, 30A-40A, 30B-40B, 30C, 31C, 33C, 34C, 35C, 37C, 38C, 39C, 40C, 30D, 31D, 33D, 34D, 35D, 37D, 38D, 39D, 40D, 32E, and 36E are fragmentary cross-sectional and top views of a workpiece undergoing various operations of an embodiment of the method of FIG. 20, according to one or more aspects of the present disclosure.

DETAILED DESCRIPTION

Figure 1:
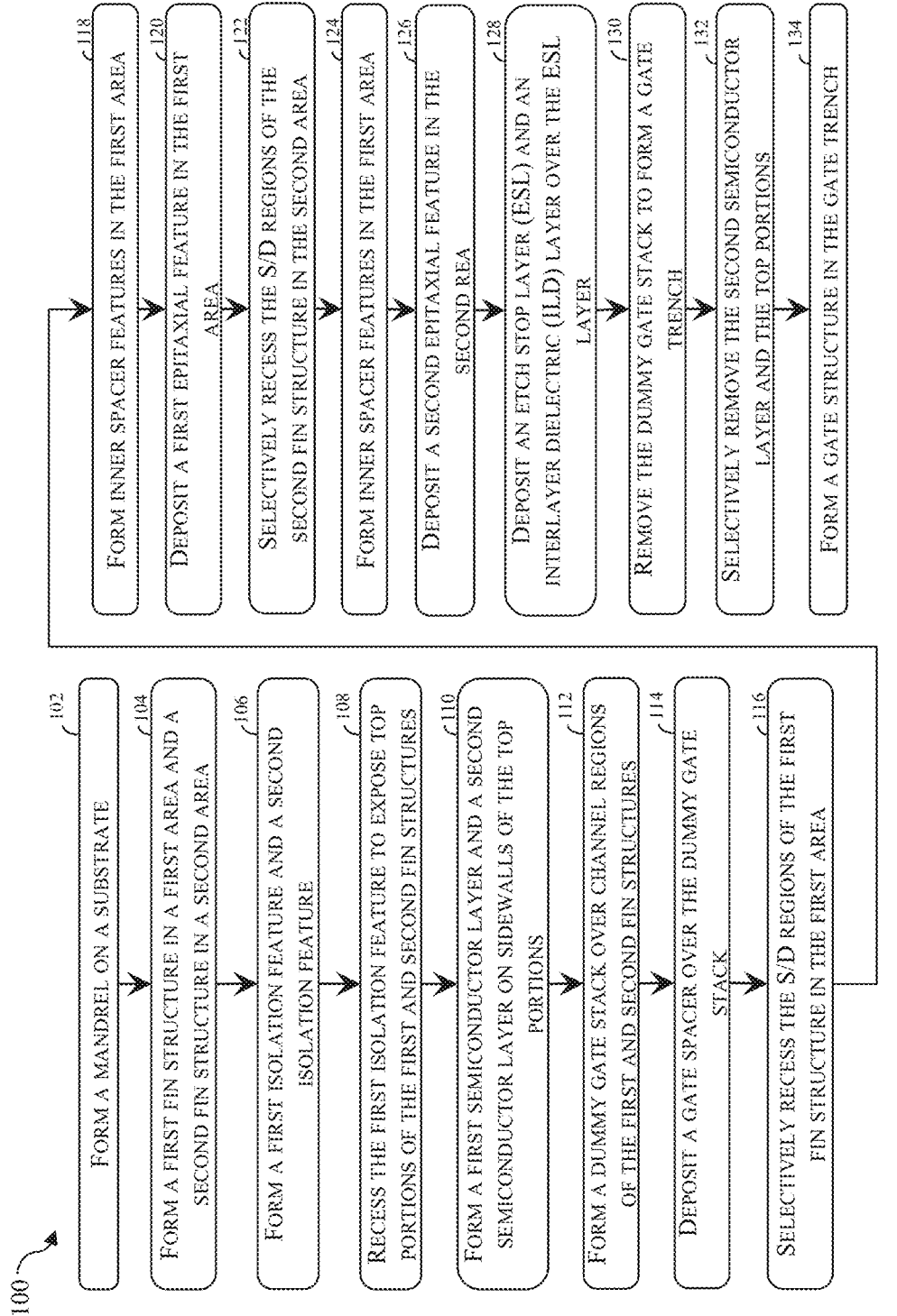
FIG. 1 illustrates a flow chart of a method for forming a semiconductor device having horizontally arranged channel members, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The semiconductor industry has traditionally been selecting an orientation of a substrate based on an optimal level of electron field effect mobility. Because electron has the highest mobility on the (001) crystal surface (i.e., the (001) crystal plane) along the <110> crystal direction of silicon, the primary surface(s) of a channel are likely the (001)

crystal direction. This is true both for the planar field effect transistors (FETs) as well as multi-gate FETs. A planar FET includes a gate structure that may induce a planar channel region along one surface of its active region, hence its name. A multi-gate FET includes a gate structure that is in contact with at least two surfaces of its active region. Examples of multi-gate FETs include fin-type FETs (FinFETs) and multi-bridge channel (MBC) FETs. A FinFET includes a fin-shaped active region arising from a substrate and a gate structure disposed over a top surface and sidewalls of the fin-shaped active region. A MBC FET includes at least one channel member extending between two source/drain features and a gate structure that wraps completely around the at least one channel member. Because of the feature that its gate structure wraps around the channel member, an MBC FET may also be referred to as a gate-all-around (GAA) FET or a surrounding gate transistor (SGT). However, the (001) crystal surface is not the best crystal surface for propagation of holes, which is the charge carrier for p-type devices. As modern semiconductor devices include both n-type devices and p-type devices, the reduced hole mobility on the (001) crystal surface poses a bottleneck of device performance.

As compared to the (001) crystal surface of silicon, the (110) crystal surface (i.e., the (110) crystal plane) offers the highest hole mobility and second highest electron mobility. The present disclosure takes advantage of the carrier mobility properties of the (110) crystal surface of silicon to improve the overall performance of a semiconductor device. By forming a silicon germanium mandrel layer over a silicon substrate, example methods of the present disclosure form a fin structure that include an upper portion that is formed of the silicon germanium mandrel layer and a bottom portion that is formed of the substrate. An even number of first semiconductor layers and second semiconductor layers are then epitaxially and alternatingly grown from sidewalls of the upper portion of the fin structure. The first semiconductor layers may be formed of silicon or a semiconductor material similar to that of the substrate. The second semiconductor layers may be formed silicon germanium or a semiconductor material similar to that of the mandrel layer. The first semiconductor layers are later released after the second semiconductor layers and the upper portion are selectively removed. A gate structure is then formed to wrap substantially around the first semiconductor layers. Because the first semiconductor layers are disposed over sidewalls of the upper portion of the fin structure, the released first semiconductor layers are horizontally arranged and are not disposed over the bottom portion of the fin structure. Each of the first semiconductor layers has a primary (i.e. largest) surface on the (110) crystal surface.

Figure 20:
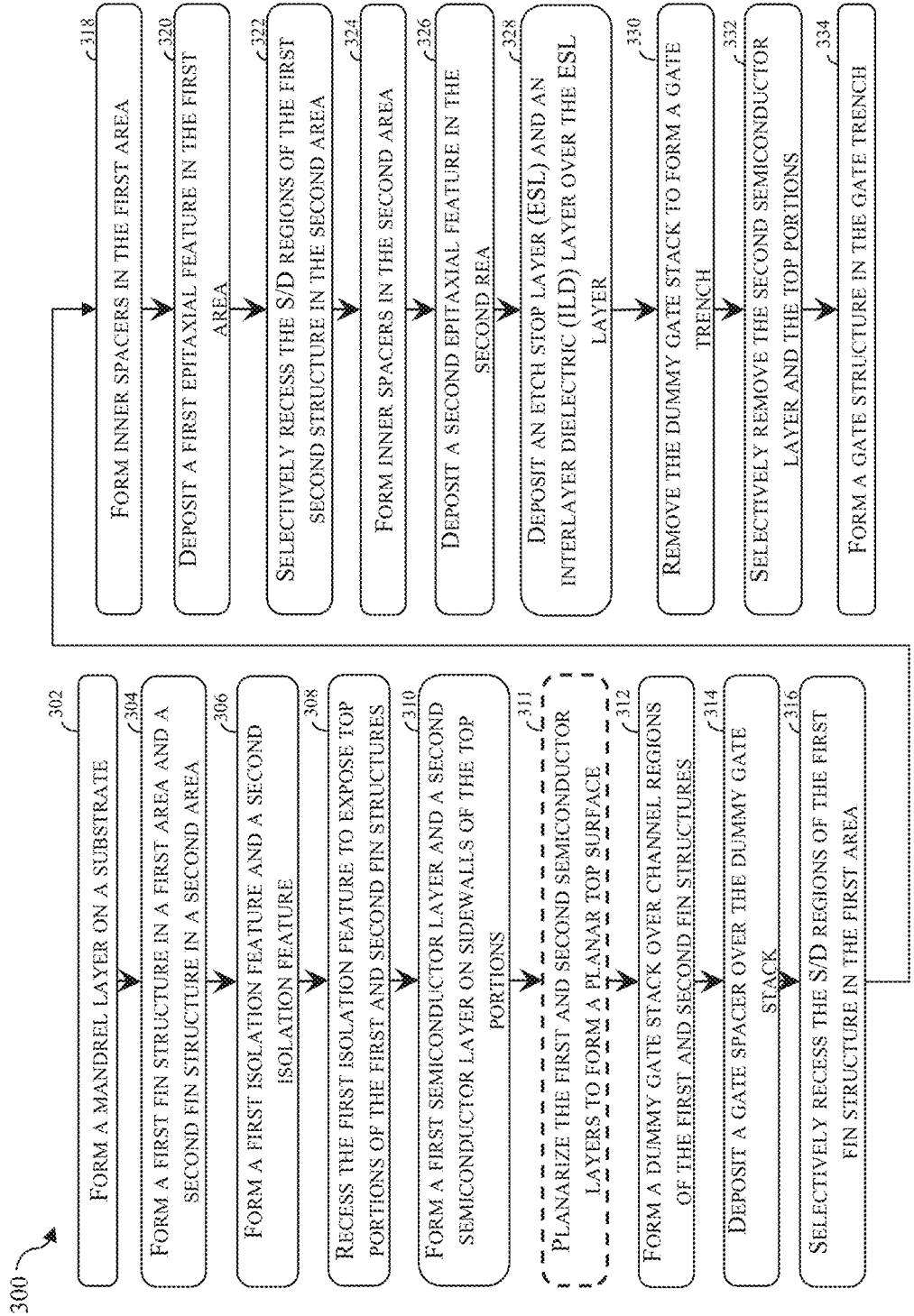
FIG. 20 illustrates a flow chart of a method for forming a semiconductor device having horizontally arranged channel members, according to one or more aspects of the present disclosure.

The various aspects of the present disclosure will now be described in more detail with reference to the figures. FIG. 1 is a flowchart of a method 100 of forming a semiconductor device on a workpiece 200. Method 100 is described below in conjunction with FIGS. 2-8, 9A-19A, 9B-19B, 9C, 10C, 12C, 13C, 14C, 16C, 17C, 18C, 19C, 9D, 10D, 12D, 13D, 14D, 16D, 17D, 18D, 19D, 11E, and 15E, each of which illustrates a fragmentary cross-sectional view or a top view of the workpiece 200 during various operations of method 100. FIG. 20 is a flowchart of a method 300 of forming a semiconductor device on a workpiece 200. Method 300 is described below in conjunction with FIGS. 21-29, 30A-40A, 30B-40B, 30C, 31C, 33C, 34C, 35C, 37C, 38C, 39C, 40C, 30D, 31D, 33D, 34D, 35D, 37D, 38D, 39D, 40D, 32E, and 36E, each of which illustrates a fragmentary cross-sectional view or a top view of the workpiece 200 during various operations of method 300. Methods 100 and 300 are merely examples and not intended to limit the present disclosure beyond what is explicitly recited in the claims. Additional operations can be provided before, during, and after method 100 or method 300, and some operations described can be replaced, eliminated, or moved around for additional embodiments of the methods.

Figure 2:
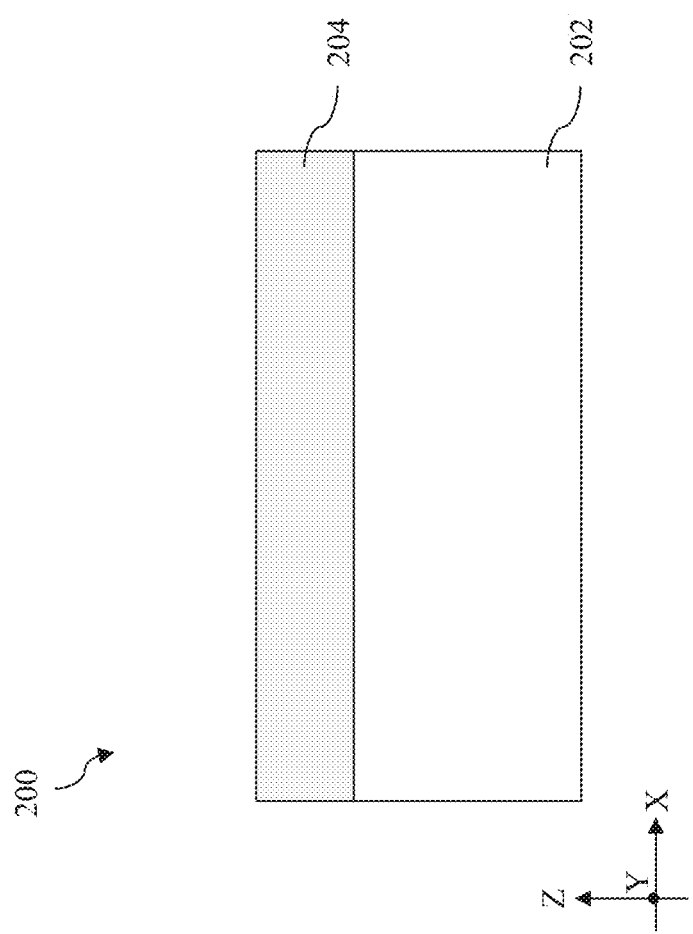

Referring to FIGS. 1 and 2, method 100 includes a block 102 where a mandrel layer 204 is formed on a substrate 202 of a workpiece 200. Because the workpiece 200 will be fabricated into a semiconductor device 200 upon conclusion of the fabrication processes, the workpiece 200 may be referred to as the semiconductor device 200 as the context requires. Further, the exemplary semiconductor devices may include various other devices and features, such as other types of devices including additional transistors, bipolar junction transistors, resistors, capacitors, inductors, diodes, fuses, SRAM and/or other logic circuits, etc., but are simplified for a better understanding of the inventive concepts of the present disclosure. In some embodiments, the substrate 202 may be a semiconductor substrate such as a silicon substrate. The substrate 202 may include various doping configurations depending on design requirements as is known in the art. For example, different doping profiles (e.g., n-wells, p-wells) may be formed on the substrate 202 in regions designed for different device types (e.g., n-type MBCFET, p-type MBCFET). The suitable doping may include ion implantation of dopants and/or diffusion processes. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include a silicon-on-insulator (SOI) structure, and/or may have other suitable enhancement features. In some embodiments, the substrate 202 is a silicon substrate with its top surface on the (001) crystal surface.

As will be described in more details below, in some embodiments, the channel members and source/drain features of the present disclosure may be substantially isolated from the substrate 202 by one or more isolation features, the substrate 202 may not have differently doped wells (such as n-wells and p-wells) even when different types of devices are formed on the workpiece 200. Moreover, because the channel members and source/drain features of the present disclosure may be substantially isolated from the substrate 202 by one or more isolation features, semiconductor devices of the present disclosure may not need an SOI structure or any anti-punch-through (APT) implantation regions to reduce leakage via the bulk substrate.

The mandrel layer 204 may be formed of silicon germanium (SiGe) and may include a germanium concentration ranging between about 20% and about 60%. In some embodiments, the mandrel layer 204 may be epitaxially deposited on the substrate 202 using a molecular beam epitaxy (MBE) process, a metalorganic chemical vapor deposition (MOCVD) process, and/or other suitable epitaxial growth processes. Due to the epitaxial nature of the mandrel layer 204, the mandrel layer 204 may share substantially the same crystalline orientation and structure of the substrate 202. In some embodiments, the mandrel layer 204 includes a thickness between about 40 nm and about 60 nm.

Figure 3:
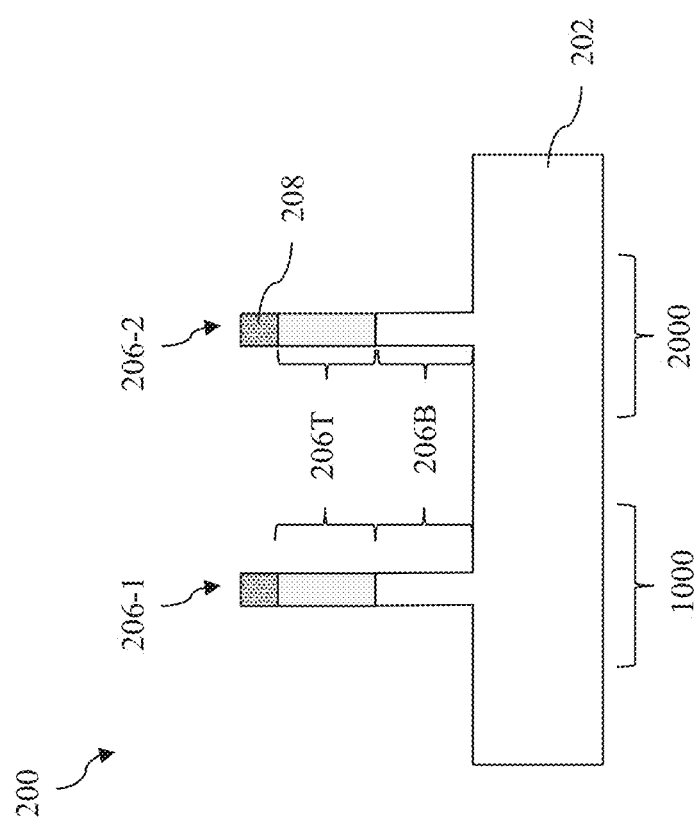

Referring to FIGS. 1 and 3, method 100 includes a block 104 where a first fin structure 206-1 is formed in a first area 1000 of the workpiece 200 and a second fin structure 206-2 is formed in a second area 2000 of the workpiece 200. In some embodiments, the first area 1000 and the second area 2000 of the workpiece 200 (or the semiconductor device 200) may be areas for devices of different conductivity types. In some embodiments represented in FIGS. 2-19, the first area 1000 may be a p-type device area and the second area 2000 may be an n-type device area. Other configurations are possible and are fully envisioned. For example, the first area 1000 may be an n-type device area and the second area 2000 may be a p-type device area. It is noted that, for illustration purposes and not to limit the scope of the present disclosure, the first area 1000 and the second area 2000 are depicted in FIGS. 2-19 and 21-38 as being right next to each other. However, the present disclosure is not so limited and may include a workpiece 200 or a semiconductor device 200 that includes spaced-apart first areas 1000 and second areas 2000.

As shown in FIG. 3, each of the first fin structure 206-1 in the first area 1000 and the second fin structure 206-2 in the second area 2000 is formed from the mandrel layer 204 and the substrate 202. As a result, each of the first fin structure 206-1 and the second fin structure 206-2 includes a bottom portion 206B that is formed of the substrate 2020 and a top portion 206T that is formed of the mandrel layer 204. The first fin structure 206-1 and the second fin structure 206-2 extend upward from and rise above the substrate 202. To form the first fin structure 206-1 and the second fin structure 206-2, a fin top hard mask layer 208 may be formed over the mandrel layer 204. The fin top hard mask layer 208 is patterned by a photolithography process to form fin top hard mask features 208, which are then used as an etch mask in an etch process to form the first and second fin structures 206-1 and 206-2. The fin top hard mask layer 208 may be formed of silicon carbonitride or silicon nitride and may be formed to a thickness between about 3 nanometer (nm) and about 10 nm. The patterning of the fin top hard mask layer 208 may be performed using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. The etch process for forming the first and second fin structures 206-1 and 206-2 may include dry etching, wet etching, reactive ion etching (RIE), and/or other suitable processes. The first fin structure 206-1 and the second fin structure 206-2 extend lengthwise along the Y direction.

Figure 4:
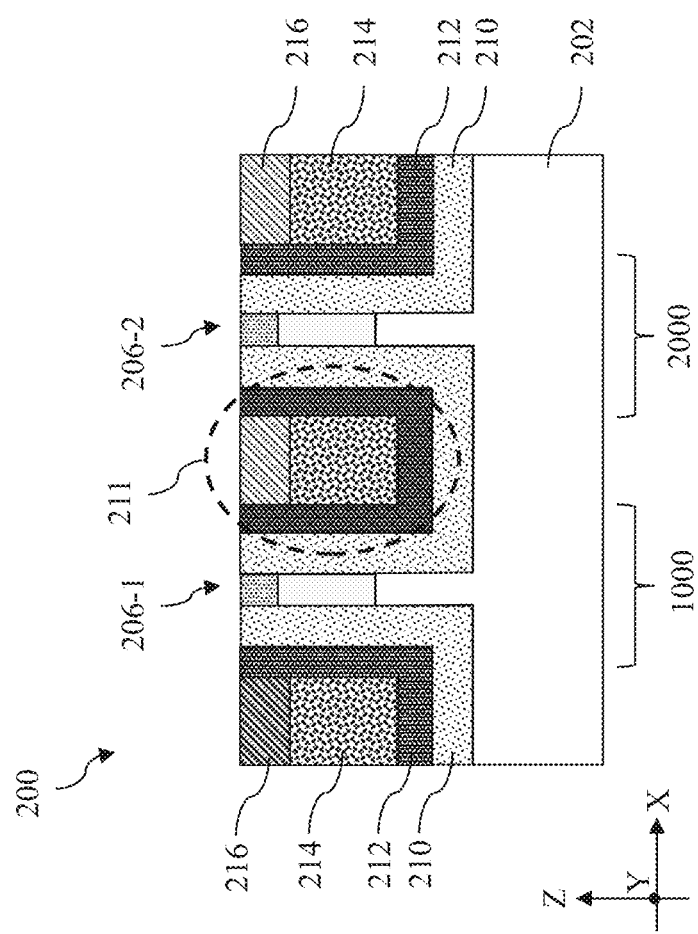

Referring to FIGS. 1 and 4, method 100 includes a block 106 where a first isolation feature 210 and a second isolation feature 211 are formed over the workpiece 200. In order to form the first isolation feature 210, a first dielectric layer is conformally deposited over the workpiece 200, including over the first fin structure 206-1 and the second fin structure 206-2. The first dielectric layer may be deposited using chemical vapor deposition (CVD), atomic layer deposition (ALD), or a suitable deposition method. The first dielectric layer that becomes the first isolation feature 210 may be a single layer or a multi-layer and may include silicon oxide, silicon oxycarbide, silicon oxycarbonitride. Depending on the number of channel members, such as 2, 4, 6, or 8 channel members, the first dielectric layer may have a wide range of thickness, such as between about 10 nm and 40 nm. In some instances where 2 or 4 channel members are desired, the first dielectric layer may have a thickness between about 10 nm and about 20 nm. As shown in FIG. 4, the conformal deposition of the first dielectric layer does not fill the space between the first fin structure 206-1 and the second fin structure 206-2, leaving room for formation of a second isolation feature 211.

In some embodiments, as a shape of the second isolation feature 211 generally resembles that of the first and second fin structures 206-1 and 206-2, the second isolation feature 211 may be referred to as a hybrid fin 211, a dummy fin 211, or a dielectric fin 211. To form the second isolation feature 211, a second dielectric layer 212 is conformally deposited over the first dielectric layer that forms the first isolation feature 210. The second dielectric layer 212 may be deposited using CVD, ALD, or a suitable deposition method. In some implementations, the second dielectric layer 212 may include silicon oxycarbonitride, silicon oxycarbide, or silicon carbonitride. Like the first dielectric layer, the second dielectric layer 212 does not completely fill the space between the first fin structure 206-1 and the second fin structure 206-2, leaving room for further structures of the second isolation feature 211. In some embodiments, the conformal deposition of the second dielectric layer 212 define a trench and, at block 106, the trench may be filled by a dielectric filler 214 and a helmet layer 216 over the dielectric filler 214. In some instances, the dielectric filler 214 may be formed of a low-dielectric-constant (i.e, low-k, with a dielectric constant smaller than or about 3.9) dielectric material, such as silicon oxide, fluorine-doped silicate glass (FSG), or carbon-doped silicon oxide. The helmet layer 216 may be formed of a high-dielectric-constant (i.e., high-k, with a dielectric constant substantially greater than 3.9) dielectric material, such as hafnium oxide, aluminum oxide, or zirconium oxide. The low-k dielectric filler 214 functions to reduce parasitic capacitance and the high-k helmet layer 216 functions to provide etching selectivity. As shown in FIG. 4, the dielectric filler 214 and the helmet layer 216 may collectively form an inner fin structure that is lined by the second dielectric layer 212 on its sidewalls and bottom surface. After deposition of the first dielectric layer, the second dielectric layer, the dielectric filler 214, and the helmet layer 216, the workpiece 200 is planarized using a chemical mechanical polishing (CMP) process to form the first isolation feature 210 and the second isolation feature 211 shown in FIG. 4. After the planarization, the helmet layer 216 may have a thickness between about 10 nm and about 20 nm. As illustrated therein, each of the first fin structure 206-1 and the second fin structure 206-2 is spaced apart from an adjacent second isolation feature 211 along the X direction by a first isolation feature. It can be seen that the first dielectric layer is separated by the planarization process into a plurality of first isolation features. Each of the first fin structure 206-1 and the second fin structure 206-2 is sandwiched between two first isolation features 210.

Figure 5:
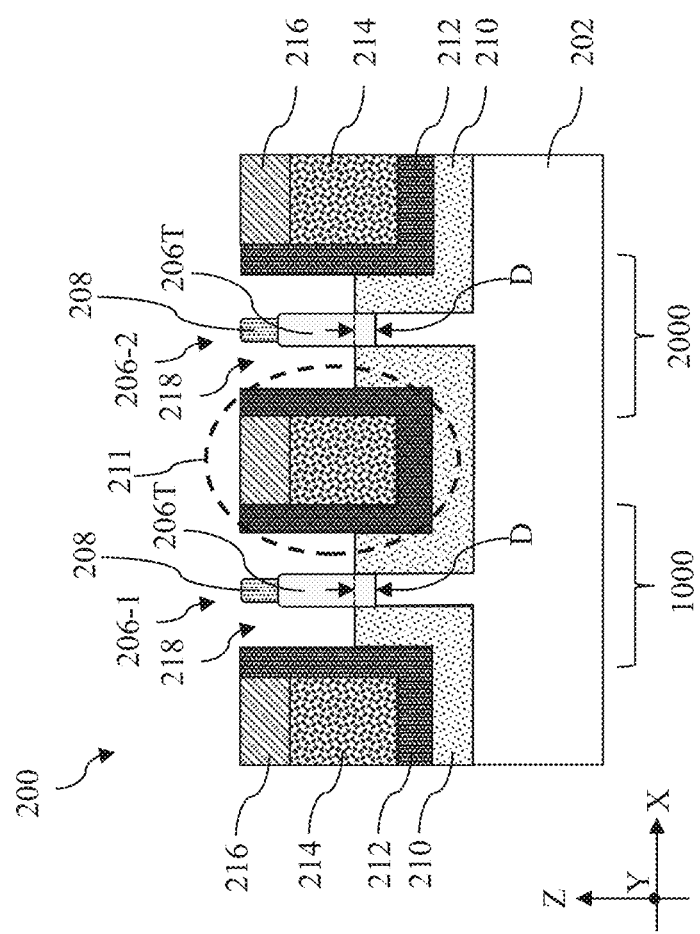

Referring to FIGS. 1 and 5, method 100 includes a block 108 where the first isolation feature 210 is recessed to expose top portions 206T of the first fin structure 206-1 and the second fin structure 206-2. In some embodiments, the block 108 includes use of an etch process that is selective to the first isolation feature 210. For example, when the first isolation feature 210 is formed of silicon oxide, the second dielectric layer is formed of silicon carbonitride, the fin top hard mask features 208 are formed of silicon nitride, and the helmet layer 216 is formed of zirconium oxide, the etch process at block 108 may be one that is selective to silicon oxide. In some implementations, the etch process of block 108 may be an isotropic etch process that uses a fluorine containing etchant. For example, a fluorine-containing gas (e.g., $CF_4$, $SF_6$, $CH_2F_2$, $CHF_3$, and/or $C_2F_6$) may be used at block 108 to recess the first isolation features. As illustrated in FIG. 5, in some embodiments, the first isolation features 210 are selectively recessed by the etch process to expose a majority of the top portions 206T of the first fin structure 206-1 and the second fin structure 206-2. In some instances shown in FIG. 5, along the Z direction, top surfaces of the first isolation features 210 may be higher than a top surface of the bottom portions 206B by a difference D, which may be between about 3 nm and about 8 nm. The recessing at block 108 may moderately etch the fin top hard mask features 208 and the top portions 206 to form rounded edges. The spacing between a fin structure (such as the first fin structure 206-1 and the second fin structure 206-2) and an adjacent second isolation feature 211 is substantially defined by the thickness of the first isolation features 210 along the X direction.

Figure 6:
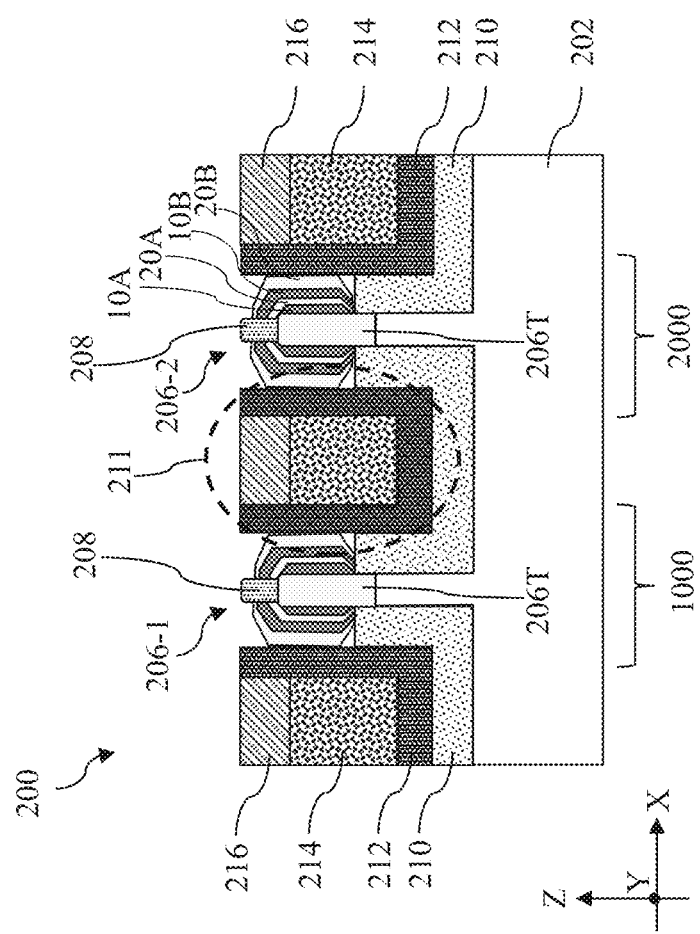

Referring to FIGS. 1 and 6, method 100 includes a block 110 where at least one first semiconductor layer 10 (including 10A, 10B, and so forth) and at least one second semiconductor layer 20 (including 20A, 20B, and so forth) are formed on sidewalls of the top portions (206T) of the first fin structure 206-1 and the second fin structure 206-2. In some embodiments, the first semiconductor layers and the second semiconductor layers are deposited using an epitaxial growth process, such as a molecular beam epitaxy (MBE) process or a metalorganic chemical vapor deposition (MOCVD) process. The first and second semiconductor layers may be selectively formed over a semiconductor surface rather than surfaces of dielectric features. Upon conclusion of operations at block 108, the only exposed semiconductor surfaces are those of the exposed top portions of the first and second fin structures 206-1 and 206-2. As a result, the first and second semiconductor layers may be selectively formed on the exposed surfaces of the top portions 206T of the first and second fin structures 206-1 and 206-2.

In some embodiments represented in FIG. 6, the first semiconductor layers 10 (including 10A, 10B, and so forth) and the second semiconductor layers 20 (including 20A, 20B, and so forth) are alternatingly formed on the exposed sidewalls surfaces of the top portions 206T in the first area 1000 and the second area 2000. Taking the second fin structure 206-2 in FIG. 6 as an example, a first semiconductor layer 10A is formed on the sidewalls of the top portion 206. A second semiconductor layer 20A is then formed on the first semiconductor layer 10A. The deposition of the second semiconductor layer 20A is followed by deposition of another first semiconductor layer 10B, which is in turn followed by another second semiconductor layer 20B. Overgrowth may take place such that a portion of the first and second semiconductor layers may be in contact with or span over a dielectric feature, such as the fin top hard mask features 208 or the first isolation features 210. Because the semiconductor layers are substantially grown from the vertical sidewalls of the top portions 206T, each of them extends along the Y-Z plane and may resemble a nanosheet that has a thickness along the X direction. In addition, because each of the top portions 206T has two sidewalls, deposition of one semiconductor layer results into two nanosheet-like structures on both sides of the top portion 206T. As will be described in further detail below, after the selective removal of the second semiconductor layers 20 and the top portion 206T, the first semiconductor layers 10 will be released as channel members. Because each of the first semiconductor layer 10 results into two nanosheet-like structures, a FET according to the present disclosure has an even number of channel members, such as 2, 4, 6, or 8 channel members. Deposition of a first semiconductor layer followed by a second semiconductor layer constitutes a cycle. Each cycle of deposition will result in 2 channel members after the deposited first semiconductor layers are released. A transistor with more than 8 channel members may be fabricated using methods of the present disclosure.

In some embodiments, the first semiconductor layers 10 (including 10A, 10B, and so forth) may be formed of silicon, silicon-rich silicon germanium with a germanium concentration less than 20%, or III-V semiconductor materials (such as GaAsP, AlInAs, AlGaAs, InGaAs, GaInP, or GaInAsP). The second semiconductor layers 20 (including 20A, 20B, and so forth) may be formed of silicon germanium, which allows them to be selectively removed at a later stage to release the first semiconductor layers as the channel members. The first semiconductor layers may have a uniform thickness between about 5 nm and about 10 nm and the second semiconductor layers may have a uniform thickness between 5 nm and about 8 nm. That is, each cycle of deposition at block 110 may form a combined thickness between about 10 nm and 18 nm. The thickness of the first isolation features 210 may be adjusted such that the vacancy left from their recess at block 108 accommodate the first and second semiconductor layers. As illustrated in FIG. 6, as subsequent semiconductor layers grow from existing semiconductor layers that grow over the fin top hard mask features 208 and the first isolation features 210, the semiconductor layers deposited at block 110 may taper toward the fin top hard mask features 208 as well as toward the first isolation feature 210. As a result, each the fin top hard mask features 208 plugs the access to at least one internal semiconductor layers. For example, without removal of the fin top hard mask features, an etch process may not have access to the second semiconductor layer 20A which is sandwiched between two first semiconductor layers 10A and 10B, and is capped by a fin top hard mask feature 208. Because the second semiconductor layers 20 are to be removed at a later stage to release the first semiconductor layers 10 as channel members, the first semiconductor layers 10 may also be referred to as channel layers and the second semiconductor layers 20 may also be referred to as sacrificial layers.

Figure 7:
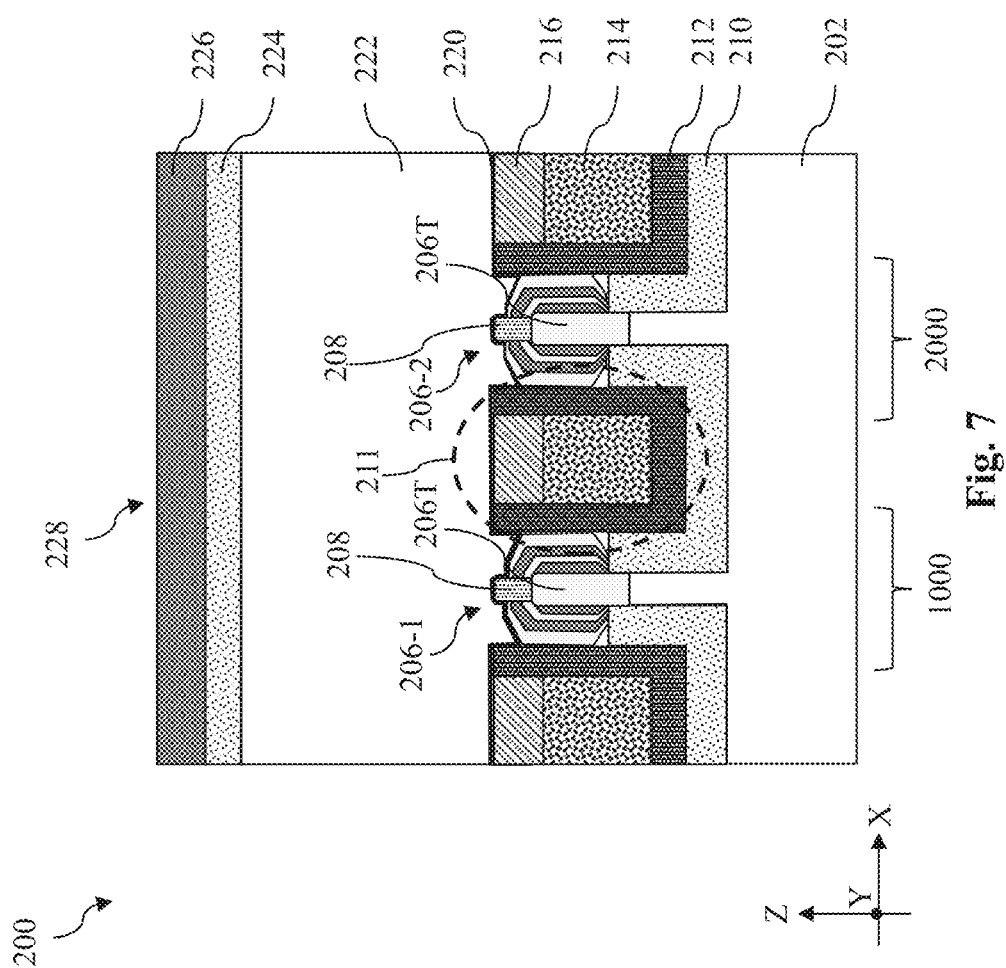

Referring to FIGS. 1 and 7, method 100 includes a block 112 where a dummy gate stack 228 is formed over channel regions of the first fin structure 206-1 and the second fin structure 206-2. The dummy gate stack 228 is formed over channel regions of the first fin structure 206-1 and the second fin structure 206-2. In some embodiments, a gate replacement process (or gate-last process) is adopted where the dummy gate stack 228 serves as a placeholder for a functional gate structure and is to be removed and replaced by the functional gate structure. Other processes and configuration are possible. In some embodiments, the dummy gate stack 228 is formed over the substrate 202 and is at least partially disposed over the first fin structure 206-1 and the second fin structure 206-2. The portion of the first fin structure 206-1 and the second fin structure 206-2 underlying the dummy gate stack 228 are the channel regions of the first fin structure 206-1 and the second fin structure 206-2. The dummy gate stack 228 also define source/drain (S/D) regions adjacent to and on opposing sides of the channel region.

In the illustrated embodiment, block 112 first forms a dummy dielectric layer 220 over the first and second fin structures 206-1 and 206-2. In some embodiments, the dummy dielectric layer 220 may include silicon oxide, silicon nitride, a high-K dielectric material and/or other suitable material. In various examples, the dummy dielectric layer 220 may be deposited by a CVD process, a sub-atmospheric CVD (SACVD) process, a flowable CVD process, an ALD process, a PVD process, or other suitable process. By way of example, the dummy dielectric layer 220 may be used to prevent damages to the fin structures by subsequent processes (e.g., formation of the dummy gate stack). Subsequently, block 112 forms other portions of the dummy gate stack 228, including a dummy gate electrode layer 222, a nitride gate top hard mask layer 224 and an oxide gate top hard mask layer 226. In some embodiments, the dummy gate stack 228 is formed by various process steps such as layer deposition, patterning, etching, as well as other suitable processing steps. Exemplary layer deposition processes include low-pressure CVD, CVD, plasma-enhanced CVD (PECVD), PVD, ALD, thermal oxidation, e-beam evaporation, or other suitable deposition techniques, or combinations thereof. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate electrode layer 222 may include polycrystalline silicon (polysilicon). In some embodiments, the nitride gate top hard mask layer 224 may include a pad nitride layer that may include silicon nitride, silicon oxynitride and/or silicon carbide. In some embodiments, the oxide gate top hard mask layer 226 includes silicon oxide. In some instances, a thickness of the oxide gate top hard mask layer 226 may have a thickness between 10 nm and 30 nm and a thickness of the oxide gate top hard mask layer may have a thickness between 30 nm and about 60 nm. As illustrated in FIG. 7, the dummy gate stack 228 extends lengthwise along the X direction. Although not explicitly shown in FIG. 7, the dummy dielectric layer 220 that is not cover from the dummy gate electrode layer 222 may be selectively removed using a dry etching process, such as an RIE process.

Figure 8:
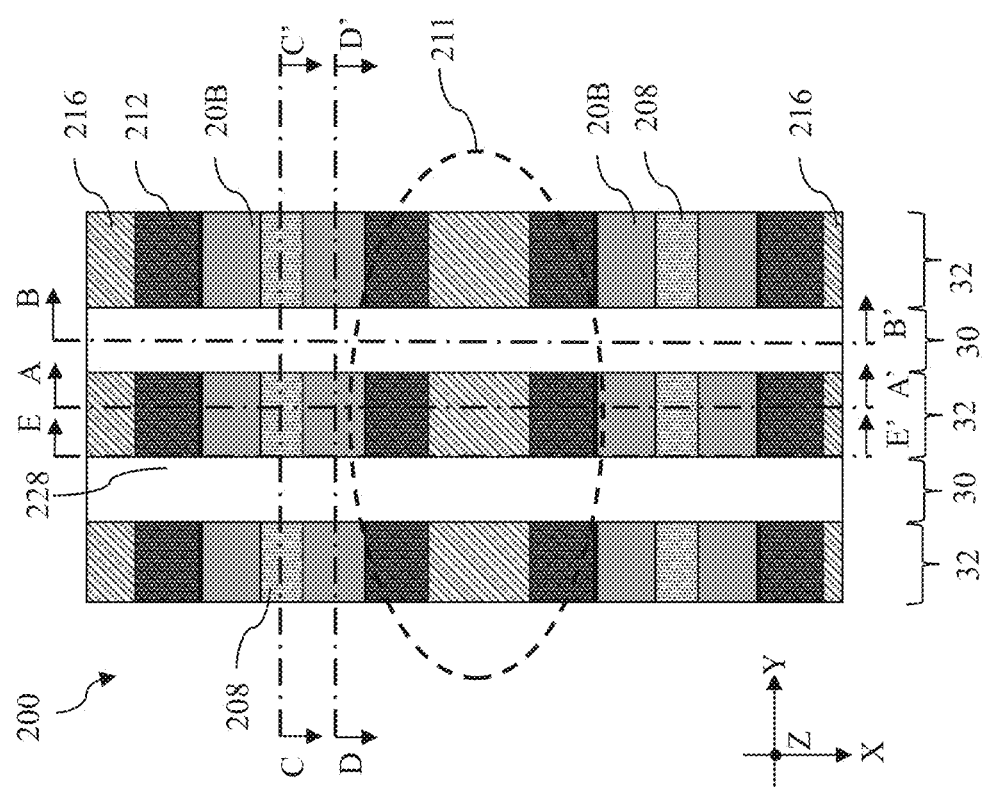

FIG. 8 is a fragmentary top view of the workpiece 200 after the dummy gate stack 228 is formed at block 112. In FIG. 8, the dummy gate stacks 228 extend lengthwise along the X direction, the fin structures (not explicitly shown) under the fin top hard mask features 208 extend lengthwise along the Y direction, and the second isolation feature 211 also extends lengthwise along the Y direction. Also shown in FIG. 8 are five cross-sections—AA', BB', CC', DD' and EE'. The cross-section AA' cuts along the X direction in a source/drain region 32. The cross-section BB' cuts along the X direction in a channel region 32 covered by the dummy gate stack 228. The cross-section CC' cuts along the Y direction right through the middle of a fin structure, such as the first fin structure 206-1 or the second fin structure 206-2. The cross-section DD' cuts along the Y direction right through one of the first semiconductor layers (e.g. 10A or 10B shown in FIG. 6). The cross-section EE' cuts along the Y direction right at the interface of a source/drain region 32 and a channel region 30. A figure ending with A, such as any of FIGS. 9A-19A, illustrates a fragmentary cross-sectional view along the AA' cross-section; a figure ending with B, such FIGS. 9B-19B, illustrates a fragmentary cross-sectional view along the BB' cross-section; a figure ending with C, such as any of FIGS. 9C, 10C, 12C, 13C, 14C, 16C, 17C, 18C, and 19C, illustrates a fragmentary cross-sectional view along the CC' cross-section; a figure ending with D, such as any of FIGS. 9D, 10D, 12D, 13D, 14D, 16D, 17D, 18D, and 19D, illustrates a fragmentary cross-sectional view along the DD' cross-section; and a figure ending with E, such as any of FIGS. 11E and 15E, illustrates a fragmentary cross-sectional view along the EE' cross-section. Therefore, figures ending with A illustrate structures in the source/drain regions 32; figures ending with B illustrate structures in the channel regions 30; figures ending with C illustrate structures in the fin structures; figures ending with D illustrate structures in the channel layers/members; and figures ending with E illustrate features at the interface between a source/drain region 32 and a channel region 30, such as inner spacer features.

Referring to FIGS. 1 and 9A-9D, method 100 includes a block 114 where a gate spacer layer 230 is deposited over the dummy gate stack 228. In some embodiments, the gate spacer layer 230 is deposited conformally over the workpiece 200, including over top surfaces and sidewalls of the dummy gate stack 228 shown in FIG. 9B. The term "conformally" may be used herein for ease of description of a layer having substantially uniform thickness over various regions. The gate spacer layer 230 may have a single-layer construction or include multiple layers. In some embodiments, the gate spacer layer 230 may include silicon oxide, silicon nitride, silicon carbide, silicon oxynitride, silicon carbonitride, silicon oxycarbide, silicon oxycarbonitrde, and/or combinations thereof. The gate spacer layer 230 may be deposited over the dummy gate stack 228 using processes such as, CVD process, a subatmospheric CVD (SACVD) process, a flowable CVD process, an ALD process, a PVD process, or other suitable process. In some implementations, the gate spacer layer 230 may be formed to a thickness between about 5 nm and about 8 nm. As shown in FIG. 9A, the gate spacer layer 230 is also conformally deposited over the source/drain regions 32. As illustrated in FIGS. 9C and 9D, the gate spacer layer 230 is disposed on top surfaces and sidewalls of the dummy gate stacks 228. When the cross-section DD' cuts across the first semiconductor layer 10A, it also cuts through the first semiconductor layer 10B as well as the second semiconductor layers 20A and 20B that overly the first semiconductor layer 10A.

Figures 10A, 10B:
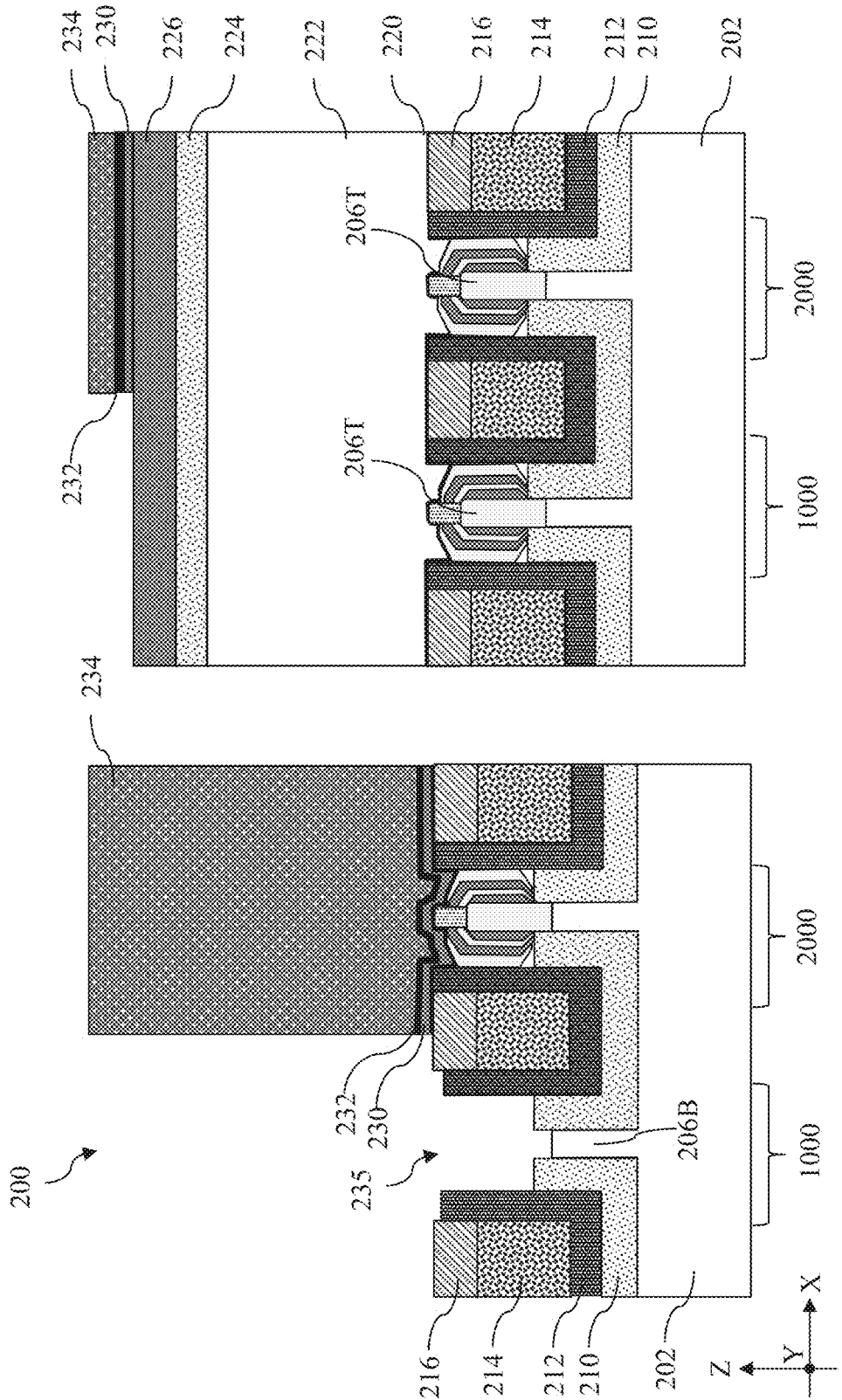
Figure 11E:
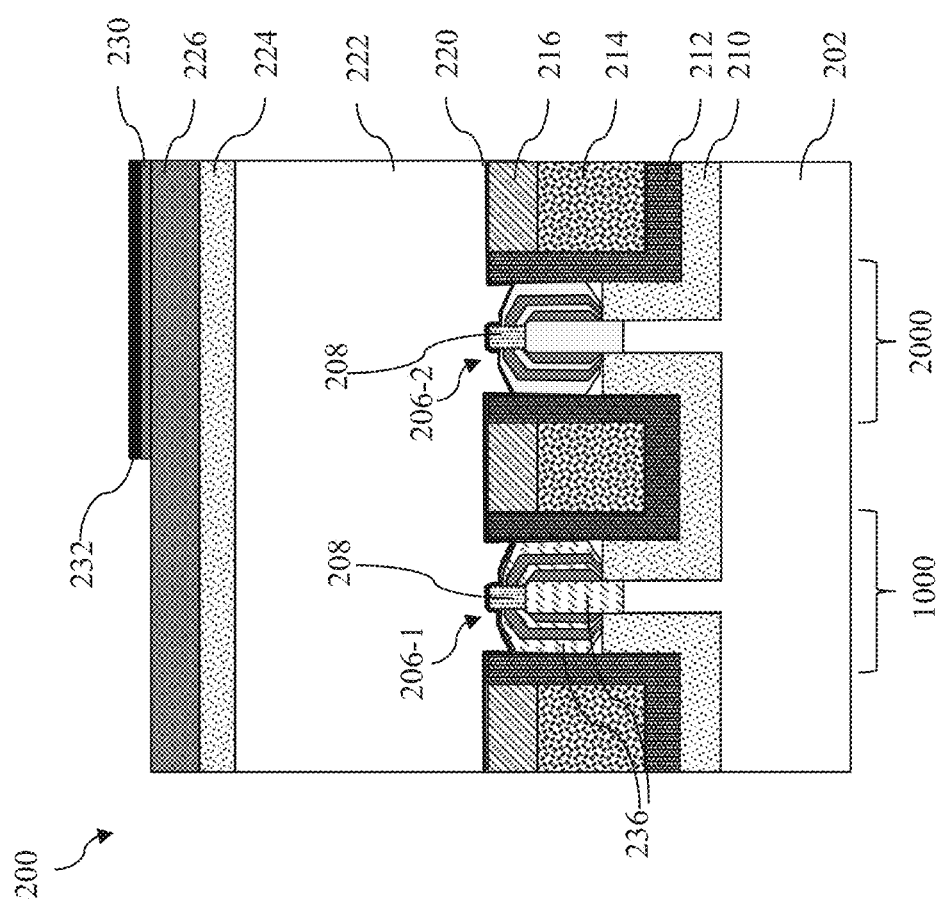

Referring to FIGS. 1 and 10A-10D, method 100 includes a block 116 where the source/drain regions of the first fin structure 206-1 in the first area 1000 is selectively recessed to form a first source/drain recess 235. In some embodiments, a photolithography process may be used to form the first source/drain recesses 235. In an example process, a first pattern film 232 and a first photoresist layer 234 may be deposited over the workpiece 200. The first pattern film 232 may be formed of silicon nitride or silicon oxycarbide. The first photoresist layer 234 is then patterned by exposure to a radiation source, post-exposure bake, and development in a developer solution. The patterned first photoresist layer 234 is then applied as an etch mask in an etch process to pattern the first pattern film 232. The patterned first pattern film 232 is then used as an etch mask in an etch process to expose source/drain regions 32 in the first area 1000. The portions of the first fin structures 206-1 that are not covered by the dummy gate stack 228 and the patterned first pattern film 232 are etched by a dry etch or a suitable etching process to form the first source/drain recess 235. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some embodiments represented in FIG. 10A, the semiconductor layers as well as the top portion 206T of the first fin structure 206-1 in the source/drain region 32 may be removed. Because of the height difference D between the top surface of the bottom portion 206B and the top surface of the first isolation feature 210, the removal of the top portion 206T result in a ditch defined by a top surface of the bottom portion 206B and two adjacent first isolation features 210. As illustrated in FIGS. 10C and 10D, the etch process at block 116 also etches back the gate spacer layer 230 over surfaces of the oxide gate top hard mask layer 226. Although not explicitly, the first photoresist layer 234 is then removed by ashing or a suitable process.

Referring to FIGS. 1, 11A, 11B, and 11E, method 100 includes a block 118 where inner spacer features 236 are formed in the first area 1000. In some embodiments, the second semiconductor layers 20 (including 20A, 20B and so forth) in the source/drain regions 32 of the area 1000 are selectively and partially recessed to form inner spacer recesses (now shown) while the first semiconductor layers 10 (including 10A, 10B and so forth) remain substantially unetched. In an embodiment where the channel layers 10 consist essentially of Si and sacrificial layers 20 consist essentially of SiGe, the selective recess of the sacrificial layers 20 may include a SiGe oxidation process followed by a SiGe oxide removal. In those embodiments, the SiGe oxidation process may include use of ozone. Because the top portion 206T may be formed of the same semiconductor material of the second semiconductor layers 20, end surfaces of the top portions 206T are also partially etched to form the inner spacer recesses. In some embodiments, the selective recess of the second semiconductor layers 20 and the top portion 206T may be a selective isotropic etching process (e.g., a selective dry etching process or a selective wet etching process), and the extent of the recess is controlled by duration of the etching process. In some embodiments, the selective dry etching process may include use of one or more fluorine-based etchants, such as fluorine gas or hydrofluorocarbons. In some embodiments, the selective wet etching process may include a hydro fluoride (HF) or $NH_4OH$ etchant.

After the inner spacer recesses are formed, a spacer material layer is deposited by CVD, PECVD, LPCVD, ALD or other suitable method over the inner spacer recesses. The spacer material layer may be formed of metal oxides, silicon carbonitride, silicon oxide, silicon oxycarbonitride, silicon oxycarbide, or other low-k material. The metal oxides here may include aluminum oxide, zirconium oxide, tantalum oxide, yttrium oxide, titanium oxide, lanthanum oxide, or other suitable metal oxide. The deposited spacer material layer is then pulled back to form the inner spacer features 236, as illustrated in FIG. 11E. After the pull-back process, sidewalls of the first semiconductor layers 10 are exposed in the first source/drain recess 235. In some embodiments represented in FIG. 11A, the spacer material layer for the inner spacer features 236 may accumulate in the ditch (defined by a top surface of the bottom portion 206B and two adjacent first isolation features 210) and the pull-back process may not completely remove the spacer material layer deposited therein. In those embodiments, the inner spacer feature 236 is also formed over the top surface of the bottom portion 206B of the first fin structure 206-1. In some implementations illustrated in FIG. 11A, the pull-back process may also recess the second dielectric layer 212, thereby reducing its height along the Z direction. The spacer material layer may be formed to a thickness between about 4 nm and about 8 nm.

Referring to FIGS. 1 and 12A-12D, method 100 includes a block 120 where a first epitaxial feature 238 is deposited in the first area 1000. With the second area 2000 covered by the patterned first patterned film 232, the first epitaxial feature 238 is epitaxially formed in the source/drain regions 32 in the first area 1000. In some embodiments, the first epitaxial feature 238 is a p-type epitaxial feature and the first area 1000 is a p-type device area. Suitable epitaxial processes for block 120 include CVD deposition techniques (e.g., vapor-phase epitaxy (VPE) and/or ultra-high vacuum CVD (UHV-CVD)), molecular beam epitaxy (MBE), and/or other suitable processes. The epitaxial growth process may use gaseous and/or liquid precursors, which interact with the composition of the first semiconductor layers 10, such as the 10A and 10B. As shown in FIG. 12A, the deposition of first epitaxial feature 238 is confined by the second isolation features 211 along the X direction. Put differently, the first epitaxial feature 238 is sandwiched between two second isolation features 211. It is noted that due to the presence of the inner spacer feature 236 on top on the bottom portion 206B, the first epitaxial feature 238 may be spaced apart from the bottom portion 206B of the first fin structure 206-1. That means, at least in some embodiments of the present disclosure, the first epitaxial feature 238 is not in contact with the substrate 202 but is insulated therefrom. In some further embodiments, because the first epitaxial feature 238 does not substantially grow from dielectric surfaces of the inner spacer feature 236, a gap or void 239 may also be formed between the inner spacer feature 236 and the first epitaxial feature 238, further insulating the first epitaxial feature 238 from the substrate 202. The first epitaxial feature 238 is also shown in FIGS. 12C and 12D.

In various embodiments, the first epitaxial feature 238 may include Si, Ge, AlGaAs, SiGe, boron-doped SiGe, or other suitable material. The first epitaxial feature 238 may be in-situ doped during the epitaxial process by introducing doping species including p-type dopants, such as boron or $BF_2$, and/or other suitable dopants including combinations thereof. If the first epitaxial feature 238 is not in-situ doped, an implantation process (i.e., a junction implant process) is performed to dope the first epitaxial feature 238. In an exemplary embodiment, the first epitaxial feature 238 is formed of SiGeB. In some instances, at the conclusion of block 120, the first pattern film 232 may be selectively removed using a suitable etch process, such as a wet etch process involving a phosphoric acid solution. A second pattern film 240 (described below) may be deposited anew at block 122.

Figure 14B:
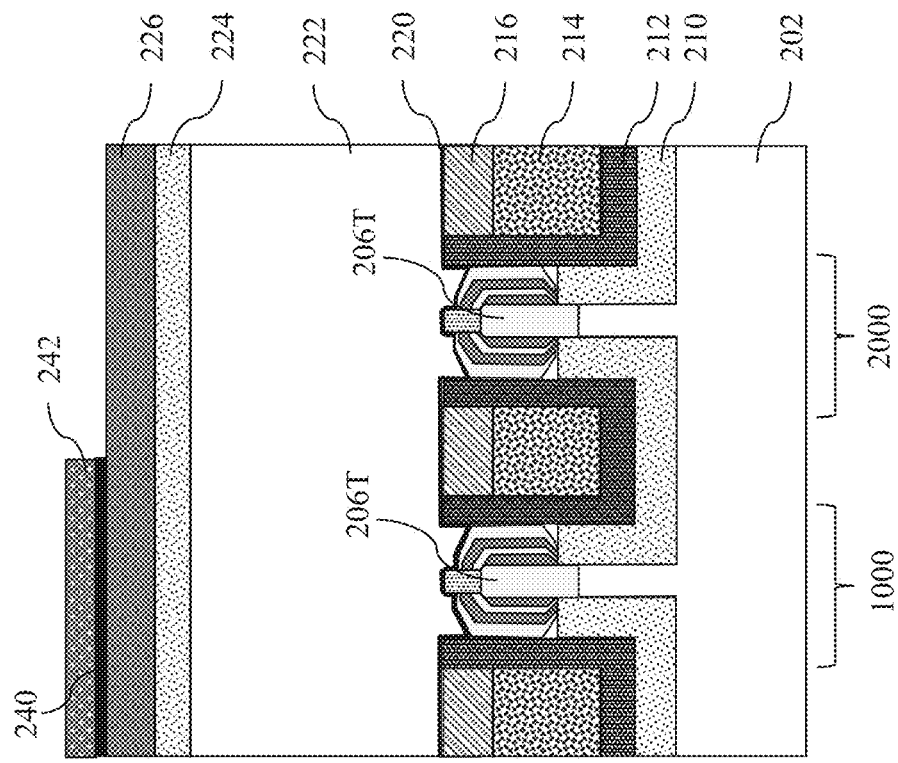
Figure 14A:
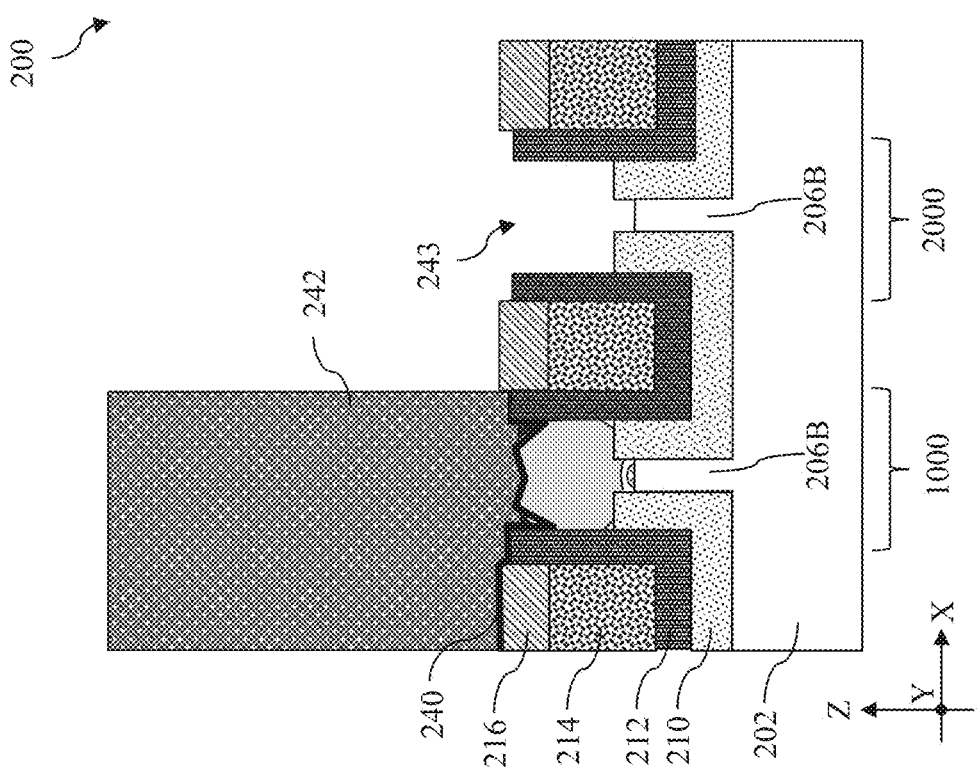

Referring to FIGS. 1, 13A-13D, and 14A-14D, method 100 includes a block 122 where the source/drain regions of the second fin structure 206-2 in the second area 2000 is selectively recessed. After the first epitaxial feature 238 is formed in the source/drain region 32 in the first area 1000, operations at block 122 form a second source/drain recess 243 in the second area 2000. Referring first to FIGS. 13A-13D, in an example process, a second pattern film 240 may be blanketly deposited over the workpiece 200. As formation and the composition of the second pattern film 240 may be similar to those of the first pattern film 232, detailed description of the second pattern film 240 is omitted for brevity. Referring now to FIGS. 14A-14D, a second photoresist layer 242 may be deposited over the workpiece 200 and patterned so as to pattern the second pattern film 240. As the deposition, composition, and patterning of the second photoresist layer 242 may be similar to those of the first photoresist layer 234, detailed description of the second photoresist layer 242 is omitted. With the patterned second photoresist layer 242 and the second pattern film 240 masking the first area 1000, the source/drain regions 32 of the second area 2000 are recessed to form a second source/drain recess 243. Similar to the first source/drain recess 235 shown in FIG. 10A, the second source/drain recess 243 in FIG. 14A share some similarities. For example, the top surface of the bottom portion 206B is lower than the top surfaces of the first isolation features 210, thereby defining a ditch. The second dielectric layer 212 may be pulled back and have a reduced height along the Z direction. As illustrated in FIGS. 14C and 14D, the source/drain regions 32 in the first area 1000 is protected by the patterned second photoresist layer 242 and second pattern film 240.

Referring to FIGS. 1, 15A, 15B, and 15E, method 100 includes a block 124 where inner spacer features 236 are formed in the second area 2000. After the second source/drain recess 243 is formed, sidewalls of the first semiconductor layers 10, the second semiconductor layers 20, and the top portion 206T are exposed. The exposed second semiconductor layers 20 (including 20A, 20B and so forth) and the top portion 206T are then partially and selectively etched to form inner spacer recesses. A spacer material layer is deposited over the workpiece 200, including over the inner spacer recesses, and then pulled back to form the inner spacer features 236 in the second area 2000. As shown in FIG. 15A, the inner spacer feature 236 is formed in the ditch defined by the top surface of the bottom portion 206B and two first isolation features 210. FIG. 15E illustrates that the inner spacer features 236 are formed on end surfaces of the second semiconductor layers 20 and the top portion 206T. FIG. 15E also shows that the pull-back process is performed such that the sidewalls of the channel layers 10 (i.e., first semiconductor layers 10) remain exposed. The second photoresist layer 242 may be removed by ashing or a suitable process.

Referring to FIGS. 1 and 16A-16D, method 100 includes a block 126 where a second epitaxial feature 244 is deposited in the second area 2000. With the first area 1000 covered by the patterned second pattern film 240, the second epitaxial feature 244 is epitaxially formed in the source/drain regions 32 in the second area 2000. In some embodiments, the second epitaxial feature 244 is an n-type epitaxial feature and the second area is an n-type device area. Suitable epitaxial processes for block 124 include CVD deposition techniques (e.g., vapor-phase epitaxy (VPE) and/or ultra-high vacuum CVD (UHV-CVD)), molecular beam epitaxy (MBE), and/or other suitable processes. The epitaxial growth process may use gaseous and/or liquid precursors, which interact with the composition of the first semiconductor layers 10, such as the 10A and 10B in the second area 2000. As shown in FIG. 16A, the deposition of second epitaxial feature 244 is confined by the second isolation features 211 along the X direction. Put differently, the second epitaxial feature 244 is sandwiched between two second isolation features 211. It is noted that due to the presence of the inner spacer feature 236 on top on the bottom portion 206B, the second epitaxial feature 244 may be spaced apart from the bottom portion 206B of the second fin structure 206-2. That means, at least in some embodiments of the present disclosure, the second epitaxial feature 244 is not in contact with the substrate 202 but is insulated therefrom. In some further embodiments, because the second epitaxial feature 244 does not substantially grow from dielectric surfaces of the inner spacer feature 236, a gap or void 239 may also be formed between the inner spacer feature 236 and the second epitaxial feature 244, further insulating the second epitaxial feature 244 from the substrate 202. The second epitaxial feature 244 is also shown in FIGS. 16C and 16D.

In various embodiments, the second epitaxial feature 244 may include Si, GaAs, GaAsP, SiP, or other suitable material. The second epitaxial feature 244 may be in-situ doped during the epitaxial process by introducing doping species including n-type dopants, such as phosphorus or arsenic; and/or other suitable dopants including combinations thereof. If the second epitaxial feature 244 is not in-situ doped, an implantation process (i.e., a junction implant process) is performed to dope the second epitaxial feature 244. In an exemplary embodiment, the second epitaxial feature 244 is formed of SiP. Although not explicitly shown, at the end of block 124, the second pattern film 240 may be selectively removed using a suitable dry etch process or wet etch process. In some instances, a suitable wet etch process may include use of a phosphoric acid solution.

Referring to FIGS. 1 and 17A-17D, method 100 includes a block 128 where an etch stop layer (ESL) 246 and an interlayer dielectric (ILD) layer 248 are deposited over the workpiece 200. Before the dummy gate stack 228 is removed from the workpiece 200, an ESL 246 and an ILD layer 248 may be sequentially deposited over the workpiece 200. In some examples, the ESL 246 includes a silicon nitride layer, a silicon oxide layer, a silicon oxynitride layer, and/or other materials known in the art. The ESL 246 may be formed by ALD, plasma-enhanced chemical vapor deposition (PECVD) process and/or other suitable deposition or oxidation processes. Thereafter, the ILD layer 248 is deposited over the ESL 246. In some embodiments, the ILD layer 248 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 248 may be deposited by a PECVD process or other suitable deposition technique. In some embodiments, after formation of the ILD layer 248, the workpiece 200 may be annealed to improve integrity of the ILD layer 248. While not explicitly shown in FIGS. 17A-17D, a planarization process, such as a CMP process, may be performed to remove excess ESL 246, ILD layer 248, the nitride gate top hard mask layer 224, and the oxide gate top hard mask layer 226 over the dummy gate electrode layer 222 to expose a top surface of the dummy gate electrode layer 222.

Figures 17C, 17D:
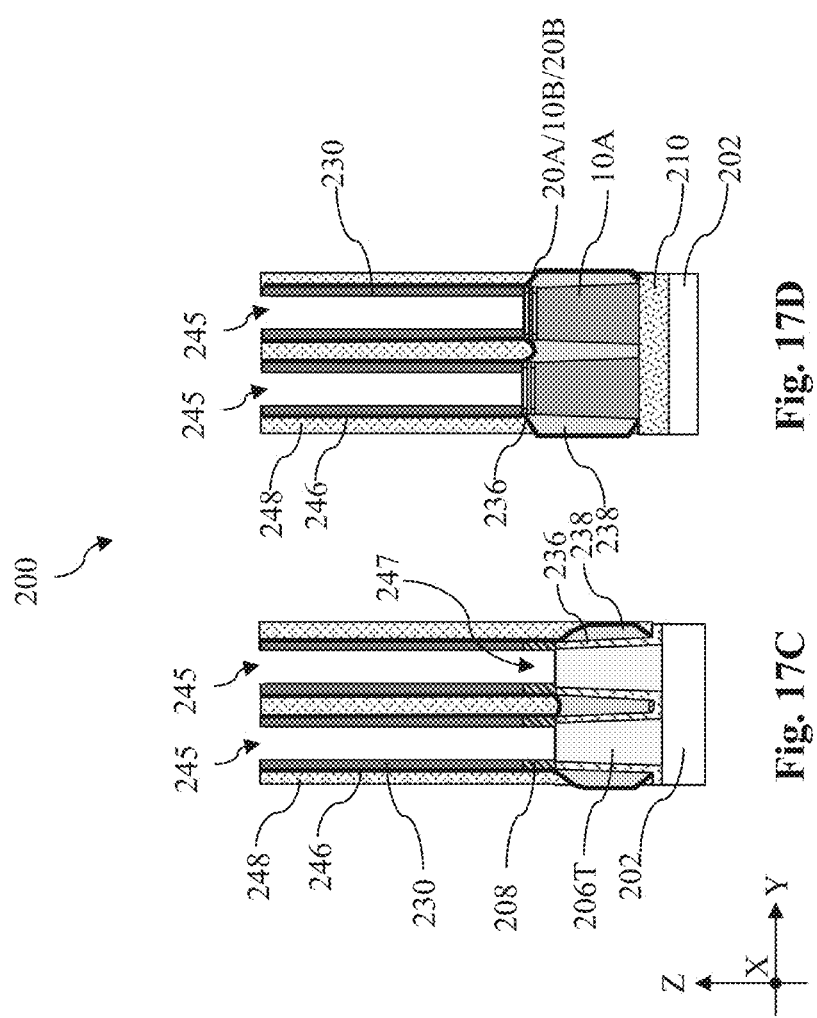

Referring to FIGS. 1 and 17A-17D, method 100 includes a block 130 where the dummy gate stack 228 is removed to form a gate trench 245. After the planarization exposes the top surface of the dummy gate electrode layer 222, the dummy gate electrode layer 222 and the dummy dielectric layer 220 are selectively removed, thereby forming the gate trench 245. In some embodiments, because the dummy gate electrode layer 222 and the dummy dielectric layer 220 are formed of different materials, two different etch processes may be used to form the gate trench 245. After the fin top hard mask features 208 are exposed in the gate trench 245, a separate etch process may be performed to selectively remove the fin top hard mask features 208 to expose surfaces of the second semiconductor layers that were protected by the fin top hard mask features 208. In the embodiment depicted in FIG. 17B, the second semiconductor layer 20A and the top portion 206T are exposed after the removal of the fin top hard mask feature 208. The removal of the fin top hard mask feature 208 forms an access opening 247. The gate trench 245 and the access opening 247 are also illustrated in FIGS. 17C and 17D. Right through the middle of the fin structures (206-1 or 206-2), the gate trench 245, together with the access opening 247, provides access to the top portion 206T, which is formed of the same material as the sacrificial layers 20.

Figures 18A, 18B:
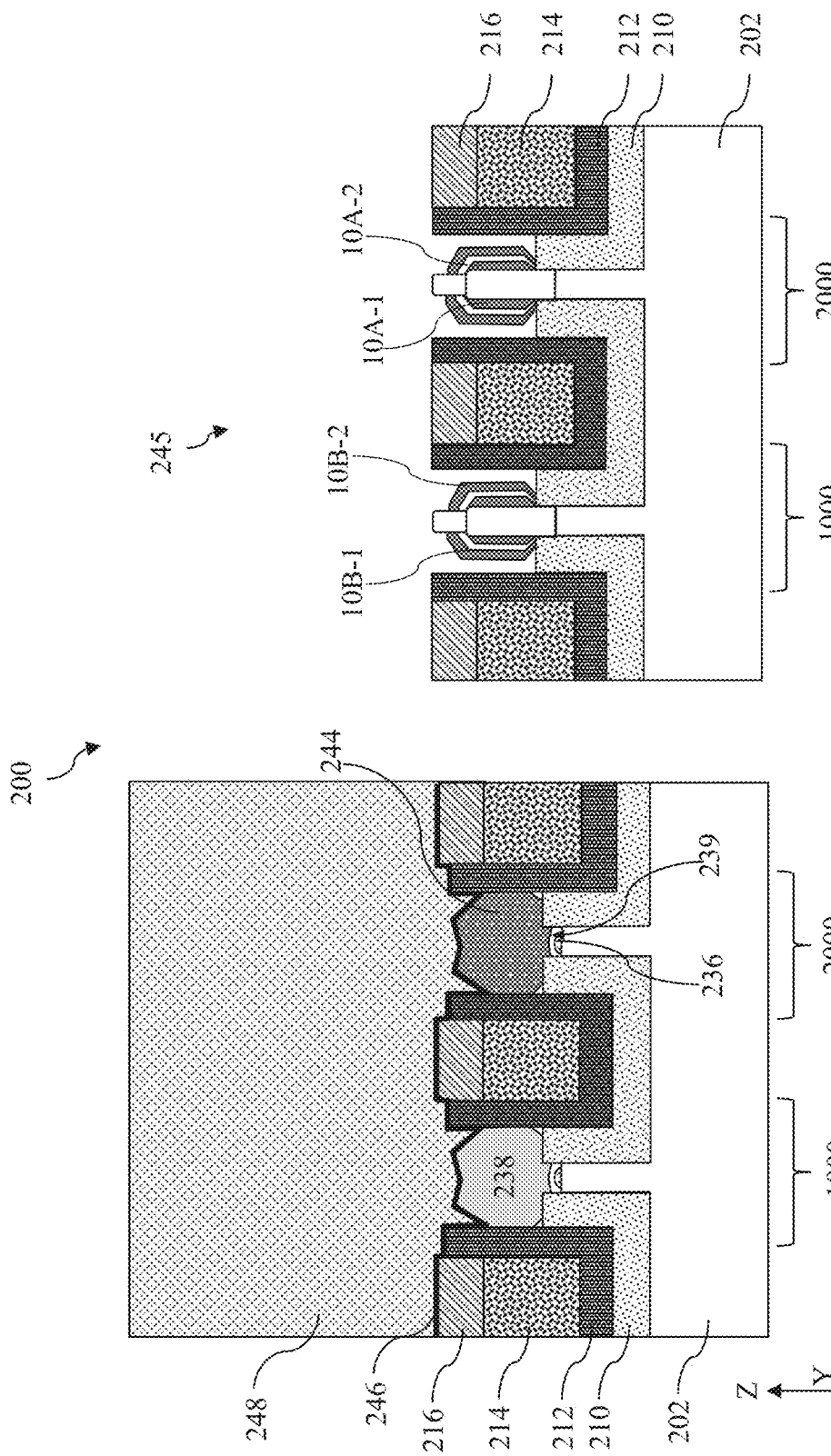

Referring to FIGS. 1 and 18A-18D, method 100 includes a block 132 where the second semiconductor layers 20 (including 20A and 20B) and the top portions (206T) are selectively removed. With the gate trench 245 and the access opening 247 providing access, block 132 includes operations to selectively remove the sacrificial layers 20 between the channel layers 10 in the channel regions 30 as well as the top portion 206T. Because the removal of the top portion 206T releases the first semiconductor layers 10A shown in FIG. 18B, the top portion 206T may be regarded as a sacrificial feature or layer as well. As shown in FIG. 18B, because the channel layers 10A and 10B are formed on sidewalls of the removed top portion 206T, the channel layers 10A and 10B extend between two epitaxial features (the first epitaxial feature 238 in the first area 1000 or the second epitaxial feature 244 in the second area 2000) along the Y direction and are disposed over the first isolation features 210. That is, the channel layers 10A and 10B are not directly over the bottom portion 206B along the Z direction. In some embodiments represented in FIG. 18, the channel layers 10A and 10B become four channel members 10A-1, 10A-2, 10B-1, and 10B-2 arranged along the X direction. Channel members 10A-1 and 10A-2 find their origins in the first semiconductor layer 10A and channel members 10B-1 and 10B-2 find their origins in the first semiconductor layer 10B. When the substrate 202 has a top surface on the (001) crystal surface, the top portions 206T have sidewalls on the (110) crystal surface. Because the first semiconductor layers 10A and 10B are directly or indirectly from the (110) crystal surface of the top portion 206T, the sidewalls (along the Y-Z plane and normal to the X direction) of the channel members 10A-1, 10A-2, 10B-1, and 10B-2 are also on the (110) crystal surface. Therefore, the primary surfaces or channel surfaces of the channel members 10A-1, 10A-2, 10B-1, and 10B-2 are on the (110) crystal surface. As described above, the (110) crystal surface is conducive to good hole mobility and is also an acceptable crystal plane for electron mobility. It follows that the semiconductor device 200 of the present disclosure may have improved performance and speed.

The selective removal of the sacrificial layers 20 and the top portion 206T may be implemented by selective dry etch, selective wet etch, or other selective etch processes. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by ozone clean and then SiGeOx removed by an etchant such as $NH_4OH$. As shown in FIG. 18C, at block 132, the top portion 206T is substantially removed from the channel regions 30. FIG. 18D illustrates that, in some embodiments, the removal of the top portion 206 may extend the gate trench 245 into a space 250 that is vertically below at least one the channel members, such as channel members 10A-1 and 10A-2. Put differently, the gate trench 245 may extend between two first isolation features 210. Dimensionally, the space 250 may have a depth (along the Z direction) that corresponds to the height difference D between the top surface of the bottom portion 206B and the top surfaces of the first isolation features 210. The space 250 may have a length (along the Y direction) that corresponds to a length of the dummy gate stack 228 (along the Y direction).

Referring to FIGS. 1 and 19A-19D, method 100 includes a block 134 where a gate structure 252 is formed in the gate trench 245. In some embodiments, the gate structure 252 may include an interfacial layer, a high-K gate dielectric layer formed over the interfacial layer, and/or a gate electrode layer formed over the high-K gate dielectric layer. In some embodiments, the interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer may include a high-K dielectric layer such as hafnium oxide. Alternatively, the high-K gate dielectric layer may include other high-K dielectrics, such as $TiO_2$, $HfZrO$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods.

The gate electrode layer may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer may be formed by ALD, PVD, CVD, e-beam evaporation, or other suitable process. Further, the gate electrode layer may be formed separately for n-type and p-type transistors which may use different metal layers (e.g., for providing different n-type and p-type work functions). In various embodiments, a CMP process may be performed to remove excessive metal from the gate electrode layer of the gate structure 252, and thereby provide a substantially planar top surface of the gate structure 252.

As shown in FIGS. 19A and 19B, upon formation of the gate structure 252, a first transistor 270 and a second transistor 280 are substantially formed. In the illustrated embodiment, the first transistor 270 is a p-type MBCFET and the second transistor 280 is an n-type MBCFET. Each of the first transistor 270 and the second transistor 280 has four channel members 10A-1, 10A-2, 10B-1, and 10B-1 that are wrapped around by the gate structure 252. The first transistor 270 and the second transistor 280 are divided by at least one second isolation feature 211. As shown in FIGS. 19B and 19D, at least a portion of the gate structure 252 extends between two first isolation features 210. In some embodiments represented in FIG. 19A, the first epitaxial feature 238 and the second epitaxial feature 244 are spaced apart from the substrate 202 (or the bottom portion 206B) by both the inner spacer feature 236 and the air gap 239. Each of the four channel members 10A-1, 10A-2, 10B-1, and 10B-1 of the first transistor 270 and the second transistor 280 generally assumes a nanosheet shape having a largest primary surface on the Y-Z plane and a thickness generally along the X direction. That said, the four channel members 10A-1, 10A-2, 10B-1, and 10B-1 may bend into one another toward their top ends away from the first isolation features 210 and toward their bottom ends adjacent the first isolation features 210. Put differently, the top ends of the four channel members 10A-1, 10A-2, 10B-1, and 10B-1 bend away from the first isolation features 210.

Besides method 100, the present disclosure also provides an alternative method 300.

Figure 21:
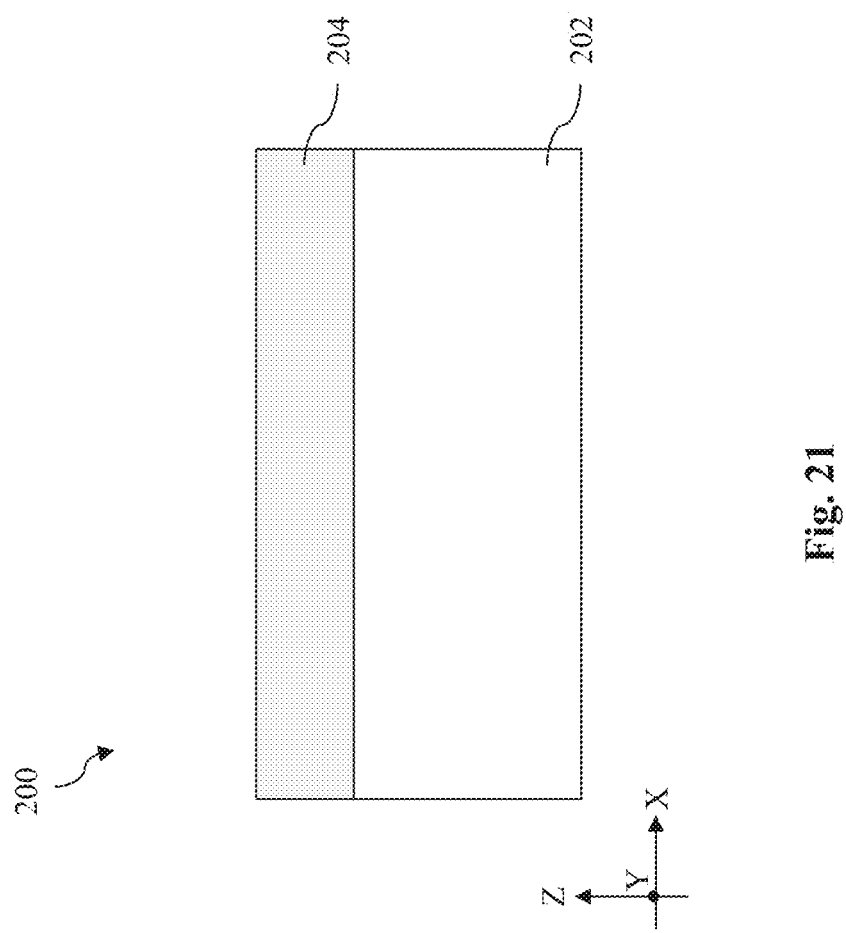

Referring to FIGS. 20 and 21, method 300 includes a block 302 where a mandrel layer 204 is formed on a substrate 202 of a workpiece 200. Because operations at block 302 are substantially similar to those at block 102 of method 100, detailed description of block 302 is omitted for brevity.

Figure 22:
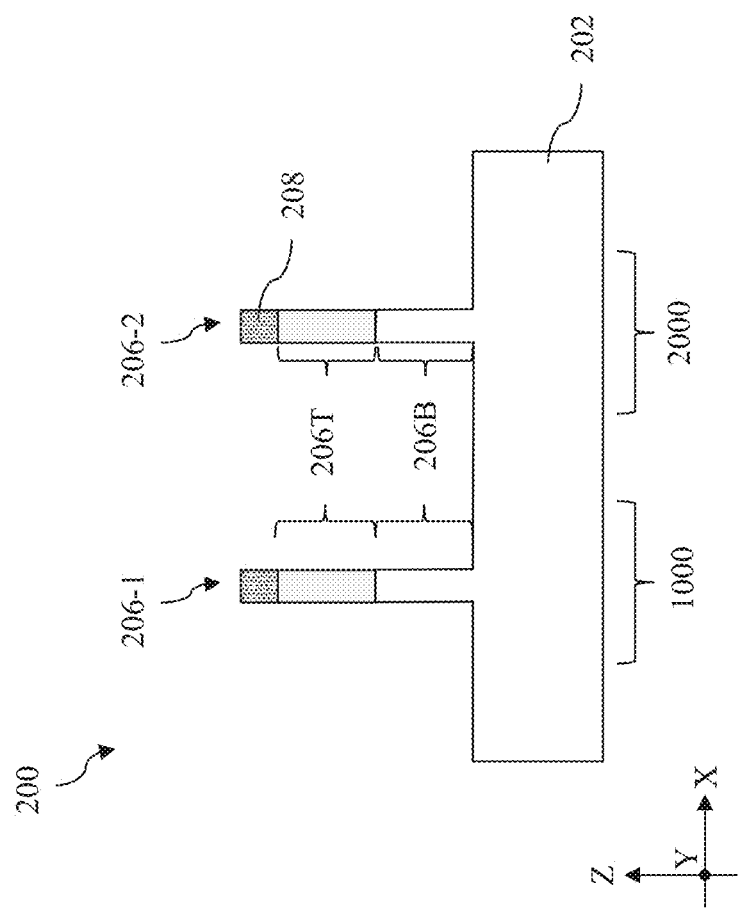

Referring to FIGS. 20 and 22, method 300 includes a block 304 where a first fin structure 206-1 is formed in a first area 1000 of the workpiece 200 and a second fin structure 206-2 is formed in a second area 2000 of the workpiece 200. Because operations at block 304 are substantially similar to those at block 104 of method 100, detailed description of block 304 is omitted for brevity.

Figure 23:
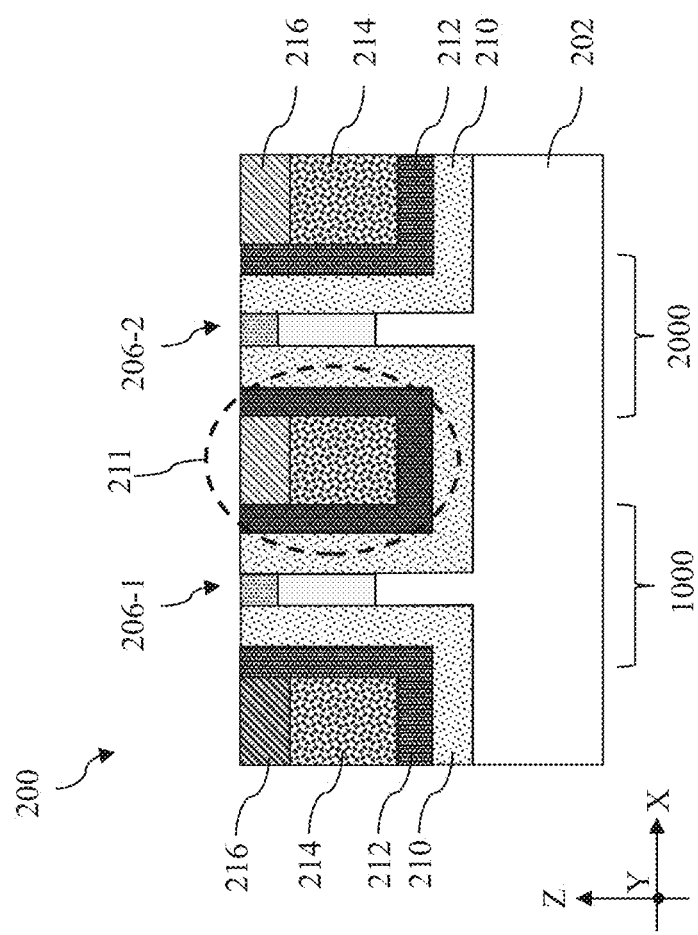

Referring to FIGS. 20 and 23, method 300 includes a block 306 where a first isolation feature 210 and a second isolation feature 211 are formed over the workpiece 200. Because operations at block 306 are substantially similar to those at block 106 of method 100, detailed description of block 306 is omitted for brevity.

Figure 24:
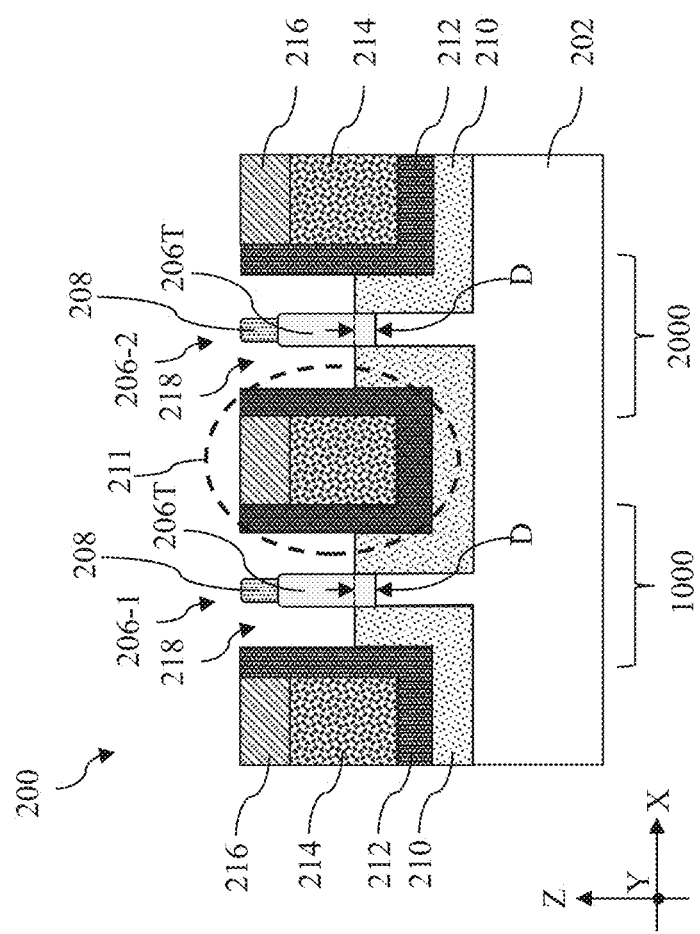

Referring to FIGS. 20 and 24, method 300 includes a block 308 where the first isolation feature 210 is recessed to expose top portions 206T of the first fin structure 206-1 and the second fin structure 206-2. Because operations at block 308 are substantially similar to those at block 108 of method 100, detailed description of block 308 is omitted for brevity.

Figure 25:
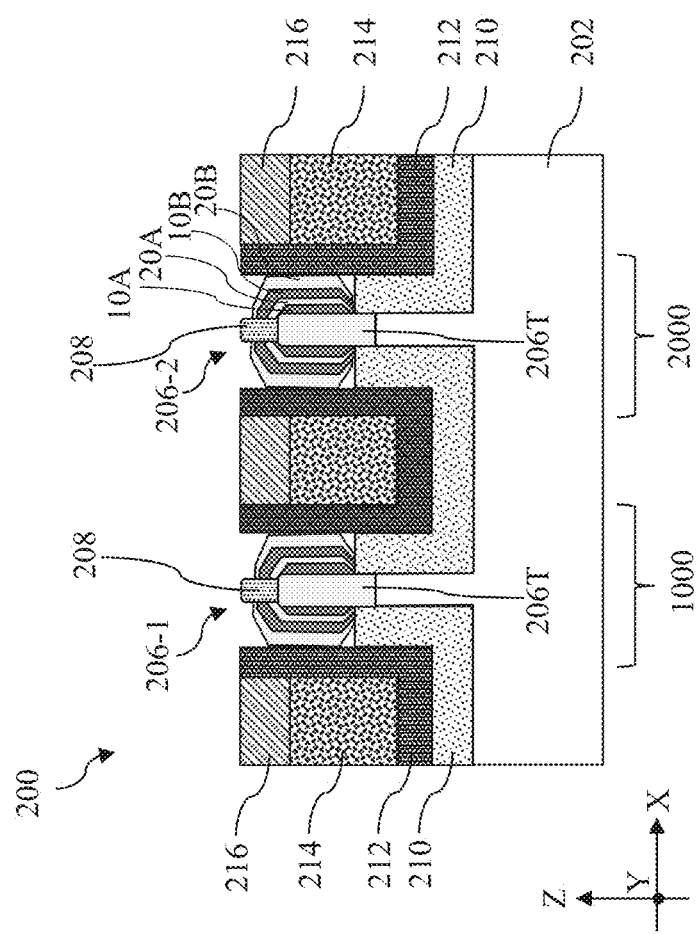

Referring to FIGS. 20 and 25, method 300 includes a block 310 where at least one first semiconductor layer 10 (including 10A, 10B, and so forth) and at least one second semiconductor layer 20 (including 20A, 20B, and so forth) are formed on sidewalls of the top portions 206T of the first fin structure 206-1 and the second fin structure 206-2. Because operations at block 310 are substantially similar to those at block 110 of method 100, detailed description of block 310 is omitted for brevity.

Figure 26:
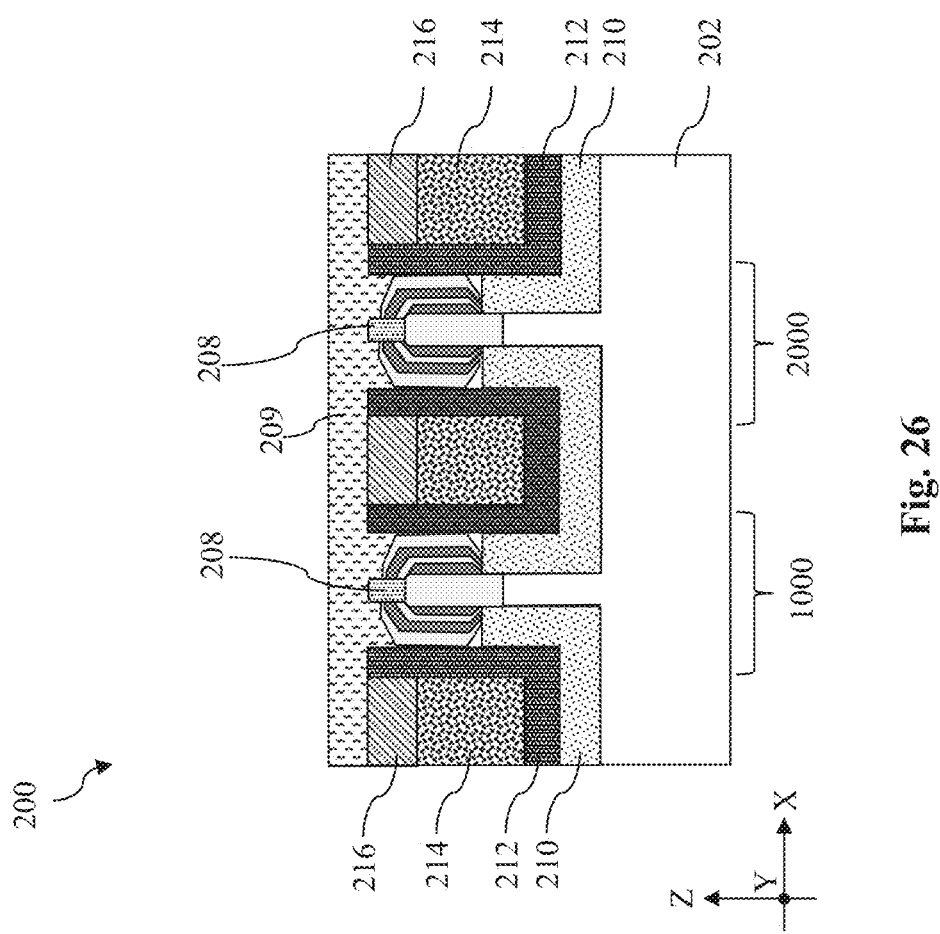
Figure 27:
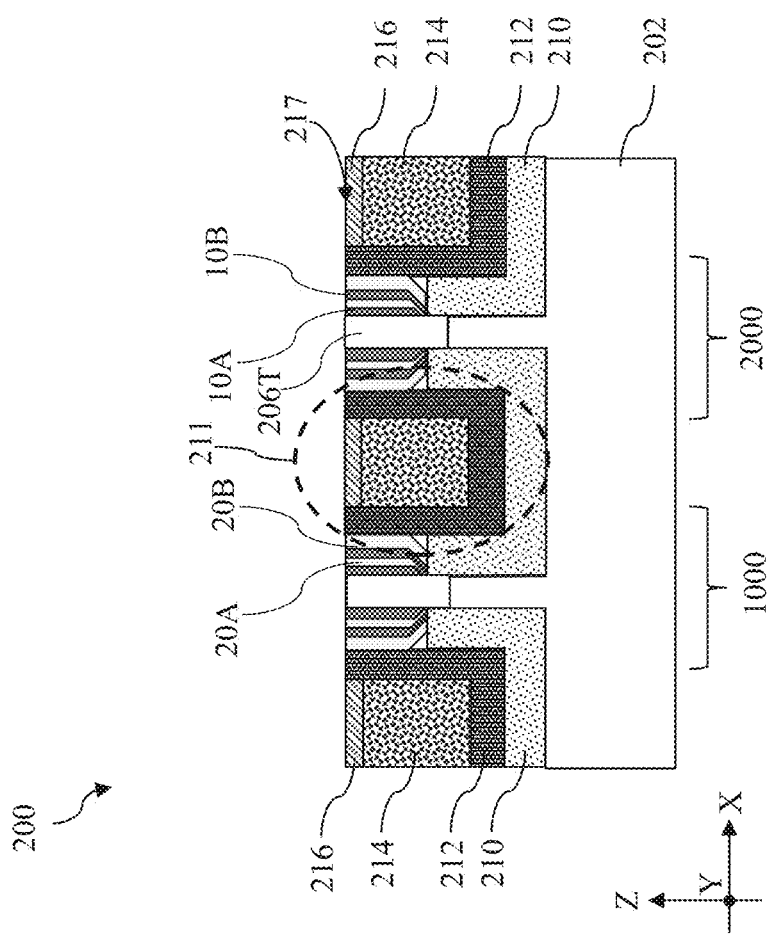

Referring to FIGS. 20, 26 and 27, method 300 includes a block 311 where the first semiconductor layers 10 and the second semiconductor layers 20 are planarized to form a planar top surface 217. Reference is first made to FIG. 26. After the first semiconductor layers 10 and the second semiconductor layers 20 are formed at block 310, a planarization layer 209 is blanketly deposited over the workpiece 200. In some embodiments, the planarization layer 209 is formed of a dense dielectric material with low porosity. In these embodiments, the planarization layer 209 may be formed of silicon oxide deposited using high density plasma CVD (HDPCVD). The dense property of the planarization layer 209 helps prevent dishing during a subsequent planarization process illustrated in FIG. 27. As illustrated in FIG. 27, a planarization process, such as a CMP process, is performed to provide the planar top surface 217. The planarization process removes the planarization layer 209 and the fin top hard mask features 208, as well as top portions of the helmet layer 216, the second dielectric layer 212, the first semiconductor layers 10, the second semiconductor layers 20. It can be seen from FIG. 27 that operations at block 311 set method 300 apart from method 100. The planar top surface 217 allow direct access to each of the first semiconductor layers 10 and the second semiconductor layers 20. Before the planarization, as shown in the FIG. 26, top portions of the first semiconductor layers 10 and the second semiconductor layers 20 bend or taper toward the fin top hard mask features 208. After the planarization process, top portions of the first semiconductor layers 10 and the second semiconductor layers 20 extend along the Y-Z plane and are substantially parallel to one another.

Figure 28:
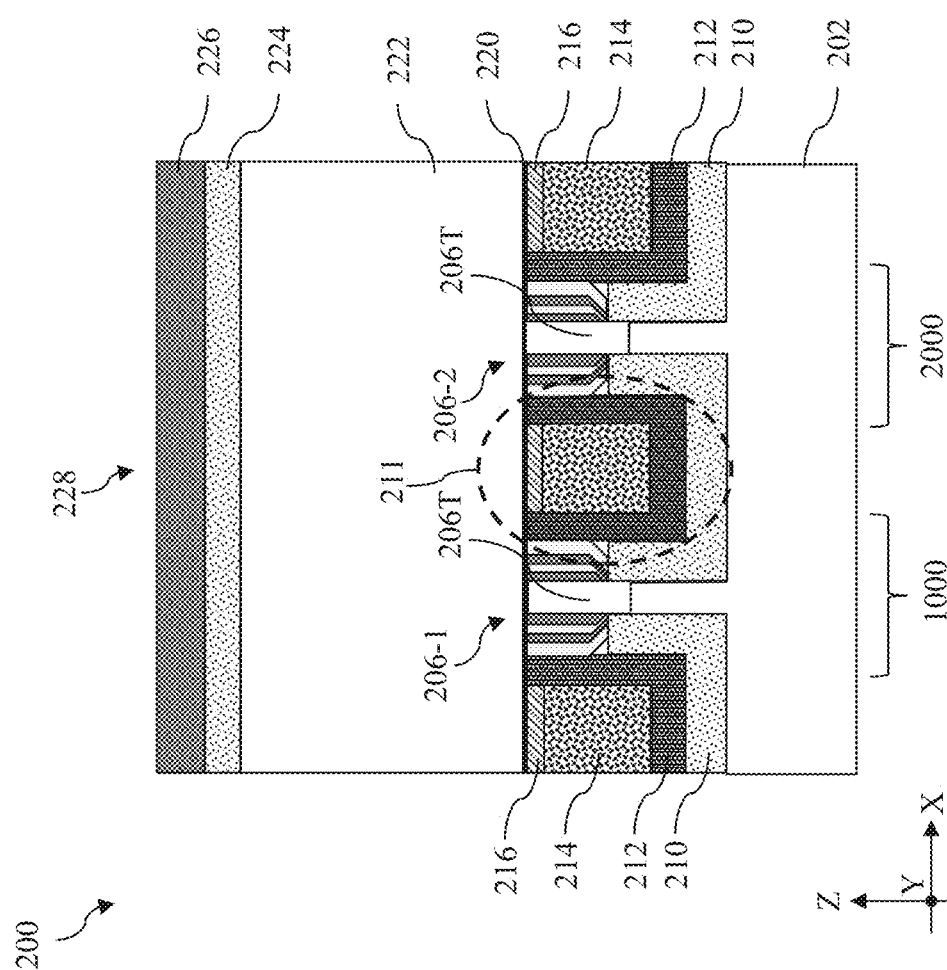

Referring to FIGS. 20 and 28, method 300 includes a block 312 where a dummy gate stack 228 is formed over channel regions of the first fin structure 206-1 and the second fin structure 206-2. Because operations at block 312 are substantially similar to those at block 112 of method 100, detailed description of block 312 is omitted for brevity. As shown in FIG. 28, at block 312, the dummy dielectric layer 220 is formed on the planar top surface 217 (shown in FIG. 27).

Figure 29:
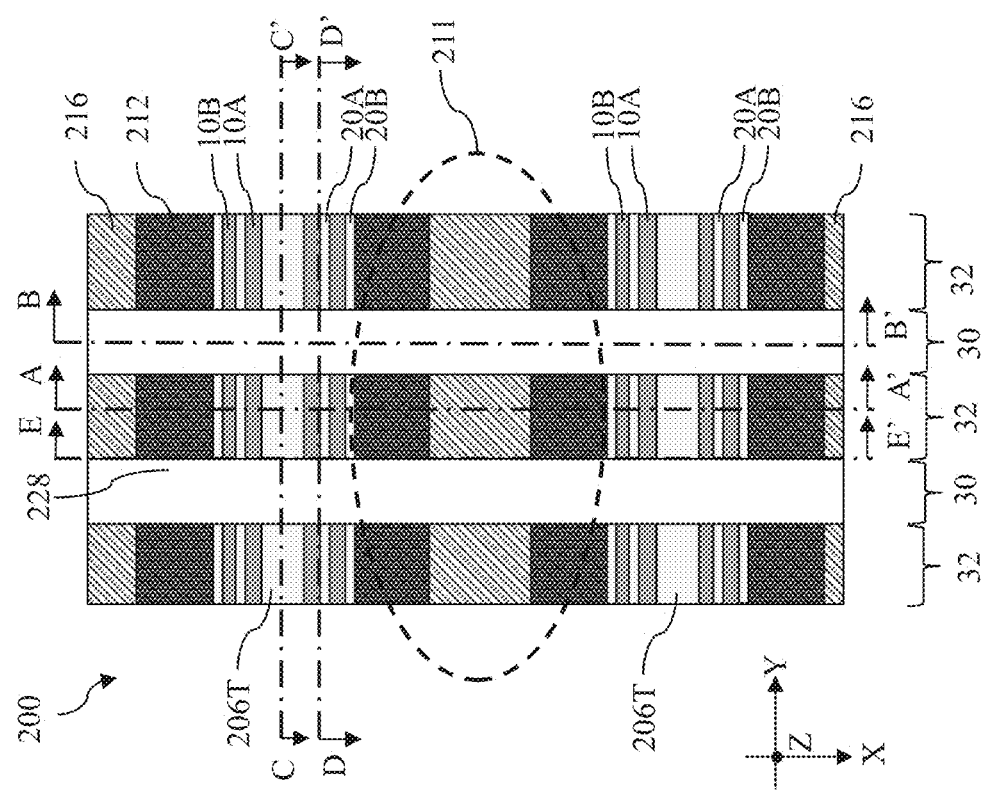
Figures 34A, 34B:
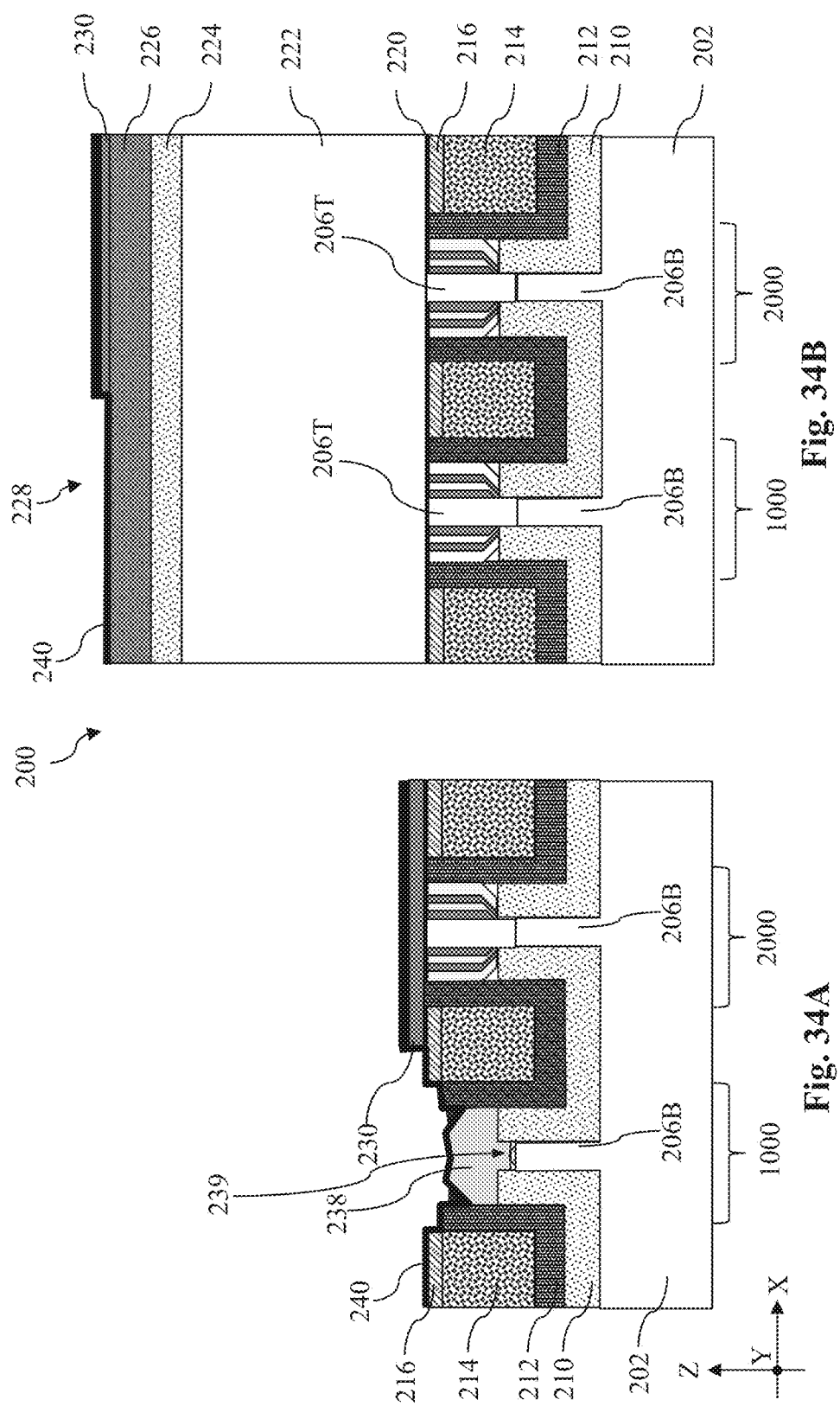
Figure 36E:
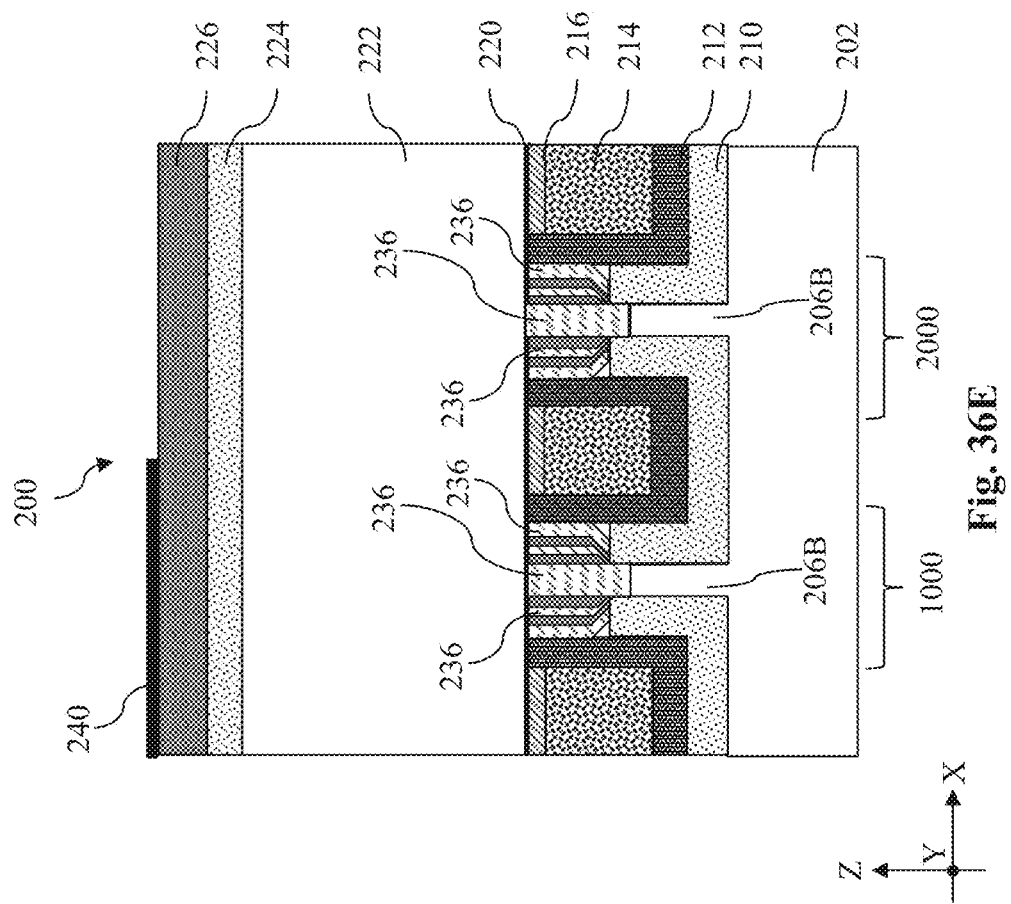
Figures 38A, 38B:
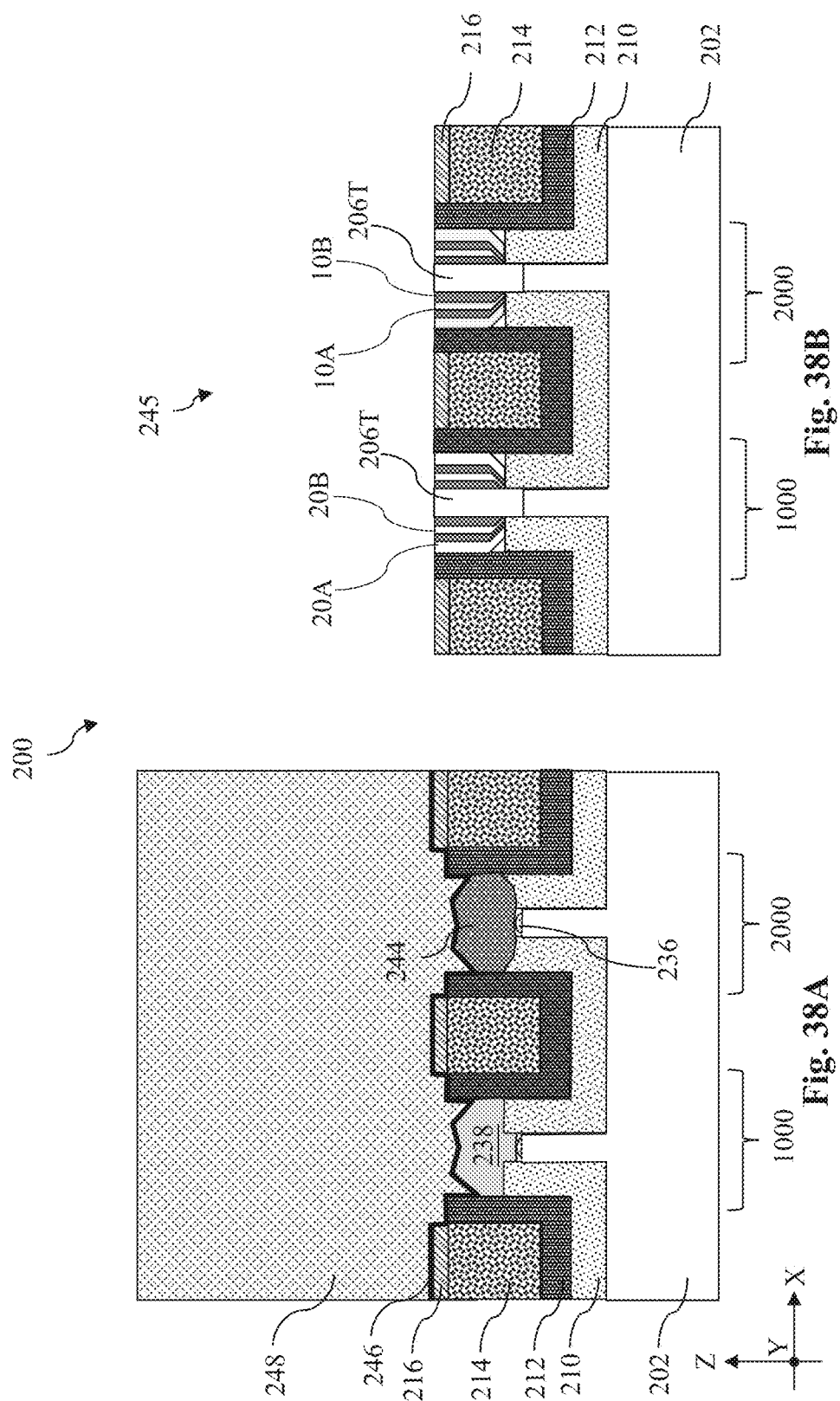

FIG. 29 is a fragmentary top view of the workpiece 200 after the dummy gate stack 228 is formed at block 312. In FIG. 29, the dummy gate stacks 228 extend lengthwise along the X direction, the fin structures (not explicitly shown) under the fin top hard mask features 208 extend lengthwise along the Y direction, and the second isolation feature 211 also extends lengthwise along the Y direction. Also shown in FIG. 29 are five cross-sections—AA', BB', CC', DD' and EE'. The cross-section AA' cuts along the X direction in a source/drain region 32. The cross-section BB' cuts along the X direction in a channel region 32 covered by the dummy gate stack 228. The cross-section CC' cuts along the Y direction right through the middle of a fin structure, such as the first fin structure 206-1 or the second fin structure 206-2. The cross-section DD' cuts along the Y direction right through one of the first semiconductor layers (e.g. 10A or 10B shown in FIG. 27). The cross-section EE' cuts along the Y direction right at the interface of a source/drain region 32 and a channel region 30. In the following figures, a figure ending with A, such as any of FIGS. 30A-40A, illustrates a fragmentary cross-sectional view along the AA' cross-section; a figure ending with B, such as any of FIGS. 30B-40B, illustrates a fragmentary cross-sectional view along the BB' cross-section; a figure ending with C, such as any of FIGS. 30C, 31C, 33C, 34C, 35C, 37C, 38C, 39C, and 40C, illustrates a fragmentary cross-sectional view along the CC' cross-section; a figure ending with D, such as any of FIGS. 30D, 31D, 33D, 34D, 35D, 37D, 38D, 39D, and 40D illustrates a fragmentary cross-sectional view along the DD' cross-section; and a figure ending with E, such as any of FIGS. 32E and 36E, illustrates a fragmentary cross-sectional view along the EE' cross-section. Therefore, figures ending with A illustrate structures in the source/drain regions 32; figures ending with B illustrate structures in the channel regions 30; figures ending with C illustrate structures in the fin structures; figures ending with D illustrate structures in the channel layers/members; and figures ending with E illustrate features at the interface between a source/drain region 32 and a channel region 30, such as inner spacer features. The workpiece 200 in FIG. 29 is different from that in FIG. 8 in that the fin top hard mask features 208 are removed in FIG. 29 and top surfaces of the first semiconductor layers 10 and second semiconductor layers 20 are exposed in the top view in FIG. 29.

Referring to FIGS. 20 and 30A-30D, method 300 includes a block 314 where a gate spacer layer 230 is deposited over the dummy gate stack 228. Because operations at block 314 are substantially similar to those at block 114 of method 100, detailed description of block 314 is omitted for brevity. As shown in FIG. 30A, in the source/drain regions, the gate spacer layer 230 is deposited on the planar top surface 217 (shown in FIG. 27).

Referring to FIGS. 20 and 31A-31D, method 300 includes a block 316 where the source/drain regions of the first fin structure 206-1 in the first area 1000 is selectively recessed to form a first source/drain recess 235. Because operations at block 316 are substantially similar to those at block 116 of method 100, detailed description of block 316 is omitted for brevity.

Referring to FIGS. 20, 32A, 32B, and 32E, method 300 includes a block 318 where inner spacer features 236 are formed in the first area 1000. Because operations at block 318 are substantially similar to those at block 118 of method 100, detailed description of block 318 is omitted for brevity.

Referring to FIGS. 20 and 33A-33D, method 300 includes a block 320 where a first epitaxial feature 238 is deposited in the first area 1000. Because operations at block 320 are substantially similar to those at block 120 of method 100, detailed description of block 320 is omitted for brevity.

Referring to FIGS. 20, 34A-34D and 35A-35D, method 300 includes a block 322 where the source/drain regions of the second fin structure 206-2 in the second area 2000 is selectively recessed. Because operations at block 322 are substantially similar to those at block 122 of method 100, detailed description of block 322 is omitted for brevity.

Referring to FIGS. 20 and 36A-36D, method 100 includes a block 324 where inner spacer features 236 are formed in the second area 2000. Because operations at block 324 are substantially similar to those at block 124 of method 100, detailed description of block 324 is omitted for brevity.

Referring to FIGS. 20 and 37A-37D, method 300 includes a block 326 where a second epitaxial feature 244 is deposited in the second area 2000. Because operations at block 326 are substantially similar to those at block 126 of method 100, detailed description of block 326 is omitted for brevity.

Referring to FIGS. 20 and 38A-38D, method 300 includes a block 328 where an etch stop layer (ESL) 246 and an interlayer dielectric (ILD) layer 248 are deposited over the workpiece 200. Because operations at block 328 are substantially similar to those at block 128 of method 100, detailed description of block 328 is omitted for brevity.

Referring still to FIGS. 20 and 38A-38D, method 300 includes a block 330 where the dummy gate stack 228 is removed to form a gate trench 245. Because operations at block 330 are similar to those at block 130 of method 100 in several aspects, detailed description of block 330 is omitted for brevity. Different from operations at block 130, because the fin top hard mask features 208 have been removed at block 311, block 330 does not include any processes for removing the fin top hard mask features 208. It follows that block 330 does not include any operations for forming any opening that resembles the access opening 247 shown in FIGS. 17B and 17C. As shown in FIGS. 38A-38D, the gate trench 245 may expose the top surfaces of the first semiconductor layers 10 (including 10A and 10B) and the second semiconductor layers 20 (including 20A and 20B).

Referring to FIGS. 20 and 39A-39D, method 300 includes a block 332 where the second semiconductor layers 20 (including 20A and 20B) and the top portions 206T are selectively removed. With the gate trench 245 providing direct access to the channel layers 10 (including 10A and 10B) and the sacrificial layers 20 (including 20A and 20B), block 332 includes operations to selectively remove the sacrificial layers 20 between the channel layers 10 in the channel regions 30 as well as the top portion 206T. Because the removal of the top portion 206T releases the first semiconductor layers 10A shown in FIG. 39B, the top portion 206T may be regarded as a sacrificial feature or layer as well. As shown in FIG. 39B, because the channel layers 10A and 10B are formed on sidewalls of the removed top portion 206T, the channel layers 10A and 10B extend between two epitaxial features (the first epitaxial feature 238 in the first area 1000 or the second epitaxial feature 244 in the second area 2000) along the Y direction and are disposed over the first isolation features 210. That is, the channel layers 10A and 10B are not directly over the bottom portion 206B along the Z direction. In some embodiments represented in FIGS. 39A-39D, the channel layers 10A and 10B become four channel members 10A-3, 10A-4, 10B-3, and 10B-4 arranged along the X direction. Channel members 10A-3 and 10A-4 find their origins in the first semiconductor layer 10A and channel members 10B-3 and 10B-4 find their origins in the first semiconductor layer 10B. When the substrate 202 has a top surface on the (001) crystal surface, the top portions 206T have sidewalls on the (110) crystal surface. Because the first semiconductor layers 10A and 10B are directly or indirectly from the (110) crystal surface of the top portion 206T, the sidewalls (along the Y-Z plane and normal to the X direction) of the channel members 10A-3, 10A-4, 10B-3, and 10B-4 are also on the (110) crystal surface. Therefore, the primary surfaces or channel surfaces of the channel members 10A-3, 10A-4, 10B-3, and 10B-4 are on the (110) crystal surface. As described above, the (110) crystal surface is conducive to good hole mobility and is also an acceptable crystal plane for electron mobility. It follows that the semiconductor device 200 of the present disclosure may have improved performance and speed.

The selective removal of the sacrificial layers 20 and the top portion 206T may be implemented by a selective dry etch, a selective wet etch, or other selective etch processes. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by ozone clean and then SiGeOx removed by an etchant such as $NH_4OH$. As shown in FIG. 39C, at block 332, the top portion 206T is substantially removed from the channel regions 30. FIG. 39D illustrates that, in some embodiments, the removal of the top portion 206 may extend the gate trench 245 into a space 250 that is vertically below at least one the channel members, such as channel members 10A-3 and 10A-4. Put differently, the gate trench 245 may extend between two first isolation features 210. Dimensionally, the space 250 may have a depth (along the Z direction) that corresponds to the height difference D between the top surface of the bottom portion 206B and the top surfaces of the first isolation features 210. The space 250 may have a length (along the Y direction) that corresponds to a length of the dummy gate stack 228 (along the Y direction).

Referring to FIGS. 20 and 40A-40D, method 300 includes a block 334 where a gate structure 252 is formed in the gate trench 245. Because operations at block 334 are substantially similar to those at block 134 of method 100, detailed description of block 334 is omitted for brevity.

As shown in FIGS. 40A and 40B, upon formation of the gate structure 252, a third transistor 275 and a fourth transistor 285 are substantially formed. In the illustrated embodiment, the third transistor 275 is a p-type MBCFET and the fourth transistor 285 is an n-type MBCFET. Each of the third transistor 272 and the fourth transistor 285 has four channel members 10A-3, 10A-4, 10B-3, and 10B-4 that are wrapped around by the gate structure 252. The third transistor 272 and the fourth transistor 285 are divided by at least one second isolation feature 211. As shown in FIGS. 40B and 40D, at least a portion of the gate structure 252 extends between two first isolation features 210. In some embodiments represented in FIG. 20A, the first epitaxial feature 238 and the second epitaxial feature 244 are spaced apart from the substrate 202 (or the bottom portion 206B) by both the inner spacer feature 236 and the air gap 239. Each of the four channel members 10A-3, 10A-4, 10B-3, and 10B-4 of the third transistor 275 and the fourth transistor 285 generally assumes a nanosheet shape having a largest primary surface on the Y-Z plane and a thickness generally along the X direction. As the planarization process at block 311 substantially removes the inward-bending top portions of the first semiconductor layers 10 and second semiconductor layers 20, the top portions of the four channel members 10A-3, 10A-4, 10B-3, and 10B-4 do not bend into one another toward but extend parallel to one another on the Y-Z plane.

Although not intended to be limiting, one or more embodiments of the present disclosure provide benefits to a semiconductor device and the formation thereof. Example methods of the present disclosure form a fin structure that includes a top portion formed of a mandrel layer and a bottom portion formed from a (001) silicon substrate. First and second semiconductor layers are then alternatingly and epitaxially grown on sidewalls of the top portion. After selective removal of the second semiconductor layer and the top portion, which may be formed of the same material, the first semiconductor layers are released as channel members with primary surfaces on the (110) crystal surface. Because the (110) crystal surface provides good hole mobility and acceptable electron mobility, the performance and speed of the resulting semiconductor device may be improved.

In one exemplary aspect, the present disclosure is directed to a semiconductor device. The semiconductor device includes a first isolation feature and a second isolation feature, a fin structure extending lengthwise along a first direction and sandwiched between the first isolation feature and the second isolation feature along a second direction perpendicular to the first direction, a first channel member disposed over the first isolation feature, a second channel member disposed over the second isolation feature, and a gate structure disposed over and wrapping around the first channel member and the second channel member.

In some embodiments, a portion of the gate structure is disposed between the first isolation feature and the second isolation feature. In some implementations, the semiconductor device may further include a first source/drain feature and a second source/drain feature. The first channel member and the second channel member extend between the first source/drain feature and the second source/drain feature long the first direction. In some instances, the semiconductor device may further include a dielectric feature disposed over the fin structure and each of the first source/drain feature and the second source/drain feature is spaced apart from the fin structure by the dielectric feature. In some embodiments, the semiconductor device may further include a first hybrid fin and a second hybrid fin. The first source/drain feature and the second source/drain feature are disposed between the first hybrid fin and a second hybrid fin along the second direction. In some instances, each of the first hybrid fin and the second hybrid fin includes an inner dielectric fin structure including a low-k dielectric feature and a high-k dielectric feature directly on the low-k dielectric feature, and a liner disposed on sidewalls and a bottom surface of the inner dielectric fin structure. In some embodiments, the first channel member includes silicon, the first channel member includes a sidewall, and the sidewall includes (110) crystal surface of silicon. In some embodiments, the first channel member and the second channel member bend toward each other as the first channel member and the second channel member extend away from the first isolation feature and the second isolation feature, respectively.

In another exemplary aspect, the present disclosure is directed to a semiconductor device. The semiconductor device includes a first source/drain feature and a second source/drain feature, a plurality of channel members extending between the first source/drain feature and the second source/drain feature along a first direction, a gate structure disposed over and wrapping around the plurality of channel members, and a first isolation feature and a second isolation feature directly below the plurality of channel members. A portion of the gate structure is disposed between the first isolation feature and the second isolation feature.

In some embodiments, the plurality of channel members include an even number of channel members. In some implementations, the semiconductor device may further include a fin structure arising from a substrate and disposed between the first isolation feature and the second isolation feature along a second direction perpendicular to the first direction. Top surfaces of the first isolation feature and the second isolation feature are further away from the substrate than a top surface of the fin structure. In some implementations, the semiconductor device may further include a dielectric feature disposed over the fin structure and each of the first source/drain feature and the second source/drain feature is spaced apart from the fin structure by the dielectric feature. In some embodiments, the semiconductor device may further include an air gap between the dielectric feature and the first source/drain feature. In some instances, the plurality of channel members include silicon, each of the plurality of channel members includes a sidewall, and the sidewall includes (110) crystal surface of silicon. In some embodiments, the plurality of channel members include two outermost channel members that bend toward each other as the two outermost channel members extend away from the first isolation feature and the second isolation feature, respectively.

In yet another exemplary aspect, the present disclosure is directed to a method. The method includes depositing a mandrel layer over a substrate, forming a fin structure that includes a top portion formed from the mandrel layer, a bottom portion formed from the substrate, and a hard mask feature over the top portion, conformally depositing an isolation layer over the fin structure, recessing the isolation layer to expose sidewalls of the top portion of the fin structure, epitaxially depositing a first semiconductor layer over the exposed sidewalls of the top portion, epitaxially depositing a second semiconductor layer over the first semiconductor layer, forming a dummy gate stack over a channel region of the fin structure, recessing a source/drain region of the fin structure to form a source/drain recess, forming a source/drain feature in the source/drain recess, depositing a dielectric layer over the source/drain feature, planarizing the dielectric layer to expose the dummy gate stack, selectively removing the dummy gate stack, selectively removing the second semiconductor layer and the top portion of the fin structure, and depositing a gate structure over the first semiconductor layer.

In some embodiments, the selectively removing of the dummy gate stack exposes the hard mask feature. In some implementations, the method may further include prior to the selectively removing of the second semiconductor layer and the top portion of the fin structure, selectively removing the hard mask feature to expose the top portion of the fin structure. In some embodiments, the method may further include depositing a material layer over the second semiconductor layer, and planarizing the first semiconductor layer, the second semiconductor layer, and the hard mask feature until the hard mask feature is removed. In some instances, the method may further include after the epitaxially depositing of the second semiconductor layer, epitaxially depositing a third semiconductor layer over the second semiconductor layer, and epitaxially depositing a fourth semiconductor layer over the third semiconductor layer. The first semiconductor layer and the third semiconductor layer include silicon (Si) and the second semiconductor layer and the fourth semiconductor layer include silicon germanium (SiGe).

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first isolation feature and a second isolation feature;
a fin structure extending lengthwise along a first direction and sandwiched between the first isolation feature and the second isolation feature along a second direction perpendicular to the first direction;
a first channel member disposed over the first isolation feature;
a second channel member disposed over the second isolation feature; and
a gate structure disposed over and wrapping around the first channel member and the second channel member.

2. The semiconductor device of claim 1, wherein a portion of the gate structure is disposed between the first isolation feature and the second isolation feature.

3. The semiconductor device of claim 1, further comprising:
a first source/drain feature and a second source/drain feature, wherein the first channel member and the second channel member extend between the first source/drain feature and the second source/drain feature long the first direction.

4. The semiconductor device of claim 3, further comprising:
a dielectric feature disposed over the fin structure, wherein each of the first source/drain feature and the second source/drain feature is spaced apart from the fin structure by the dielectric feature.

5. The semiconductor device of claim 3, further comprising:
a first hybrid fin and a second hybrid fin, wherein the first source/drain feature and the second source/drain feature are disposed between the first hybrid fin and a second hybrid fin along the second direction.

6. The semiconductor device of claim 5, wherein each of the first hybrid fin and the second hybrid fin comprises:
an inner dielectric fin structure comprising a low-k dielectric feature and a high-k dielectric feature directly on the low-k dielectric feature; and
a liner disposed on sidewalls and a bottom surface of the inner dielectric fin structure.

7. The semiconductor device of claim 1,
wherein the first channel member comprises silicon,
wherein the first channel member comprises a sidewall,
wherein the sidewall comprises (110) crystal surface of silicon.

8. The semiconductor device of claim 1, wherein the first channel member and the second channel member bend toward each other as the first channel member and the second channel member extend away from the first isolation feature and the second isolation feature, respectively.

9. A semiconductor device, comprising:
a first source/drain feature and a second source/drain feature;
a plurality of channel members extending between the first source/drain feature and the second source/drain feature along a first direction;
a gate structure disposed over and wrapping around the plurality of channel members; and
a first isolation feature and a second isolation feature directly below the plurality of channel members,
wherein a portion of the gate structure is disposed between the first isolation feature and the second isolation feature.

10. The semiconductor device of claim 9, wherein the plurality of channel members comprises an even number of channel members.

11. The semiconductor device of claim 9, further comprising:
a fin structure arising from a substrate and disposed between the first isolation feature and the second isolation feature along a second direction perpendicular to the first direction,
wherein top surfaces of the first isolation feature and the second isolation feature are further away from the substrate than a top surface of the fin structure.

12. The semiconductor device of claim 11, further comprising:
a dielectric feature disposed over the fin structure, wherein each of the first source/drain feature and the second source/drain feature is spaced apart from the fin structure by the dielectric feature.

13. The semiconductor device of claim 12, further comprising an air gap between the dielectric feature and the first source/drain feature.

14. The semiconductor device of claim 9,
wherein the plurality of channel members comprise silicon,
wherein each of the plurality of channel members comprises a sidewall,
wherein the sidewall comprises (110) crystal surface of silicon.

15. The semiconductor device of claim 9, wherein the plurality of channel members comprise two outermost channel members that bend toward each other as the two outermost channel members extend away from the first isolation feature and the second isolation feature, respectively.

16. A method, comprising:
depositing a mandrel layer over a substrate;
forming a fin structure that includes a top portion formed from the mandrel layer, a bottom portion formed from the substrate, and a hard mask feature over the top portion;
conformally depositing an isolation layer over the fin structure;
recessing the isolation layer to expose sidewalls of the top portion of the fin structure;
epitaxially depositing a first semiconductor layer over the exposed sidewalls of the top portion;
epitaxially depositing a second semiconductor layer over the first semiconductor layer;
forming a dummy gate stack over a channel region of the fin structure;
recessing a source/drain region of the fin structure to form a source/drain recess;
forming a source/drain feature in the source/drain recess;

depositing a dielectric layer over the source/drain feature;

planarizing the dielectric layer to expose the dummy gate stack;

selectively removing the dummy gate stack;

selectively removing the second semiconductor layer and the top portion of the fin structure; and depositing a gate structure over the first semiconductor layer.

17. The method of claim 16, wherein the selectively removing of the dummy gate stack exposes the hard mask feature.

18. The method of claim 17, further comprising:

prior to the selectively removing of the second semiconductor layer and the top portion of the fin structure, selectively removing the hard mask feature to expose the top portion of the fin structure.

19. The method of claim 16, further comprising:

depositing a material layer over the second semiconductor layer; and planarizing the first semiconductor layer, the second semiconductor layer, and the hard mask feature until the hard mask feature is removed.

20. The method of claim 16, further comprising:

after the epitaxially depositing of the second semiconductor layer, epitaxially depositing a third semiconductor layer over the second semiconductor layer; and epitaxially depositing a fourth semiconductor layer over the third semiconductor layer, wherein the first semiconductor layer and the third semiconductor layer comprise silicon (Si), wherein the second semiconductor layer and the fourth semiconductor layer comprise silicon germanium (SiGe).

* * * * *